(12) United States Patent
Miyoshi

(10) Patent No.: US 10,512,192 B2
(45) Date of Patent: Dec. 17, 2019

(54) IMMERSION COOLING SYSTEM WITH LOW FLUID LOSS

(71) Applicant: Mark Miyoshi, Palos Verdes Estates, CA (US)

(72) Inventor: Mark Miyoshi, Palos Verdes Estates, CA (US)

( * ) Notice: Subject to any disclaimer, the term of this patent is extended or adjusted under 35 U.S.C. 154(b) by 344 days.

(21) Appl. No.: 15/247,766

(22) Filed: Aug. 25, 2016

(65) Prior Publication Data

US 2017/0064862 A1    Mar. 2, 2017

Related U.S. Application Data

(60) Provisional application No. 62/211,415, filed on Aug. 28, 2015.

(51) Int. Cl.
| | |
|---|---|
| *H05K 7/20* | (2006.01) |
| *H01L 23/427* | (2006.01) |
| *H01L 21/67* | (2006.01) |
| *H01L 23/32* | (2006.01) |
| *H01L 23/46* | (2006.01) |

(Continued)

(52) U.S. Cl.
CPC ............. *H05K 7/203* (2013.01); *F28F 9/007* (2013.01); *H01L 21/67109* (2013.01); *H01L 21/67184* (2013.01); *H01L 23/32* (2013.01); *H01L 23/34* (2013.01); *H01L 23/40* (2013.01); *H01L 23/4006* (2013.01); *H01L 23/42* (2013.01); *H01L 23/427* (2013.01); *H01L 23/44* (2013.01); *H01L 23/46* (2013.01); *H01L 23/473* (2013.01); *H05K 7/2049* (2013.01); *H05K 7/20318* (2013.01); *H05K 7/20381* (2013.01);

(Continued)

(58) Field of Classification Search
CPC .............. H05K 7/203; H05K 7/20318; H05K 7/20381; H05K 7/20809; H05K 7/2049; H05K 7/2026; H05K 7/20236; H05K 7/20327; F28F 9/007; H01L 23/44; H01L 23/427; H01L 21/67109; H01L 23/32; H01L 23/34; H01L 23/40; H01L 23/4006; H01L 23/42; H01L 23/46; H01L 23/473; H01L 21/67184; H01L 21/67057; G06F 2200/201; F28D 15/0266
USPC ........................ 165/80.3, 80.4; 361/699, 700
See application file for complete search history.

(56) References Cited

U.S. PATENT DOCUMENTS

| | | | |
|---|---|---|---|
| 4,619,316 A  * | 10/1986 | Nakayama | ............ F28F 13/187 |
| | | | 165/104.33 |
| 4,694,378 A  * | 9/1987 | Nakayama | ............ H01L 23/427 |
| | | | 165/80.4 |

(Continued)

FOREIGN PATENT DOCUMENTS

| | | | |
|---|---|---|---|
| CN | 106445037 A  * | 2/2017 | |
| DE | 2552590 A1 * | 6/1977 | ........... F04D 29/586 |

(Continued)

*Primary Examiner* — Cassey D Bauer
*Assistant Examiner* — Jenna M Hopkins
(74) *Attorney, Agent, or Firm* — Knobbe, Martens, Olson & Bear, LLP

(57) ABSTRACT

Two-phase immersion cooling systems can be used to cool electronic components submerged within a dielectric working fluid, but are susceptible to costly losses of working fluid when the cooling systems are opened to allow access to the electronic components for service or replacement. By selectively sealing certain portions of the cooling systems, loss of vaporized working fluid can be reduced.

23 Claims, 50 Drawing Sheets

(51) Int. Cl.
*H01L 23/40* (2006.01)
*H01L 23/42* (2006.01)
*H01L 23/34* (2006.01)
*H01L 23/473* (2006.01)
*H01L 23/44* (2006.01)
*F28F 9/007* (2006.01)
*F28D 15/02* (2006.01)

(52) U.S. Cl.
CPC ..... *H05K 7/20809* (2013.01); *F28D 15/0266* (2013.01); *G06F 2200/201* (2013.01)

(56) References Cited

U.S. PATENT DOCUMENTS

| | | | | | |
|---|---|---|---|---|---|
| 4,704,658 | A | * | 11/1987 | Yokouchi | H05K 7/203 165/104.33 |
| 4,765,397 | A | * | 8/1988 | Chrysler | H01L 23/473 165/104.33 |
| 6,073,683 | A | * | 6/2000 | Osakabe | F28D 15/0266 165/104.21 |
| 7,885,070 | B2 | * | 2/2011 | Campbell | H05K 7/203 361/699 |
| 7,944,694 | B2 | * | 5/2011 | Campbell | H05K 7/20809 165/104.33 |
| 7,983,040 | B2 | * | 7/2011 | Campbell | H05K 7/20772 165/104.33 |
| 9,872,415 | B2 | * | 1/2018 | Moss | H05K 7/20818 |
| 2007/0227708 | A1 | * | 10/2007 | Hom | G06F 1/20 165/121 |
| 2010/0103614 | A1 | * | 4/2010 | Campbell | H05K 7/203 361/689 |
| 2011/0317367 | A1 | * | 12/2011 | Campbell | H05K 7/203 361/700 |
| 2012/0153455 | A1 | * | 6/2012 | Mizuno | H01L 23/473 257/712 |
| 2014/0216711 | A1 | * | 8/2014 | Shelnutt | F28D 15/0266 165/301 |
| 2014/0218858 | A1 | * | 8/2014 | Shelnutt | G06F 1/206 361/679.31 |
| 2014/0342201 | A1 | * | 11/2014 | Andres | H01M 10/6567 429/62 |
| 2014/0347818 | A1 | * | 11/2014 | Uhlemann | H01L 23/473 361/699 |
| 2015/0037483 | A1 | * | 2/2015 | Giger | F28B 9/02 426/524 |
| 2015/0060009 | A1 | * | 3/2015 | Shelnutt | F28F 27/02 165/11.1 |
| 2015/0062806 | A1 | * | 3/2015 | Shelnutt | H05K 7/203 361/679.53 |
| 2015/0070846 | A1 | * | 3/2015 | Shelnutt | H05K 7/203 361/700 |
| 2016/0044833 | A1 | * | 2/2016 | Krishnan | H05K 7/20818 361/679.53 |
| 2016/0330873 | A1 | * | 11/2016 | Farshchian | G06F 1/20 |
| 2017/0010049 | A1 | * | 1/2017 | Agostini | F28D 7/0075 |
| 2017/0112017 | A1 | * | 4/2017 | Wang | F28D 15/02 |
| 2017/0295676 | A1 | * | 10/2017 | Conn | G06F 1/181 |
| 2017/0303443 | A1 | * | 10/2017 | Inano | H05K 7/2079 |
| 2017/0354061 | A1 | * | 12/2017 | Saito | F25D 9/00 |
| 2018/0020571 | A1 | * | 1/2018 | Saito | G06F 1/20 |

FOREIGN PATENT DOCUMENTS

| | | | | |
|---|---|---|---|---|
| JP | 5956098 | B1 * | 7/2016 | G06F 1/20 |
| WO | WO 2016036316 | A1 * | 3/2016 | G06F 1/20 |
| WO | WO-2016157397 | A1 * | 10/2016 | G06F 1/20 |

* cited by examiner

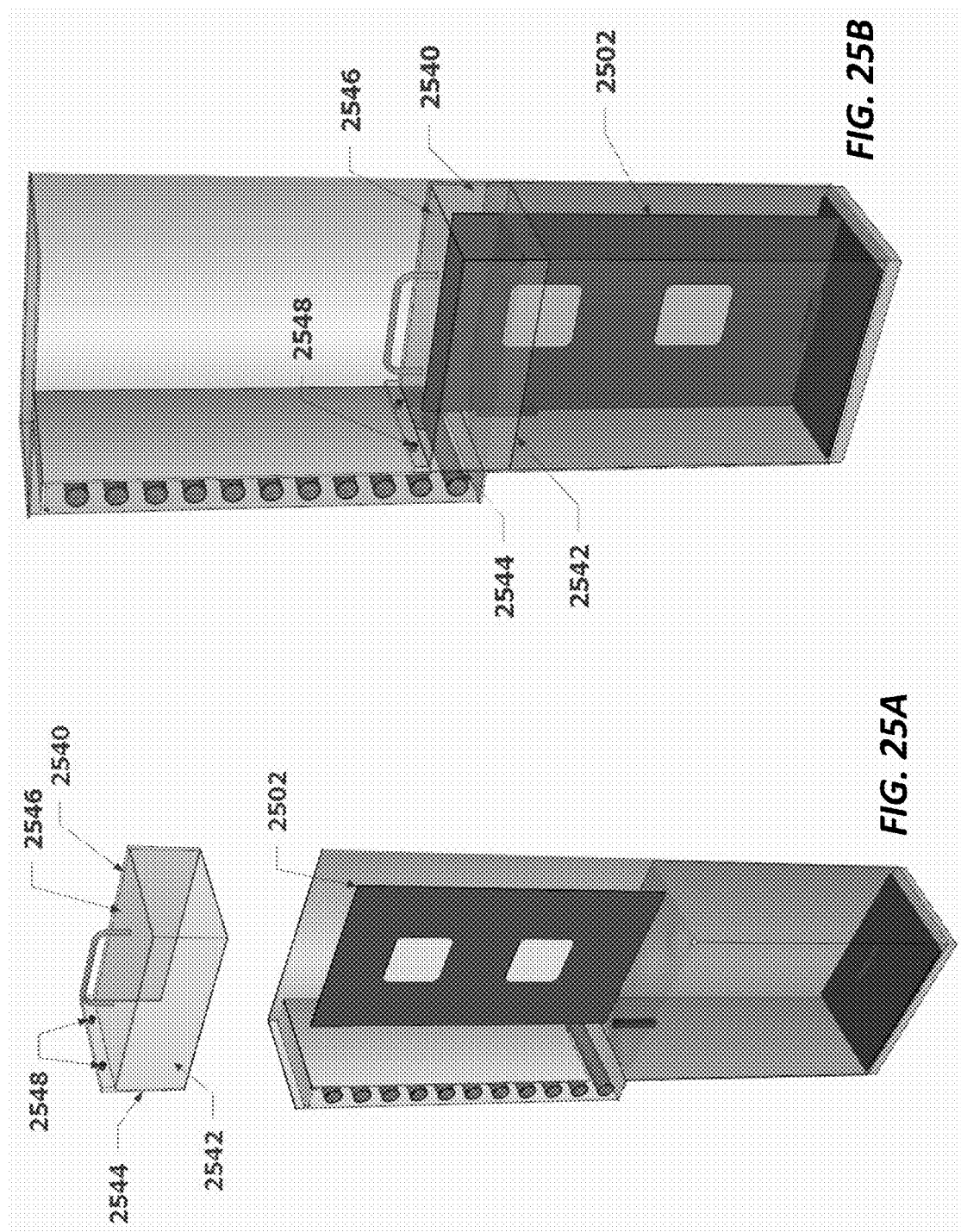

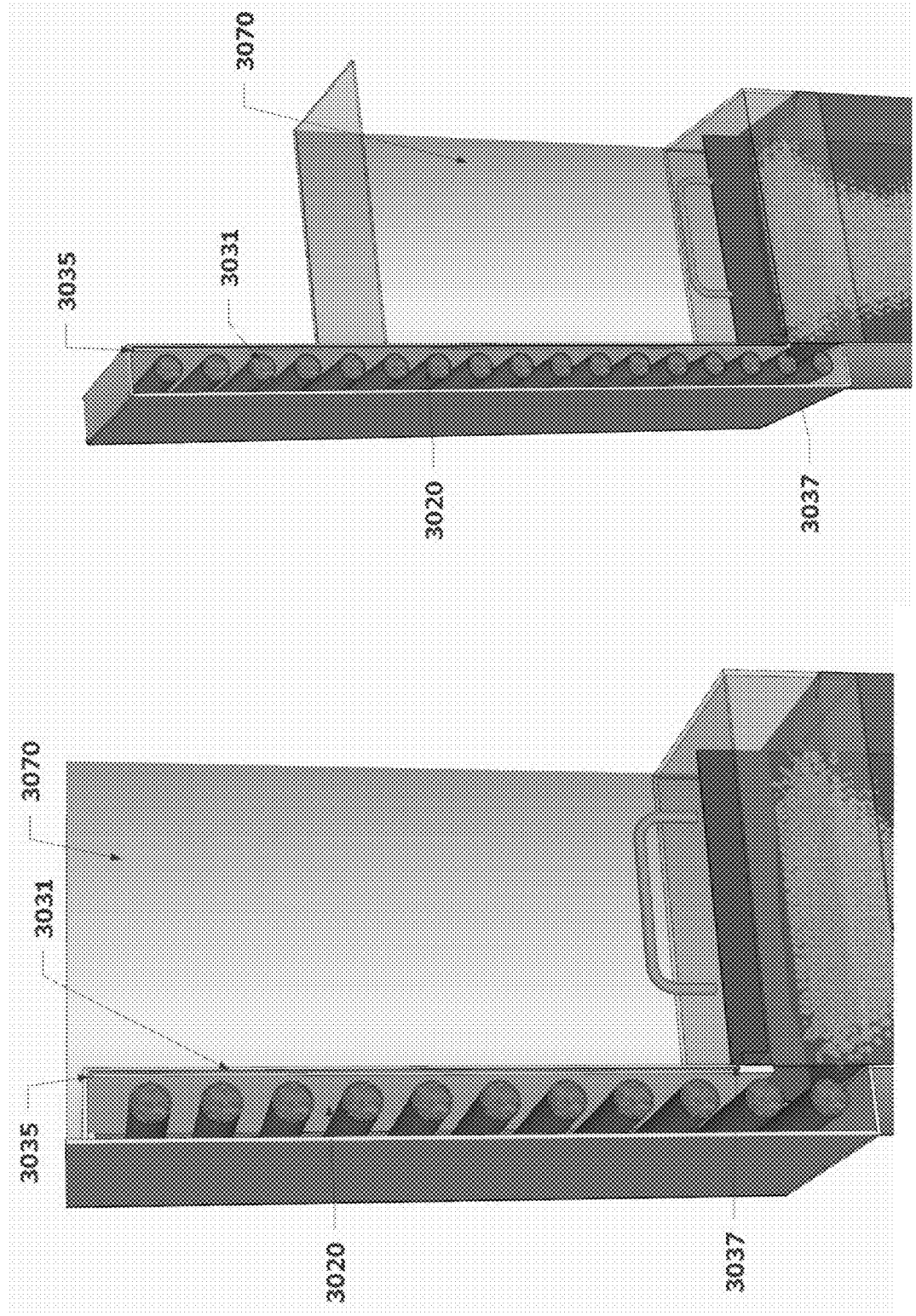

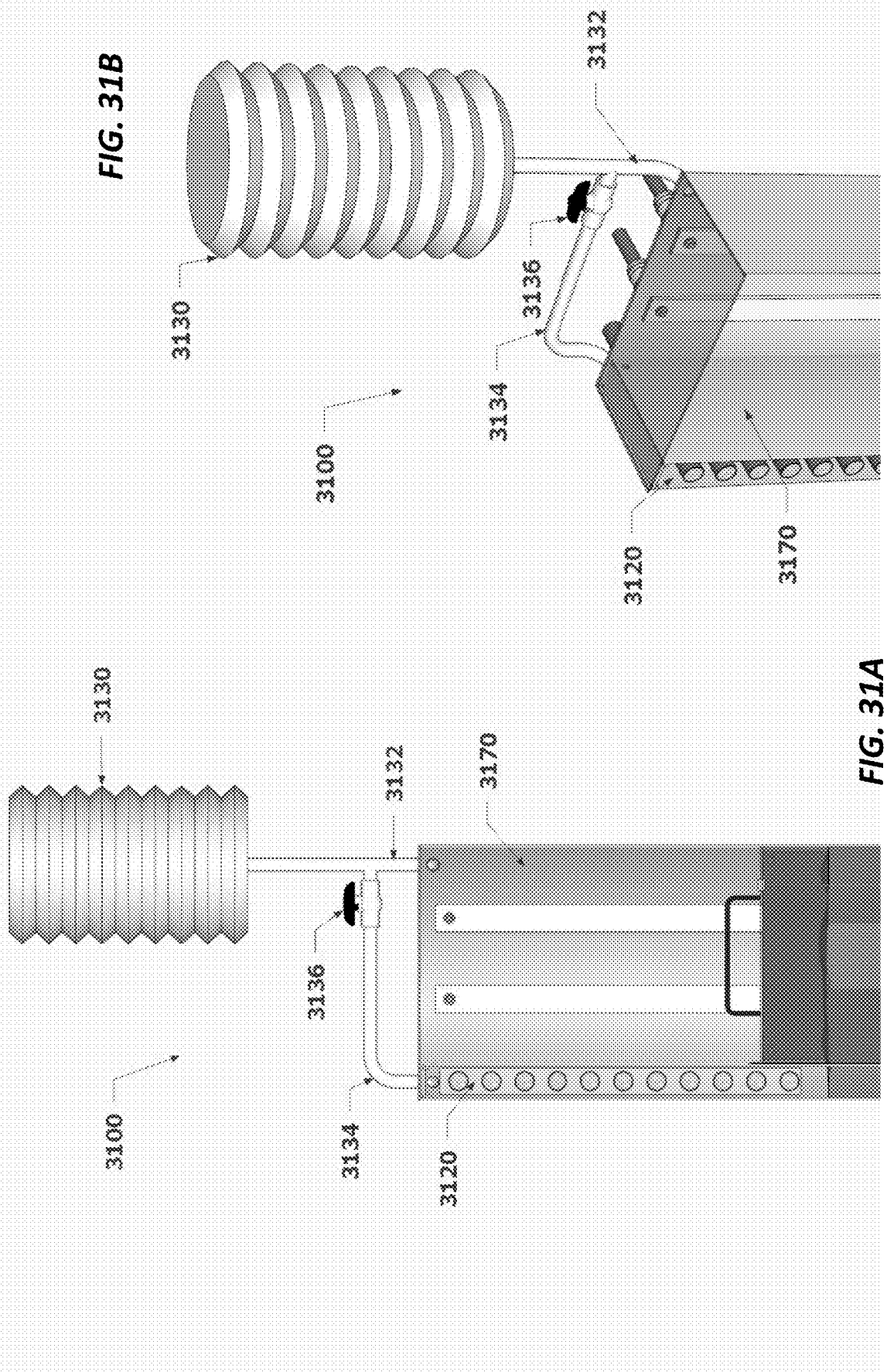

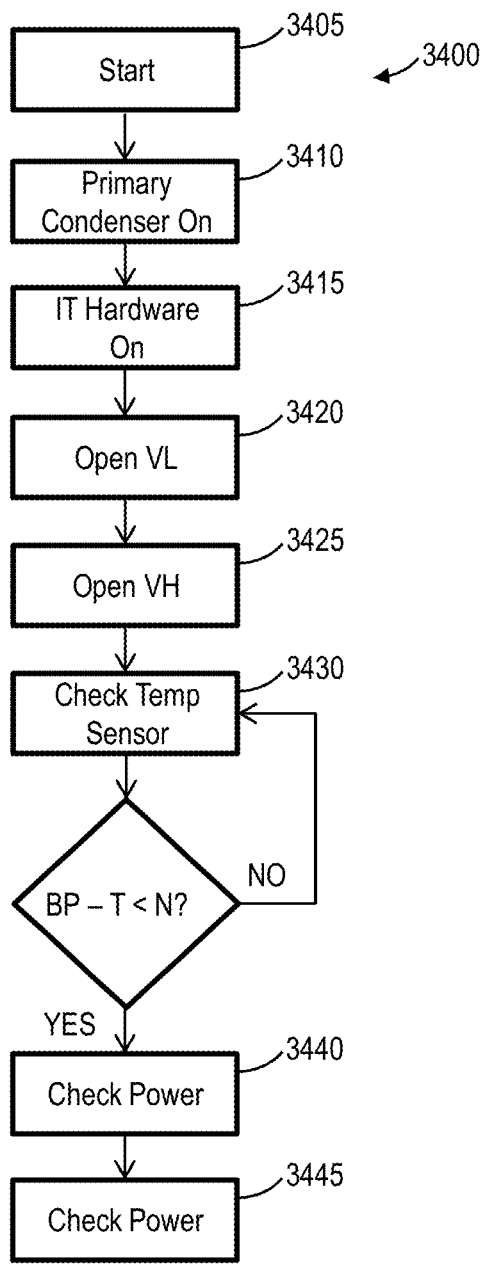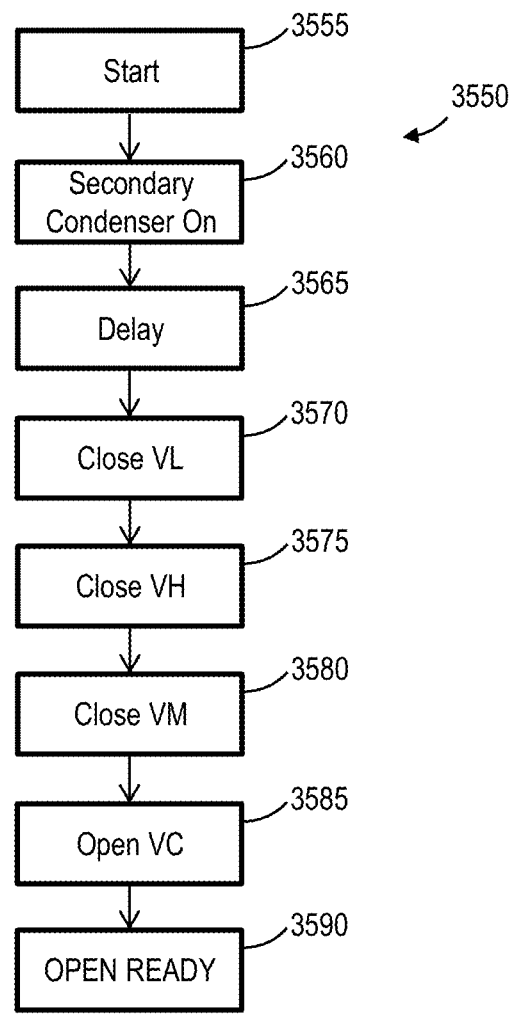
*FIG. 34*         *FIG. 35B*

IMMERSION COOLING SYSTEM WITH LOW FLUID LOSS

CROSS-REFERENCE TO RELATED APPLICATIONS

This application claims priority to U.S. Provisional Application No. 62/211,415, filed Aug. 28, 2015, entitled IMMERSION COOLING SYSTEM WITH LOW FLUID LOSS, the disclosure of which is hereby incorporated by reference in its entirety.

BACKGROUND

Technical Field

This disclosure relates to two-phase immersion cooling systems.

Description of the Related Art

Two-phase immersion cooling systems can be used to cool electronics that generate enough heat to require an active cooling solution. When submerged in a working fluid, which can have a relatively low boiling point, heat absorbed by the fluid surrounding the electronic component can vaporize the fluid, carrying heat away from the electronic component. A condenser coil or similar structure overlying the tank can cause condensation of the vaporized working fluid, which can then be returned to the reservoir of working fluid surrounding the electronic component.

However, when the cooling system is opened to allow access to the electronic components within or for other system maintenance, some loss of working fluid will occur. Because the working fluid can be expensive, a reduction in the amount of lost working fluid can provide significant cost savings in the operation of a two-phase immersion cooling system.

SUMMARY

A two-phase immersion cooling system can include a cooling basin configured to retain working fluid therein; a condensing chamber in fluid communication with the cooling basin; a primary condenser in thermal communication with the condensing chamber; a secondary chamber separated from the condensing chamber via at least one condenser divider; and a vapor redirection structure configured to overlie at least one heat-generating component located within the cooling fluid and direct vaporized cooling fluid generated adjacent the at least one heat-generating component into the condensing chamber while substantially inhibiting vaporized cooling fluid from flowing directly into the secondary chamber.

The system may also include a secondary condenser in thermal communication with the secondary chamber. The secondary condenser can be located at a height at or below the height of the primary condenser.

The system may also include at least one fluid path extending through the condenser divider at a height higher than the intended height of the working fluid. The at least one fluid path can include a one-way valve allowing gas to flow from the condensing chamber to the secondary chamber. The system can additionally include a second fluid path extending through the condenser divider, the second fluid path including a one-way valve allowing gas to flow from the second chamber to the first chamber. The at least one fluid path can have an inlet on the condensing chamber side of the condenser divider and an outlet on the secondary chamber side of the condenser divider, the inlet located a greater distance from the intended height of the working fluid than the outlet.

The system can additionally include a volume compensation structure in fluid communication with at least the secondary chamber, the volume compensation device configured to increase in volume in response to the generation of vaporized working fluid during operation of the system. The volume compensation device can include a set of bellows or a flexible bladder.

The vapor redirection structure can be configured to form a fluid seal with the working fluid at locations in which the working fluid contacts the vapor redirection structure. The vapor redirection structure can include a hinged or flexible component which is configured to move away from the heat-generating component in response to generation of vaporized working fluid underneath the vapor redirection structure. The hinged or flexible component can be configured to provide or enhance a seal between the vapor redirection structure and the condenser divider in the presence of vaporized working fluid flowing into the condensing chamber.

The vapor redirection structure can include a layer of flexible material folded over the heat-generating component and secured to the heat generating component or a structure supporting the heat-generating component. The vapor redirection structure can include an immersion module configured support the underlying heat-generating component within the working fluid in the working fluid.

The vapor redirection structure can be configured to be at least partially submerged within the working fluid. The system can additionally include a float configured to overlie portions of the working fluid exposed to the secondary chamber to inhibit evaporation of working fluid into the secondary chamber. The primary condenser can include a filtration section near the top of the primary condenser, the filtration section comprising condenser components having narrower gas paths passing between them than the gas paths extending adjacent lower sections of the primary condenser.

A vapor retention structure can be used with a two-phase immersion cooling system including a tank configured to be partially filled with a cooling fluid and at least one condenser tube extending into the tank, the vapor retention structure including a condenser divider configured to separate the tank into a first chamber section and a second chamber section, the first section including the at least one condenser tube; and a vapor redirection structure configured to overlie a heat-generating component disposed within a volume of cooling fluid, the vapor redirection structure configured to direct vaporized cooling fluid into the first chamber section while substantially inhibiting vaporized cooling fluid from directly entering the second chamber section.

The vapor redirection structure can include an immersion module configured to partially enclose a volume of cooling fluid and support the heat-generating component within the volume of cooling fluid. The condenser divider can include at least one wall configured to be secured to the interior of a two-phase immersion cooling system to form a condensing chamber substantially surrounding the at least one cooling tube in the area above the intended fluid level of the immersion cooling system. The condenser divider can include a vapor inlet defined by or extending through the at least one wall of the condenser divider at a level above the intended fluid level of the immersion cooling system. The condenser divider can include a fluid outlet defined by or extending through the at least one wall of the condenser divider at a level below the intended fluid level of the immersion cooling system.

A two-phase immersion cooling system can include a tank configured to hold a volume of dielectric cooling fluid; a condensing chamber including at least one condenser component; and a plurality of immersion modules configured to be placed in fluid communication with the condensing chamber, each immersion module configured to support at least one heat-generating component submerged in the dielectric cooling fluid and configured to direct vaporized dielectric cooling fluid into the condensing chamber.

Each of plurality of the immersion modules can include an immersion module shell, the shell forming a vapor capture region configured to overlie a volume of the dielectric cooling fluid; a vapor outlet in fluid communication with the vapor capture region; and a fluid inlet configured to allow dielectric cooling fluid to enter the immersion module.

The vapor outlet can be separate from the fluid inlet. A single aperture in the shell can be configured to serve as both a vapor outlet and a fluid inlet, the portion of the aperture located above a surface of the dielectric cooling fluid serving as a vapor outlet, and the portion of the aperture located below the surface of the dielectric cooling fluid serving as a fluid inlet. An open base of the immersion module shell can serve as the fluid inlet. The immersion module shell can be a contiguous structure having the vapor outlet and fluid inlet extending therethrough.

The immersion module shell can include a first section fixedly secured relative to the condensing chamber; and a second section movable with respect to the first section and configured to cooperate with the first section to provide the vapor capture region, wherein the second section is configured to support the at least one heat-generating component. At least one of the first or second sections can additionally include a sealing structure configured to form a substantially vapor-impermeable seal between the first and second sections. The sealing structure can include one of a gasket or an o-ring. The second section can be configured to form at least part of the upper surface of the vapor capture region.

The condensing chamber can include a plurality of vapor inlets, each vapor inlet in fluid communication with one of the plurality of immersion modules. The system can further include at least one blocking mechanism configured to selectively occlude one of the plurality of vapor inlets. The system can further include at least one inundation roof overlying at least a portion of the at least one condenser component. The system can further include a subcooling heat exchanger disposed within the tank at a level below an intended fluid level of the dielectric cooling fluid. The subcooling heat exchanger can be positioned generally below the at least one condenser component in the condensing chamber.

A two-phase immersion cooling system can include a cooling basin configured to retain working fluid therein; a condenser chamber in fluid communication with the cooling basin; and an immersion module configured to provide a vapor redirection chamber overlying a volume of the working fluid and configured to suspend a heat-generating component within said volume of working fluid, the immersion module configured to be selectively placed in fluid communication with the condenser chamber.

At least a portion of the immersion module can be movable with respect to the condenser chamber to remove the heat-generating component from the working fluid. The system can additionally include a blocking mechanism configured to occlude a vapor path between the condenser chamber and the vapor redirection chamber when said at least a portion of the immersion module is moved away from the condenser chamber.

The system can additionally include a biasing mechanism configured to translate the immersion module away from the cooling basin; and a retention mechanism configured to retain the immersion module in a lowered position. The system can additionally include at least a second immersion module, wherein each of the first and second immersion modules are configured to be selectively placed in fluid communication with the condenser chamber independent of one another. The system can additionally include at least one subcooling tube extending into the cooling basin at a level below an intended fluid level of the immersion cooling system.

BRIEF DESCRIPTION OF THE DRAWINGS

FIG. 25A is an exploded perspective view of a TPIC system which includes a vapor redirection structure which is configured to overlie a HGC without mechanically supporting the underlying HCG. FIG. 25B shows the vapor redirection structure of FIG. 25A in its operating position.

FIG. 30A is a perspective cross-sectional view of a TPIC system which includes a partially vertical fluid communication channel between the condensing chamber and the secondary chamber. FIG. 30B is a perspective cross-sectional view of a TPIC system with an extended condensing chamber.

FIG. 31A is a side cross-section of a TPIC system which includes a volume compensation device which can be placed in fluid communication with the condensing chamber and the secondary chamber. FIG. 31B is a top perspective view of the TPIC system of FIG. 31A.

FIG. 34 illustrates a control scheme which can be utilized when a closed TPIC system without a volume compensation device is powered on.

FIG. 35B is a flow diagram illustrating a control scheme which can be utilized prior to opening the system of FIG. 35A.

Like reference numbers and designations in the various drawings indicate like elements. The relative dimensions of the figures may not be drawn to scale.

DETAILED DESCRIPTION

Figure 1:
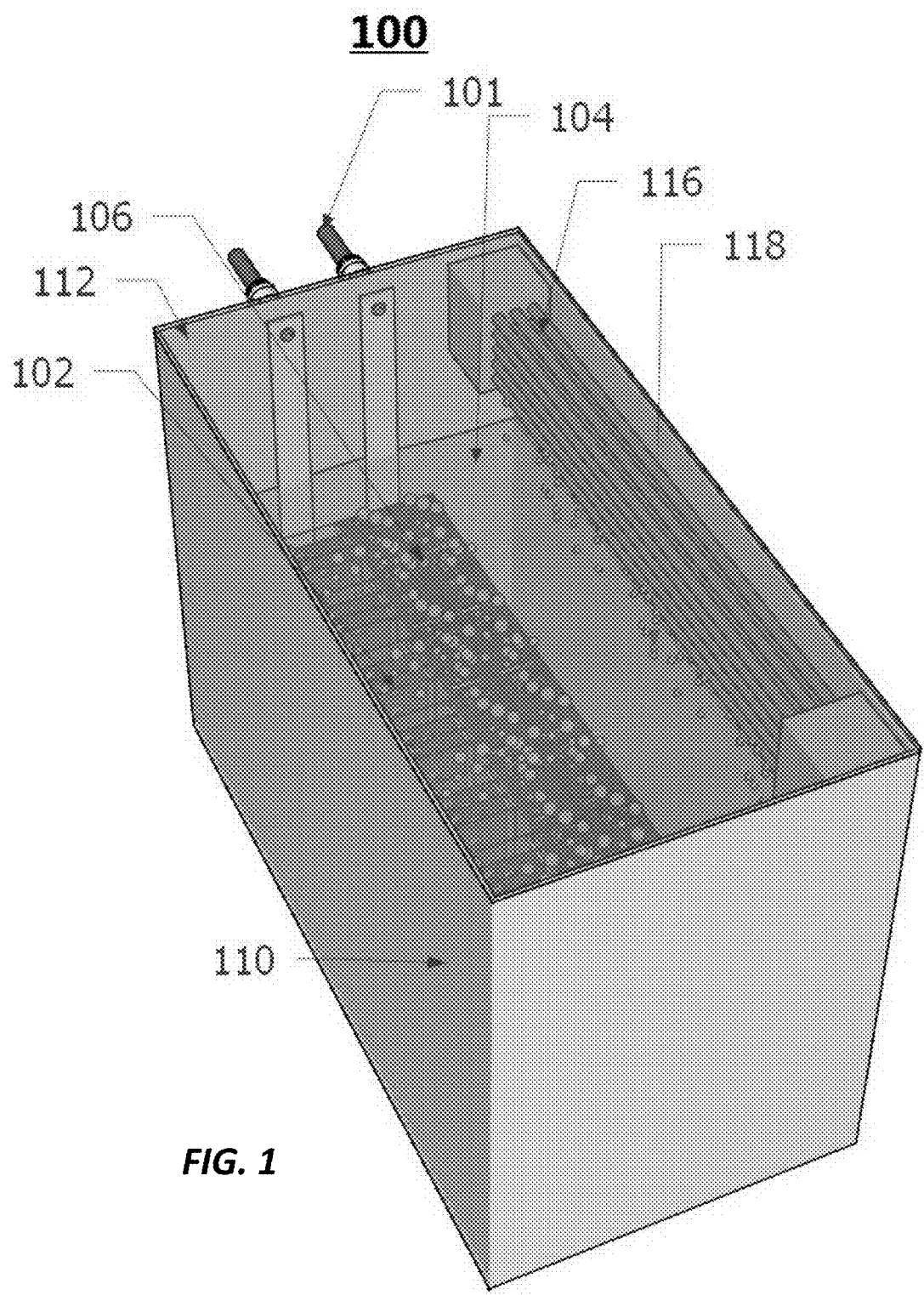
FIG. 1 is a perspective view of a two-phase immersion cooling (TPIC) system.

FIG. 1 is a perspective view of a two-phase immersion cooling (TPIC) system, also commonly referred to as a TPIC system or TPIC tank. The system 100 is configured to contain and cool heat-generating components (HGCs) 102 which are directly submerged in a dielectric working fluid (DWF) 104, contained within the basin of a container 110 having a lid 112. The HGC 102 may be any electrical components which generate a substantial amount of heat and which require or benefit from active cooling, such as computer processors, hard drives, or similar components. Power and other communication is supplied to the HGC 102 via the power 101.

The DWF 104 can be in direct or indirect contact with the HGC 102 to allow conductive heat transfer from the HGC to the DWF 104. In the case of indirect contact, a heat spreader, heatsink, porous heat transfer enhancing coating or other medium can be interposed between a portion of the HGC 102 and the DWF 104.

The DWF 104 can have a low boiling point relative to that of water, such that heat generated by the components 102 causes the DWF 104 in contact with or sufficiently close to the components 102 to boil, forming bubbles 106. For example, 3M™ Fluorinert™ Electronic Liquid FC-72, a dielectric fluid available from 3M Company, boils at 56° C. under standard atmospheric pressure.

The bubbles 106 rise to the surface of the DWF and the DWF vapor from bubbles 106 mixes with the air in the region overlying the pool of DWF 104. The vapor then condenses on condensing tubes 116, and returns to the pool of DWF 104 as drops of condensate 118. Water or another secondary working fluid such as glycol may be pumped through the condensing tubes 116 to remove the heat energy from the container 110.

Figure 2:
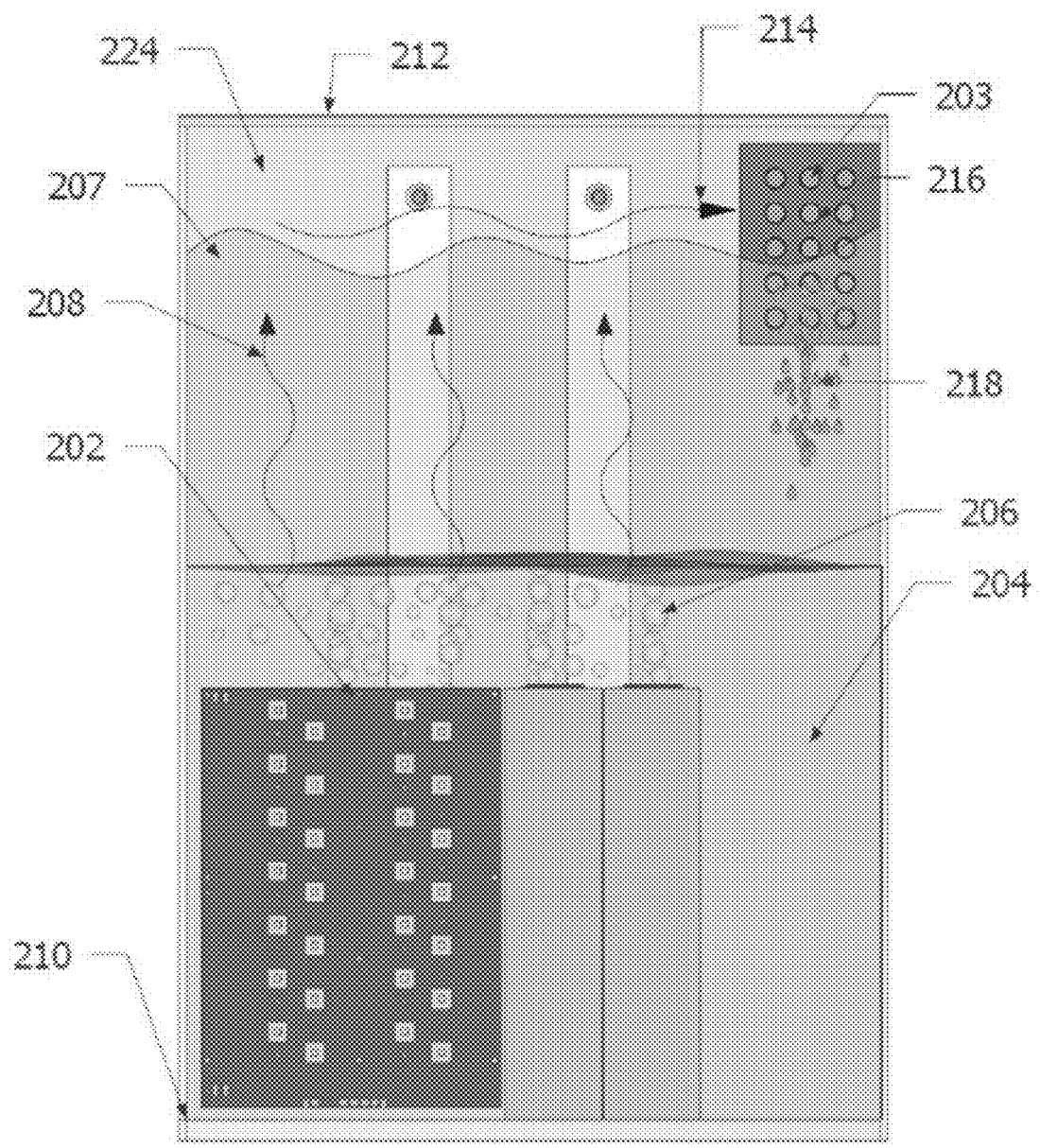
FIG. 2 is a cross-sectional view of the TPIC system of FIG. 1, illustrating the operation of the TPIC system.

FIG. 2 is a cross-sectional view of a TPIC system such as that of FIG. 1, illustrating the operation of the TPIC system. Once powered on, the HGC 202 cause the DWF 204 to boil, forming bubbles 206. The resulting vapor 208 rises within the immersion container 210. With the lid 212 closed, the rising vapor 208 is confined to the inside space of the immersion container 210, and the vapor 208 will ultimately migrate following a net path 214 towards the condenser coils 216 where it will transfer latent heat to a secondary working fluid 203, condensing into a liquid 218 in the process. Gravity pulls the liquid 218 back to the pool of DWF 204 from which it came. The equilibrium between the vapor 208 and the condensation gives definition to the vapor zone 207, a region essentially comprised of pure vapor. Above the vapor zone is a region 224 that contains a mixture of air and vapor. During sustained operation, the pool of DWF 204 will eventually warm to, or near the saturation temperature of the DWF.

Subcooling the DWF in two phase immersion systems has several well established benefits. Perhaps the most notable benefit is the significant increase in the Critical Heat Flux (CHF) of the DWF. For example, J. L. Parker of the University of New Mexico found that CHF increased linearly with increased liquid subcooling for the dielectric fluid HFE-7100 (Available from the 3M Company). He published his findings in the 2008 white paper "SUBCOOLED BOILING OF HFE-7100 DIELECTRIC LIQUID". For a flat copper surface, he was able to achieve a CHF of 39 $W/cm^2$ by subcooling the HFE-7100 by 30 K (in contrast to 23 $W/cm^2$ for saturated boiling).

Given the high power demands of today's computer processors, the limitations imposed by DWF CHF have been often cited as a drawback to TPIC technology. For example, Intel's Xeon E5-2687W v3 workstation CPU operates at heat flux of 32.5 $W/cm^2$ and therefore would not be a viable candidate for standard, saturated TPIC using HFE-7100. However, by using subcooled HFE-7100, the Intel Xeon chip could be cooled using TPIC.

Unfortunately, a typical TPIC system is not well suited for subcooling. Cooling tubes could be immersed in the pool of DWF 204, but the amount of heat transferred to them would be minimal due to the lack of active circulation in the pool of DWF 204. A pump could be used to induce circulation, but such a pump would require power and more importantly, would add a moving part and a potential point of failure to a system that otherwise does not require any moving parts for its primary heat exchange operation.

Because electronics are prone to failure in any operating environment, they will need to be removed from service periodically for repair or maintenance. For a TPIC system, this process can involve opening the system to expose the interior of the system to the external environment, such as by fully or partially removing the lid of the immersion container.

For an open TPIC system, several mechanisms can allow the DWF to leave the system: diffusion loss, displacement loss and drag-out loss.

As used herein, the term "diffusion loss" is used to describe the loss of vaporized DWF that results from the diffusion of vapor within the tank, where the vapor concentration is relatively high, to the external environment, where the vapor concentration is relatively low or nonexistent.

In addition, vaporized DWF can also be lost due to a mechanism referred to herein as "displacement loss," in which a pressure differential between the system and the ambient environment can result in expulsion of a volume of air/vapor mixture from within the tank. This displacement can occur when a tank is opened, but can also occur if the tank is vented during operation to relieve pressure built up due to the vaporization of DWF during operation.

In addition to losses of vaporized DWF, DWF in a liquid form can also be lost when components are removed from the system while wet with DWF, via a mechanism referred to herein as "drag-out loss."

Figure 3:
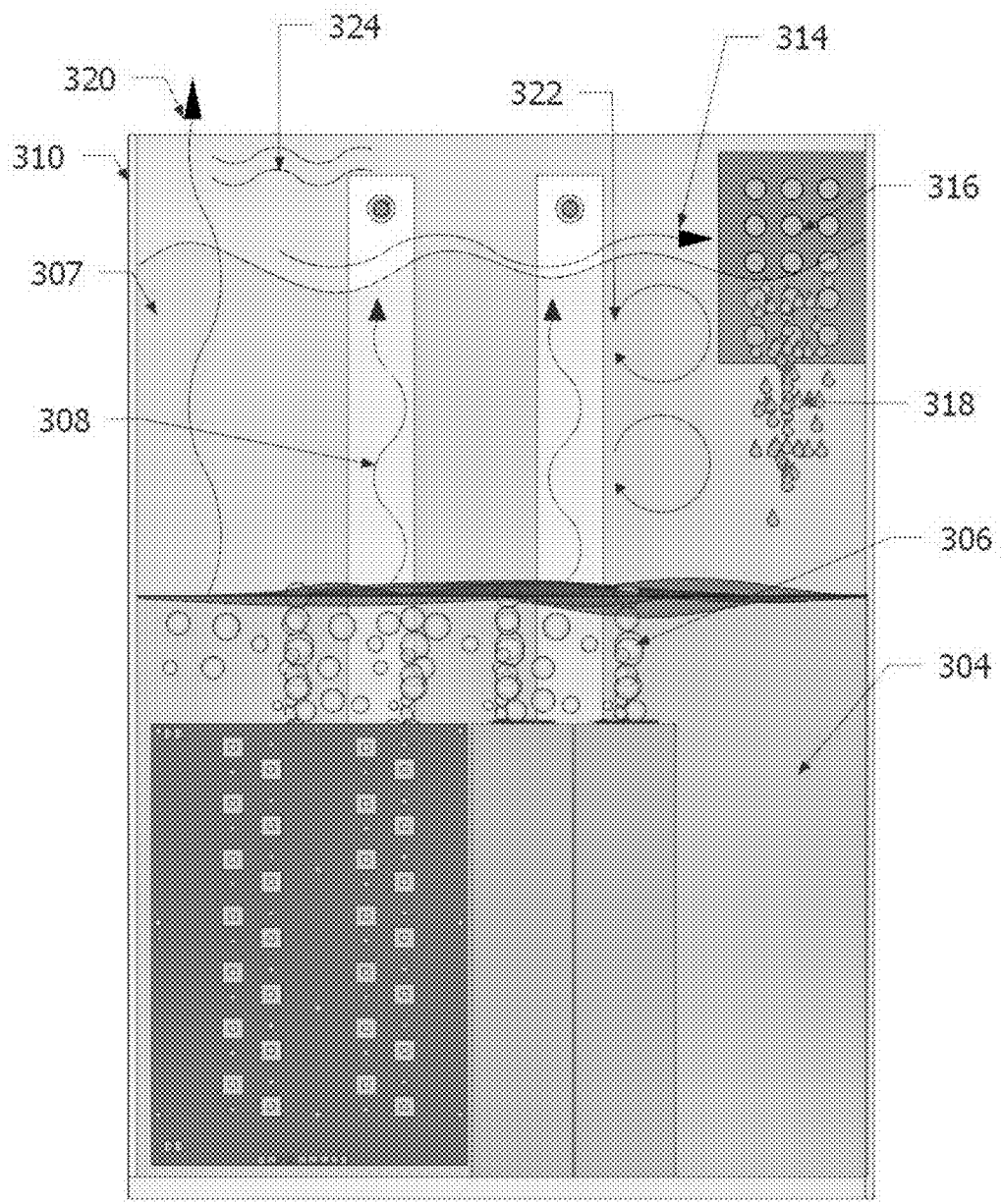
FIG. 3 is a cross-sectional view of a TPIC system such as the system of FIG. 1 for which the lid has been removed.

FIG. 3 is a cross-sectional view of a TPIC system such as the system of FIG. 1 for which the lid has been removed. The vapor now has an unobstructed path to escape from the container. While a portion of the boiled vapor 308 will still follow a net migration path 314 towards the cooler temperature of the condenser coils 316 and condense to a liquid 318, a significant amount of vapor will escape to the ambient environment as diffusion loss 320.

For immersion cooling systems, diffusion loss 320 is accelerated and magnified by the turbulence 322 of the vapor within the immersion container. Turbulence is created by the violent boiling 306 of the DWF 304 and the rapid falling of the liquid condensate 318.

Displacement Loss occurs when the power level of the electronics being cooled is increased; the volume of vapor within the immersion container 310 increases, increasing the thickness of the vapor zone 307, and causing displacement and ejection of the corresponding volume of the air/vapor mixture 324 at the top of the container. When the power level of the electronics is brought down to its original level, the volume of vapor will decrease to its original level and the corresponding void inside the container will be filled by pure air from the environment.

Displacement Loss can also occur in a vented closed system; to prevent system pressure from increasing in response to an increase in power to the HGC, an automatic or manual vent can be provided to allow air/vapor mixture to escape the system and reduce a pressure differential between the interior of the system and the external environment.

To offset or decrease the displacement loss in a closed system, a volume compensation device (VCD) may be used. FIG. 31A is a side cross-section of a TPIC system which includes a set of bellows which can be placed in fluid communication with the condensing chamber and the secondary chamber. FIG. 31B is a top perspective view of the TPIC system of FIG. 31A. It can be seen that the TPIC system 3100 includes a VCD which in the illustrated implementation includes a set of bellows 3130 in fluid communication with the secondary chamber 3170 via a first tube 3132. In addition, the bellows 3130 can be selectively placed in fluid communication with the condensing chamber 3120 via a valve 3136 disposed along a second tube 3134.

The specific connections illustrated in FIGS. 31A and 31B are one possible configuration, and other configurations and components can be used to place the VCD in communication with sections of the TPIC system in a desired manner. A set of bellows is just one example of a VCD. A flexible, bladder-like construction represents another example of a suitable VCD for the purposes discussed herein. Any device that has a variable internal volume may be used a VCD.

A VCD allows a closed system to change its internal volume in order to maintain a desired internal pressure or internal pressure range. For example, in some embodiments, a pressure relatively close to atmospheric pressure may be maintained through changes in power level and/or changes in cooling.

As power to the heat generating components inside a TPIC system is increased, the total volume of the system fluid increases due to vaporization of the working fluid. For a closed system without a pressure vent or other compensation device, internal system pressure may increase to levels which may be dangerous, or may require additional durability or tolerance in the TPIC system to allow it to operate at an elevated pressure. For a closed system with a vent, pressure can be relieved by venting gas from the system. As this gas will contain a mixture of vapor and air, the vapor component of the vented gas represents an irrecoverable loss of system fluid. Over time, this loss of fluid can become financially significant.

For a closed system with a VCD such as bellows 3130, the vapor/air mixture that would otherwise exit the system enters the VCD and expands the flexible internal volume of the VCD. As power to the heat generating components is decreased or as cooling is increased, the total volume of the system fluid decreases. To maintain an internal pressure relatively close to that of the atmosphere, the flexible internal volume of the VCD contracts, as the vapor and air mixture is pushed back into the TPIC vessel. Assuming the VCD is sized and configured to accommodate the maximum amount of air/vapor mixture displaced from the TPIC vessel during changes in power or cooling level, no loss of system fluid should occur during operation of the TPIC system.

In some embodiments, the expansion and contraction of the VCD may be driven completely by the difference in pressure between the interior of the TPIC system and the atmosphere. Alternatively, the expansion and contraction of the VCD may be powered or assisted by an external mechanism. For example, a linear actuator controlled by a PLC may assist the expansion and contraction of a set of bellows. As noted above, in some embodiments a pressure at or close to atmospheric pressure may be maintained for reasons of safety.

A VCD may be placed in close proximity to the TPIC vessel as shown in FIGS. 31A and 31B. In other embodiments, it may be directly connected to the TPIC vessel without an intervening tube such as tube 3132. In other embodiments, the VCD may be placed in a more remote location, and a longer tube 3132 or other appropriate structure may be used to maintain fluid communication with the TPIC vessel. For example, a VCD may be suspended from a ceiling or other overlying support and connected to a TPIC vessel below it by pipe. While the VCD need not be placed in an overlying position, placing the VCD at a height greater than the VCD vessel allows gravity to drain condensed fluid which may condense and collect within the VCD.

A single VCD may be connected to one or more TPIC vessels. For a plurality of TPIC vessels, the overall cost of sharing a large single VCD may be significantly less than the cost of connecting each TPIC vessel to its own VCD. Valves can be used to selectively place individual TPIC vessels in and out of fluid communication with a shared VCD, allowing opening of and access to certain TPIC vessels while other TPIC vessels are operating.

Figure 4:
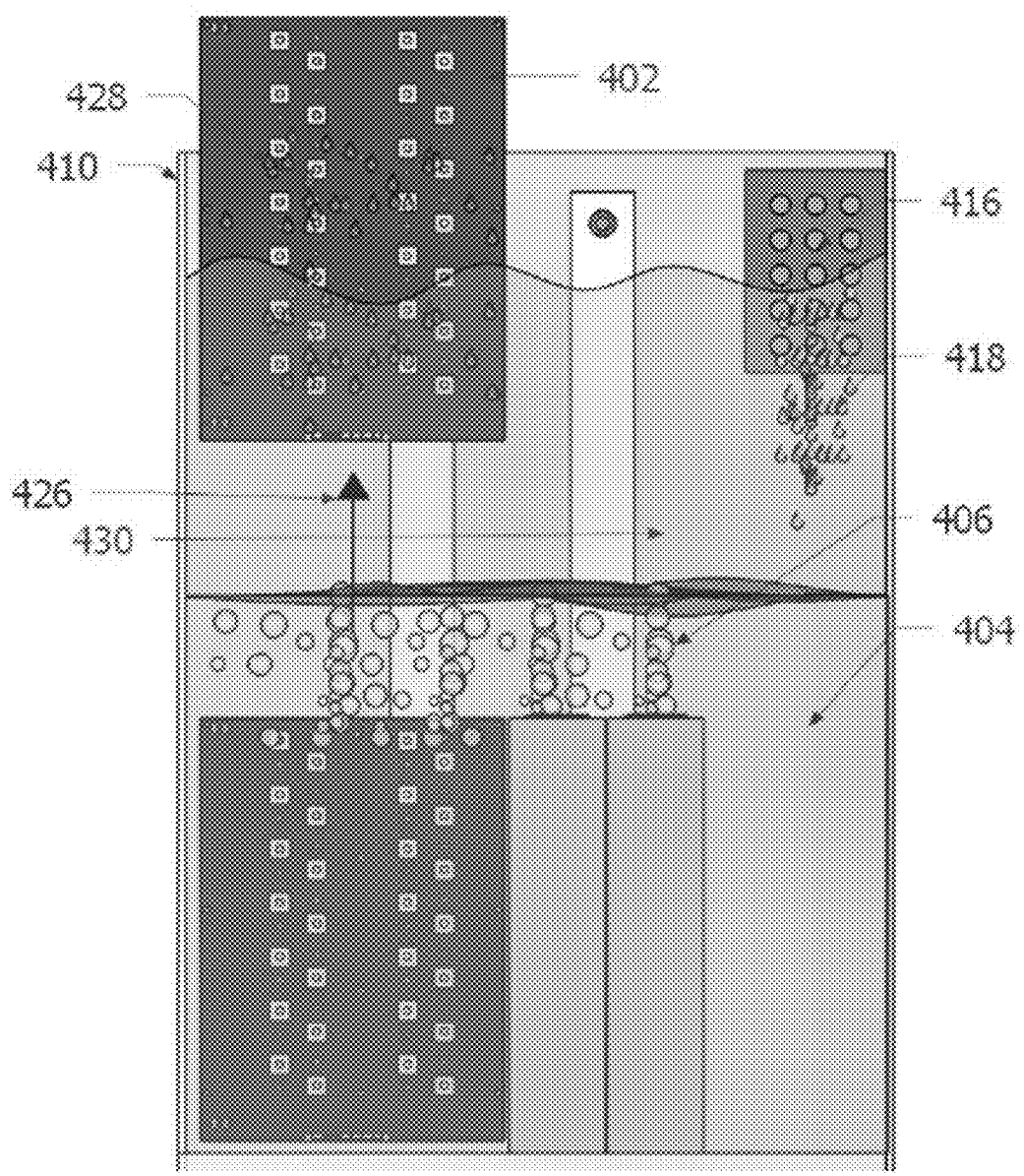
FIG. 4 is a sectional view of an open TPIC system that illustrates the drag-out loss of dielectric working fluid.

FIG. 4 is a sectional view of an open immersion system that illustrates the drag-out loss of dielectric working fluid 404, illustrating the boiling 406 and liquid condensate 418. As a heat-generating component (HGC) 402 is removed from the immersion container 410, residual DWF 428 is also removed.

Because the HGC is most easily removed following a vertical path 426, it is desirable for the space 430 directly above the heat generating electronics to be kept clear of condenser coils 416 and other system cooling components that could interfere with the removal of the heat generating components 402.

As a potential way to save horizontal space, immersion systems that feature a rotatable condenser have been proposed. The condenser, connected to a rotary fitting, could occupy the space directly above the heat generating components during normal operation and be rotated in a way to allow clearance for the removal of HGC during maintenance. Unfortunately, rotary pipe fittings are susceptible to leakage, especially at the high pressures and flow rates demanded by an immersion cooling condenser and therefore such a solution may not be practical.

Another consideration involved in the design of a closed TPIC system involves the handling of non-condensable gases (NCGs), such as ambient air. During operation of a TPIC system, air insulates the condenser from working fluid vapor. In order for the vaporized working fluid in a TPIC system to be condensed, the air surrounding the condenser at system startup must be displaced. Because the vaporized working fluid can be far denser than air, uncondensed vapor will eventually sink and spread out, displacing the air at the bottom of the TPIC system.

As discussed above, when boiling commences in response to heat generated by the HGUs, a vapor zone region of essentially pure vapor will form above the liquid working fluid. This vapor zone will increase in height, growing upwards until equilibrium between boiling and condensing is reached. The volume of the vapor zone is dependent on both the height of the vapor zone at equilibrium, and the cross-sectional size of the tank.

The volume of the vapor zone is also dependent upon the rate at which vaporized working fluid condenses on the condenser. In some embodiments, flow modulation may be used to reduce the size of the vapor zone, reducing the overall pressure swing between a powered off system and a system in which the HGCs are generating high amounts of heat and vaporizing working fluid at a high rate.

Losses such as displacement losses can also be reduced by modulating the cooling power of the system. In some TPIC systems, this can be done by modulating the liquid flow rate to the primary condenser. Raising the flow rate to the primary condenser increases the rate of condensation in a TPIC system and can be used to offset the increase in system vapor generation that may result from an increase in power to the HGC, also referred to herein as an increase in system power. Likewise, lowering the flow rate to the primary condenser decreases the rate of condensation and therefore can be used to offset a decrease in system vapor that may result from a decrease in system power.

A PLC or other suitable computer can be used to control the flow rate to the primary condenser. The computer can be configured to periodically or constantly receive input from one or more sensors and/or meters and when appropriate, send a signal to or control valves to increase or decrease water flow. The input devices may include but are not limited to temperature sensors, pressure sensors, liquid flow rate meters and power meters. The valves controlled by the controller can include, but are not limited to, one-way or two-way valves with electric, pneumatic or hydraulic actuators.

Some TPIC systems can include a sub-ambient temperature condenser placed at a higher height than the primary condenser in a TPIC vessel. Such an elevated secondary condenser can be used to prevent or minimize fluid emissions in open tank conditions, as it can be used to condense the relatively small amount of vapor that may be present in the freeboard region when the tank is open. Due to the vapor-lean nature of this region, the amount of fluid condensed by such a secondary condenser is relatively small.

Furthermore, due to the power required to bring the temperature of the fluid in the secondary condenser down to sub-ambient levels, the secondary condenser in such systems is a relatively inefficient means of condensing fluid. Therefore, an elevated sub-ambient secondary condenser in a TPIC system may be of limited use as a means to provide on-the-fly adjustments to the overall amount of vapor after a change in power level.

As an alternative, modulating the air flow to the dry cooler of the condenser will affect the rate of condensation in a TPIC system. However, changing dry cooler air flow may also be of limited use in counteracting changes in TPIC system power levels. The lag between the time a dry cooler fan speed is changed to the time the resulting cooler fluid affects the condensation in a TPIC vessel can be significant. Furthermore, in some systems a single dry cooler may supply cool fluid to more than one TPIC vessel. In such an arrangement, changing the dry cooler air flow would affect all of the TPIC vessels connected to it, and the effect on a single TPIC vessel with elevated power level would be further diluted.

A flow rate modulation system for a TPIC system can be expensive to construct and operate, however. Because of the substantial flow rate needed to provide adequate cooling power to a TPIC system, the valves and other hardware needed to construct a flow rate modulation system can in some embodiments be heavy duty rated and thus, can be expensive.

Adjusting the flow rate by opening or closing a heavy duty valve with an actuator can require a substantial amount of energy, whether the actuator is electric, pneumatic or hydraulic. Therefore, constant adjustments to flow rate may sum to a financially significant use of power.

The flow rate to a TPIC system with its own dry cooler may be controlled by using a variable speed pump or a pump with a variable frequency drive (VFD) controller. However, like the valves used in a flow rate modulation system, a variable speed pump may in some embodiments be heavy duty rated. It is not uncommon for TPIC systems to require 100 GPM of liquid flow. Therefore a variable speed pump capable of delivering such flow will be costly. Furthermore, rapidly accelerating and decelerating the pump speed requires significant power usage. In addition, a typical variable speed pump used in a hydronic system may be inefficient at lower speeds.

Figure 5A:
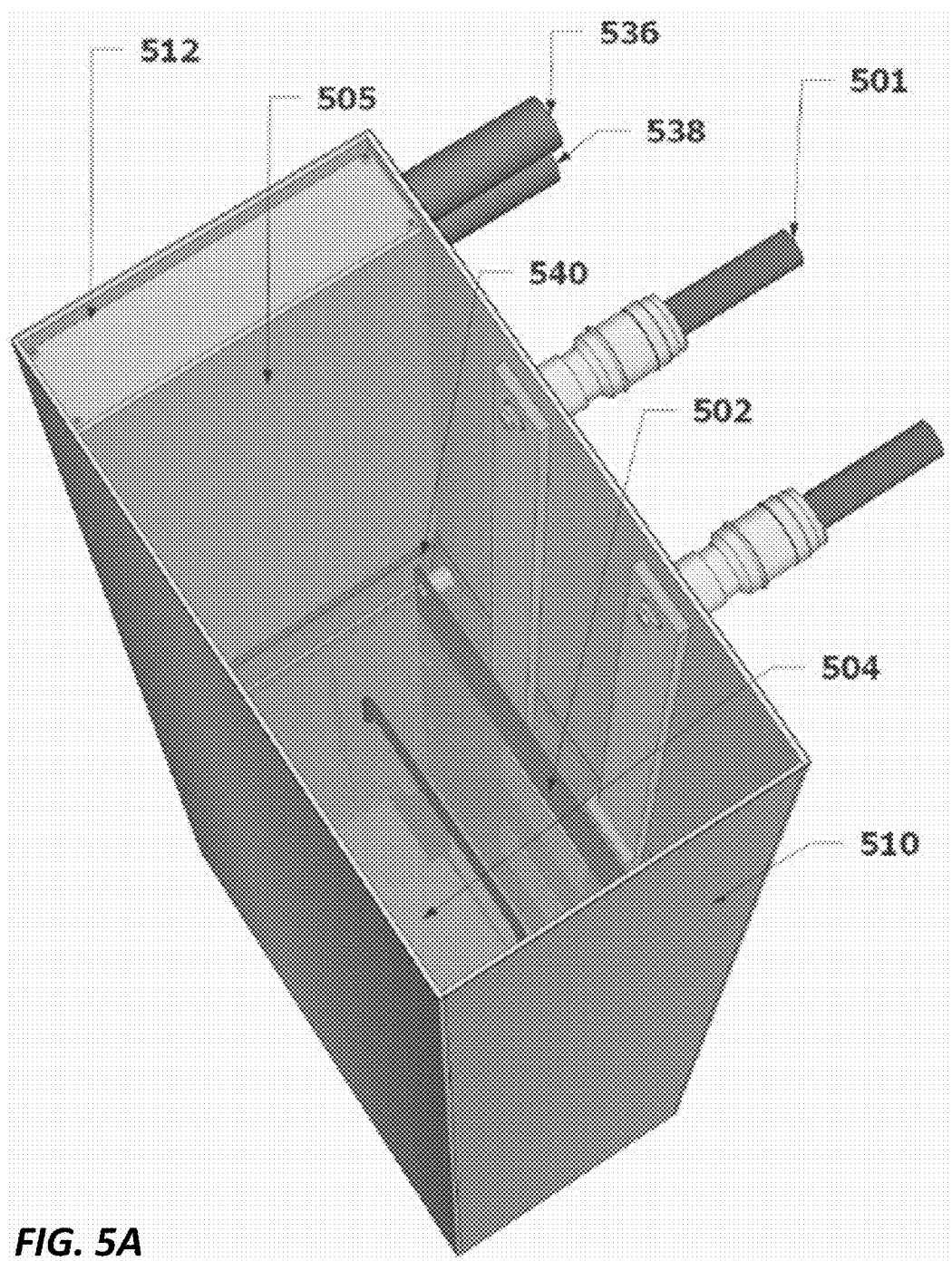
FIG. 5A is a perspective view of another embodiment of a TPIC apparatus configured to reduce fluid loss.
Figure 5B:
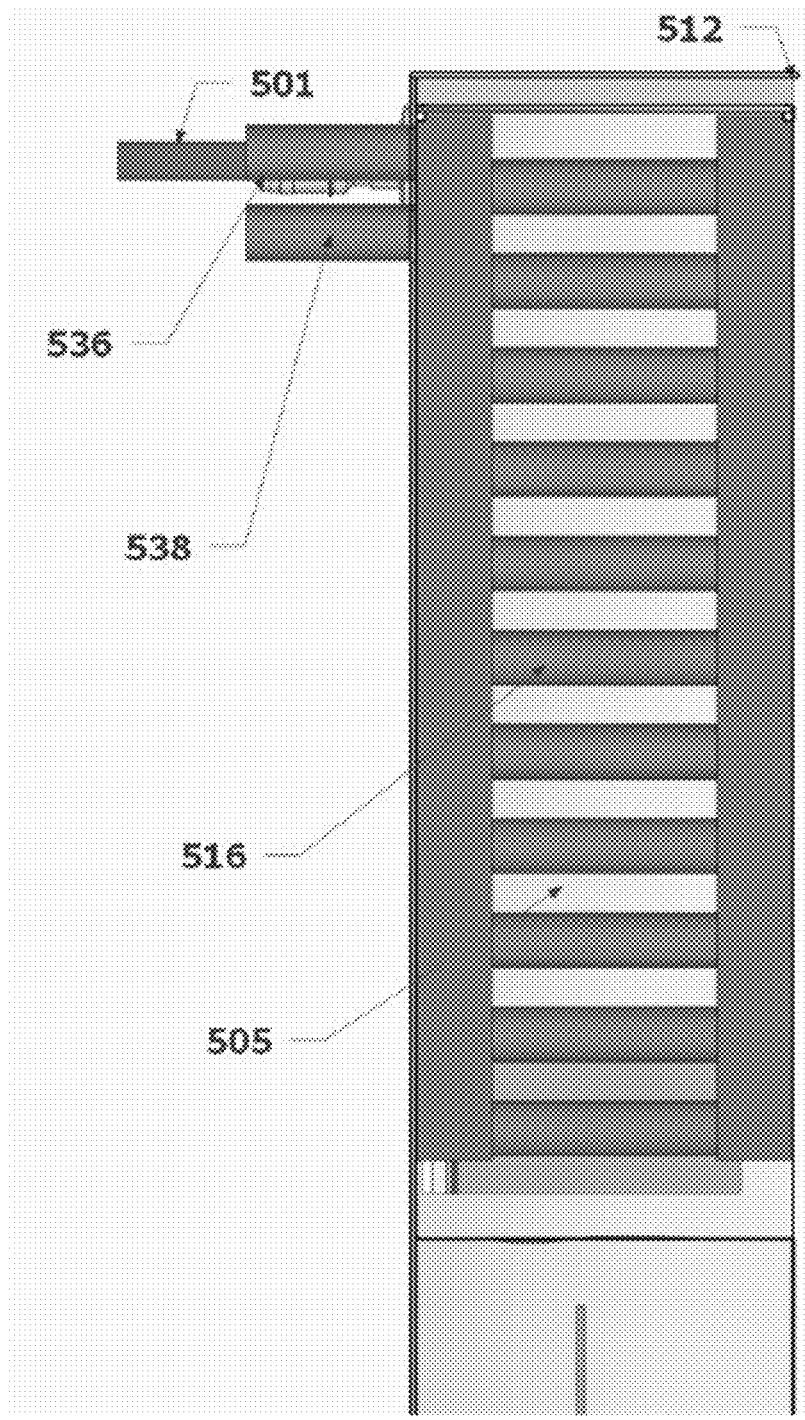
FIG. 5B is a cross-section view of one side of the TPIC apparatus of FIG. 5A.
Figure 5C:
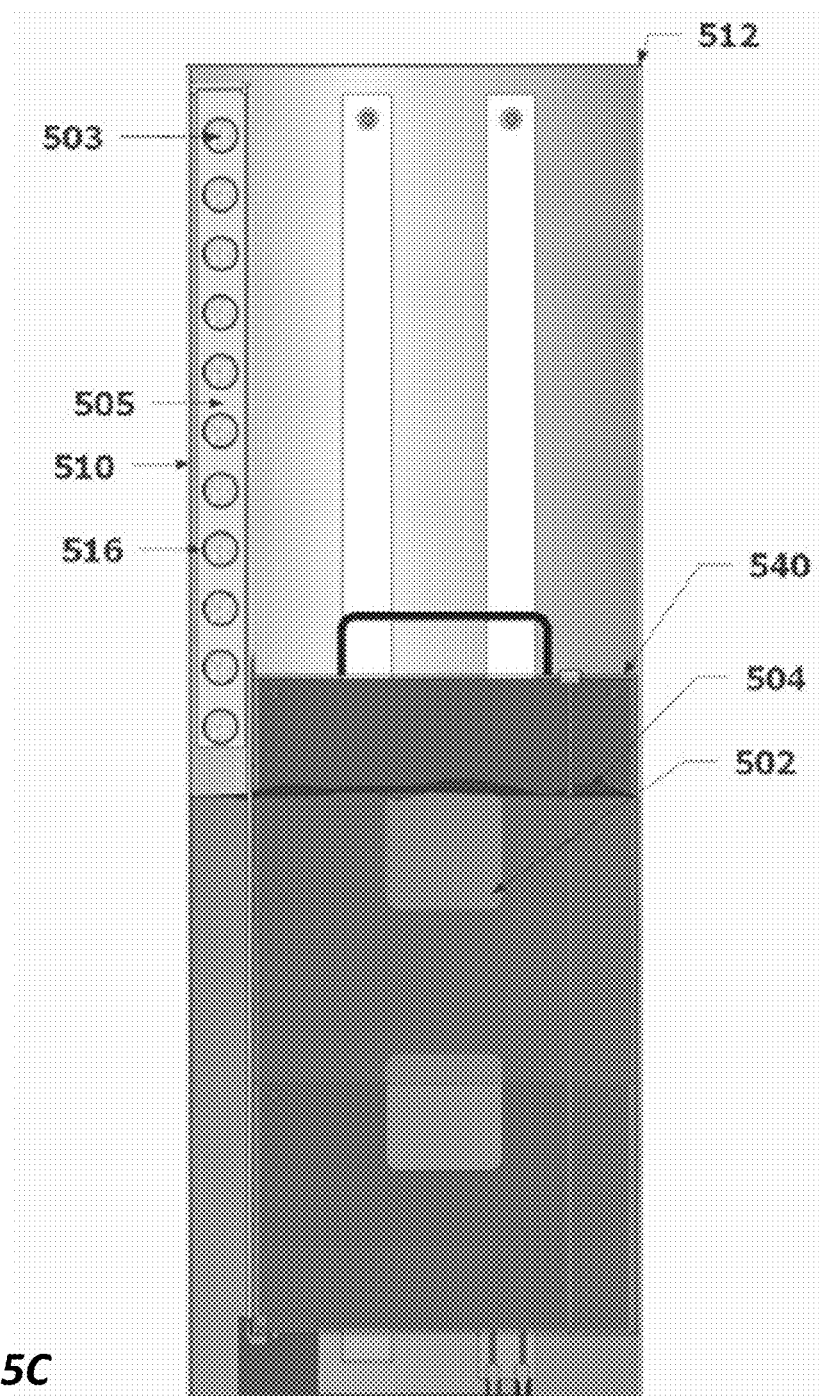
FIG. 5C is a cross-section view of another side of the TPIC apparatus of FIG. 5A.

FIG. 5A is a perspective view of an embodiment of a TPIC apparatus configured to reduce loss of dielectric working fluid. FIG. 5B is a cross-section view of one side of the TPIC apparatus of FIG. 5A. FIG. 5C is a cross-section view of another side of the TPIC apparatus of FIG. 5A.

The TPIC apparatus includes a vapor redirection structure in the form of an immersion module 540. A vapor redirection structure such as the immersion module 540 is a structure which overlies and may partially surround one or more heat generating components, and can serve as a vapor redirection structure which can redirect vapor produced in the vicinity of the HGC during the immersion cooling process by obstructing the vapor's natural path. In embodiments in which condensing elements are laterally offset from a HGC 502, the redirection of the vapor generated adjacent the HGC 502 can include lateral redirection of the vapor in the direction of the condensing elements or condensing chamber, as discussed in greater detail below.

Figure 11:
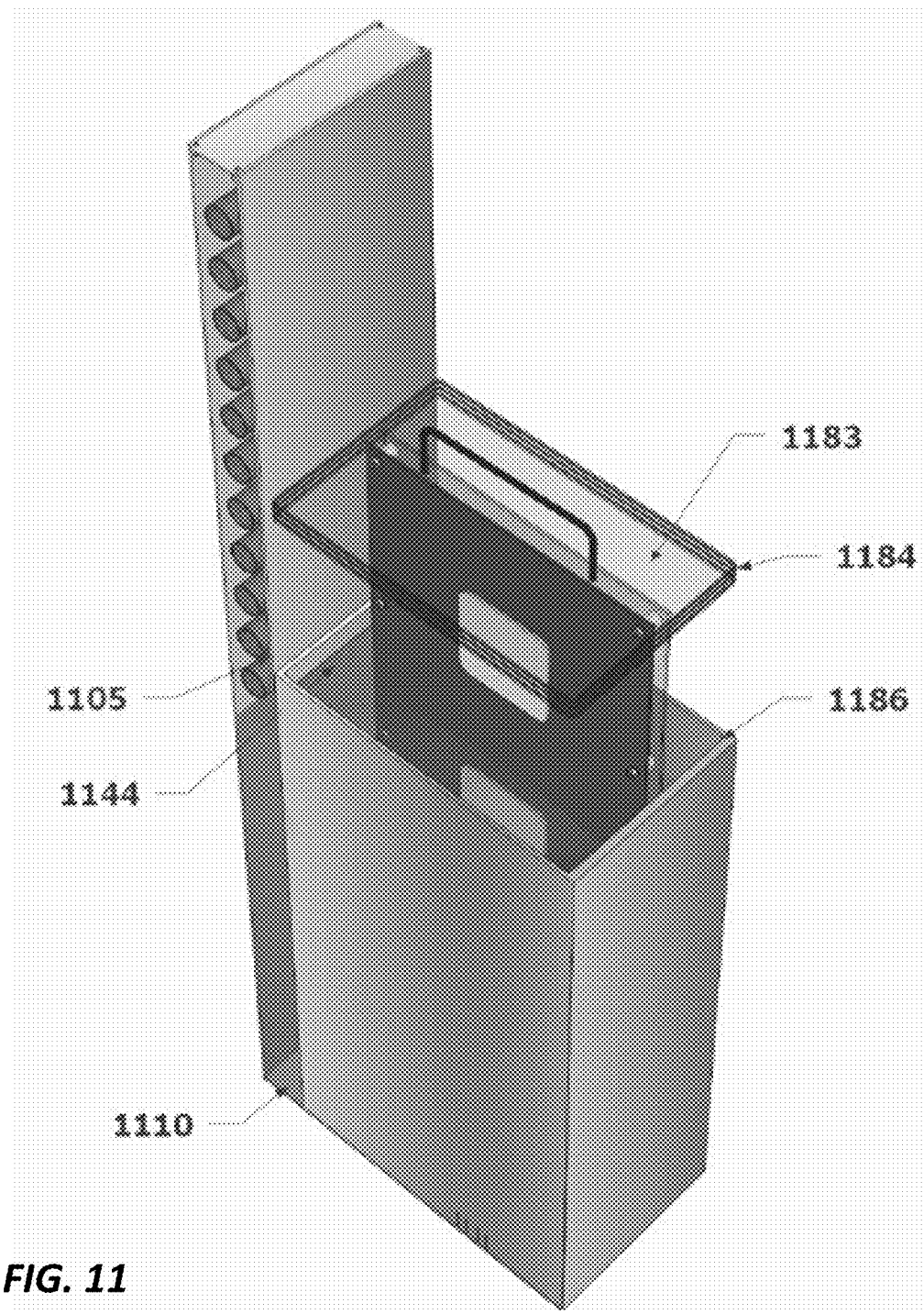
FIG. 11 is a perspective view of an alternative embodiment of an immersion module which includes a radial o-ring.
Figure 12:
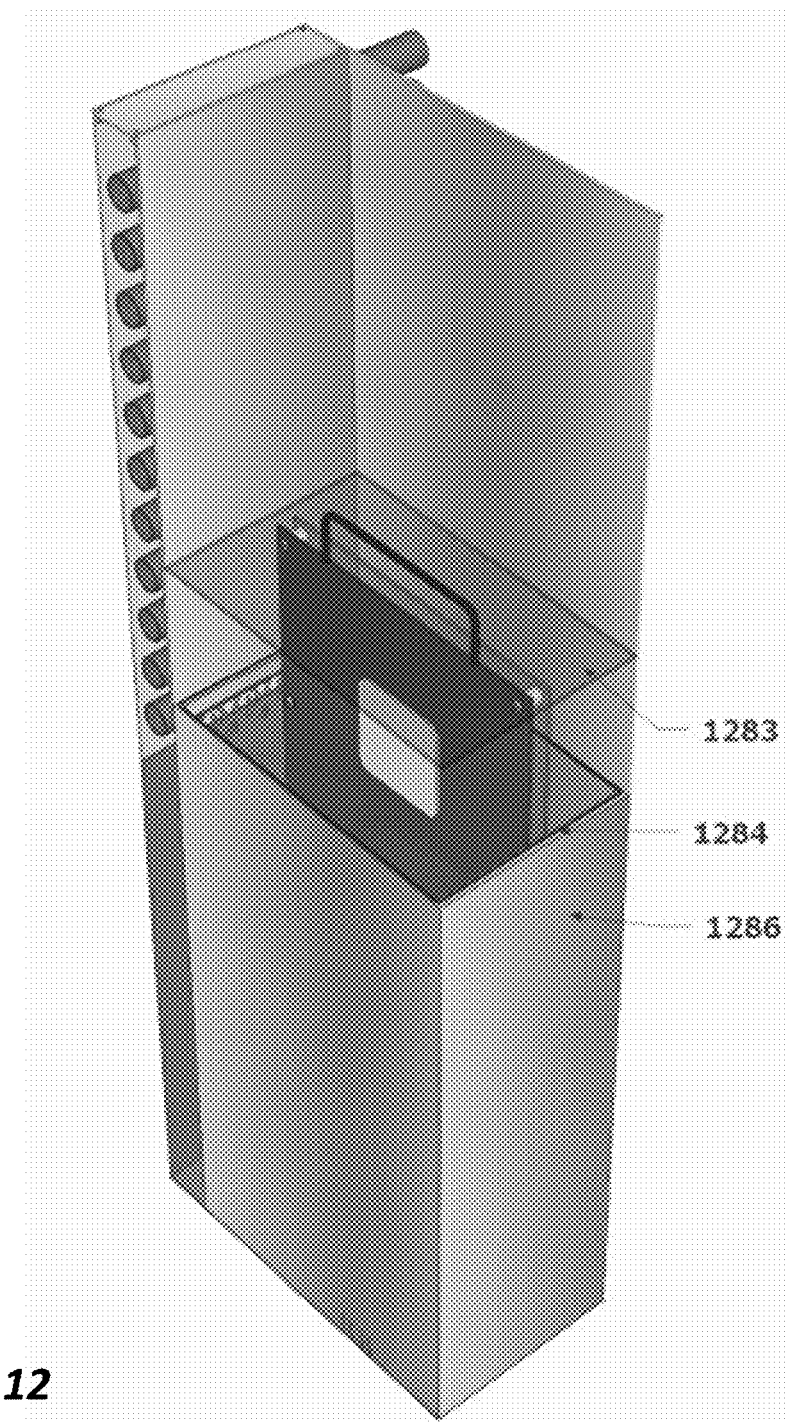
FIG. 12 is a perspective view of an alternative embodiment of an immersion module which includes an axial o-ring.

In some embodiments, the module 540 or other vapor redirection structure may be a single piece or multiple components fixedly coupled together, while in other embodiments an immersion module may be comprised of two or more components which can be separated during normal operation of the vapor redirection structure, as illustrated in FIGS. 11-12 and described in further detail below. In the illustrated embodiment, the immersion module 540 supports or is otherwise mechanically coupled to the HGC 502, but in other embodiments vapor redirection structures may be provided which overlie a HGC but are not directly coupled to or do not support the underlying HGC.

HGC 502 are releasably attached to or otherwise secured within an immersion module 540 and submerged in a dielectric working fluid (DWF) 504 within the basin of a container 510 having a lid 512. Power is supplied to the HGC 502 via the power feedthroughs 501. A secondary working fluid 501 is pumped through the manifold inlet 538, the condensing tubes 516 and finally the manifold outlet 536.

The condensing chamber or condenser chamber 505 is a subdivision or compartment of the immersion container that confines and condenses vapor received by way of fluid communication with the immersion module 540. The condensing chamber 505 provides a more confined space, with a smaller cross-sectional area, in which the vaporized working fluid can interact with and condense on condenser components.

In the embodiment of FIGS. 5A-5C, the condensing chamber 505 is integrated into the design of the immersion container 510. In other embodiments, the condensing chamber, accompanying immersion modules, and other components can be retrofitted into an existing TPIC system. In such situations, the retrofit components may rely on parts of an existing TPIC system for functionality. For example, a retrofit condensing chamber may use an existing container wall to form a functional subdivision within the existing TPIC system. Furthermore, both stand-alone components and unassembled subcomponents may be permanently or non-permanently attached to the TPIC system, or otherwise disposed within the TPIC system. For example, in some embodiments, additional parts may be welded to or otherwise permanently attached to an existing TPIC container. In other embodiments, mechanical fasteners, such as nuts and bolts, can be used to non-permanently secure components to an existing TPIC container, and other methods of non-permanent attachment may also be used. Some existing TPIC systems may allow for "drop-in" retrofitting, in which the required components for retrofitting may be freestanding within the chamber, or held in place by a combination of gravity and press or friction fitting inside an existing TPIC system.

Figure 23:
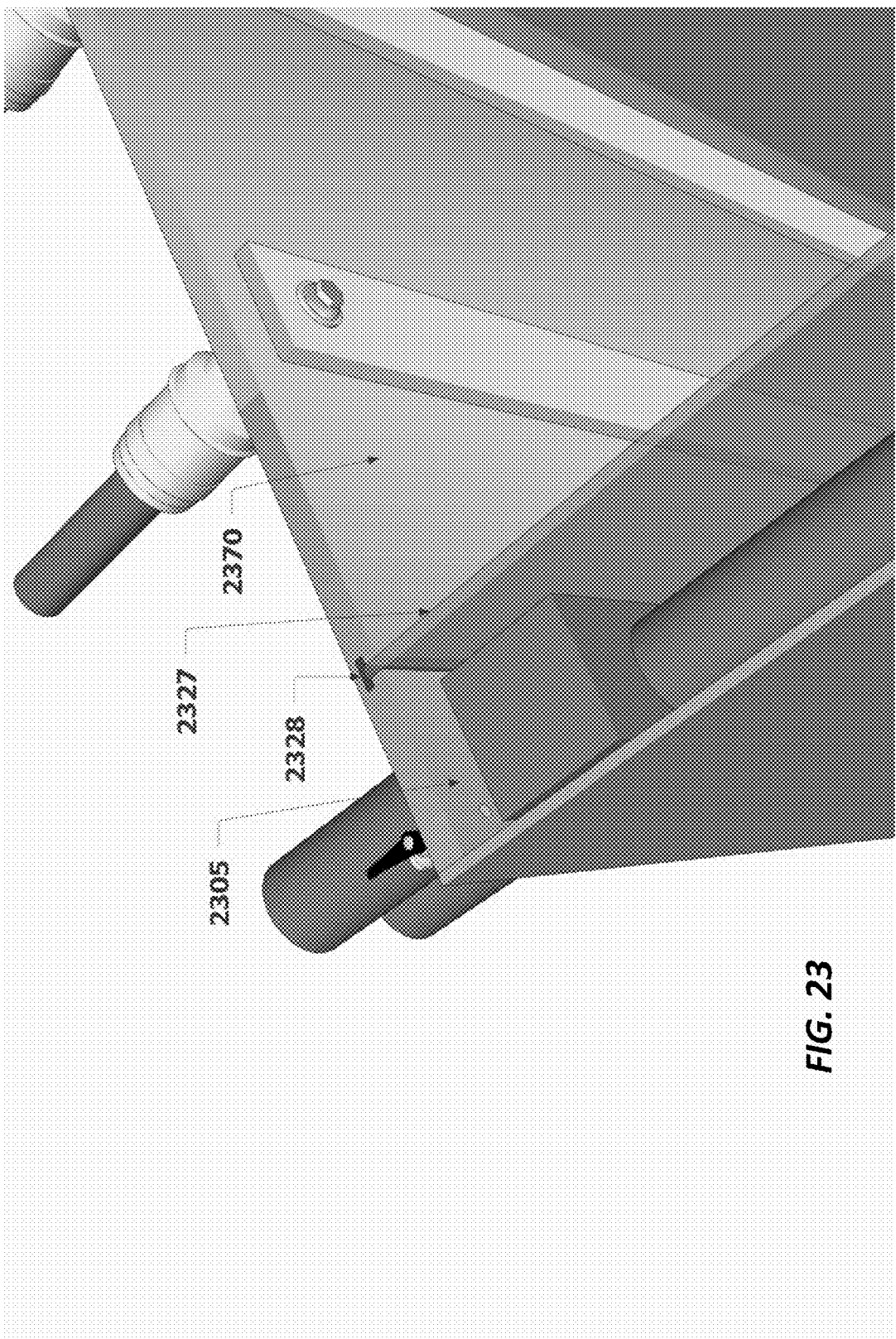
FIG. 23 is a perspective view of a TPIC system including a removable partition dividing a condensing chamber from a secondary chamber.

The divider between the condensing chamber and the secondary chamber need not be an original component of the TPIC system, or a permanently installed component of the TPIC system. FIG. 23 is a perspective view of a TPIC system including a removable partition dividing a condensing chamber from a secondary chamber. The removable partition 2327 has been inserted into guide slots 2328 formed in a T-shape. An elastomeric strip disposed in the widest part of the guide slot interacts with the edge of the removable partition 2327 to form a seal. In some embodiments, the removable partition 2327 comprises glass, while in other embodiments the removable partition 2327 may comprise metal, polymer, or any other suitable material. The removable partition 2327 need not be a homogenous material, but may include a combination of multiple materials. In some embodiments, the removable partition 2327 may include a pane of vacuum glass or another insulated material, and may provide thermal insulation between the condensing chamber 2305 and the secondary chamber 2370.

In other embodiments, a removable partition need not be inserted into guide slots 2328, but may be inserted into a space between supports or guides affixed to or provided on the interior walls of the tank. In some embodiments, the elastomeric or similar material may be disposed on the removable partition 2327, or may be omitted. In other embodiments, a partition may be secured to the interior of a TPIC tank using screws, bolts, tape, adhesive or any other suitable other fasteners. In some embodiments, the installed partition need not be easily removable, and may be a permanent or semi-permanent addition to the TPIC system.

Figure 24:
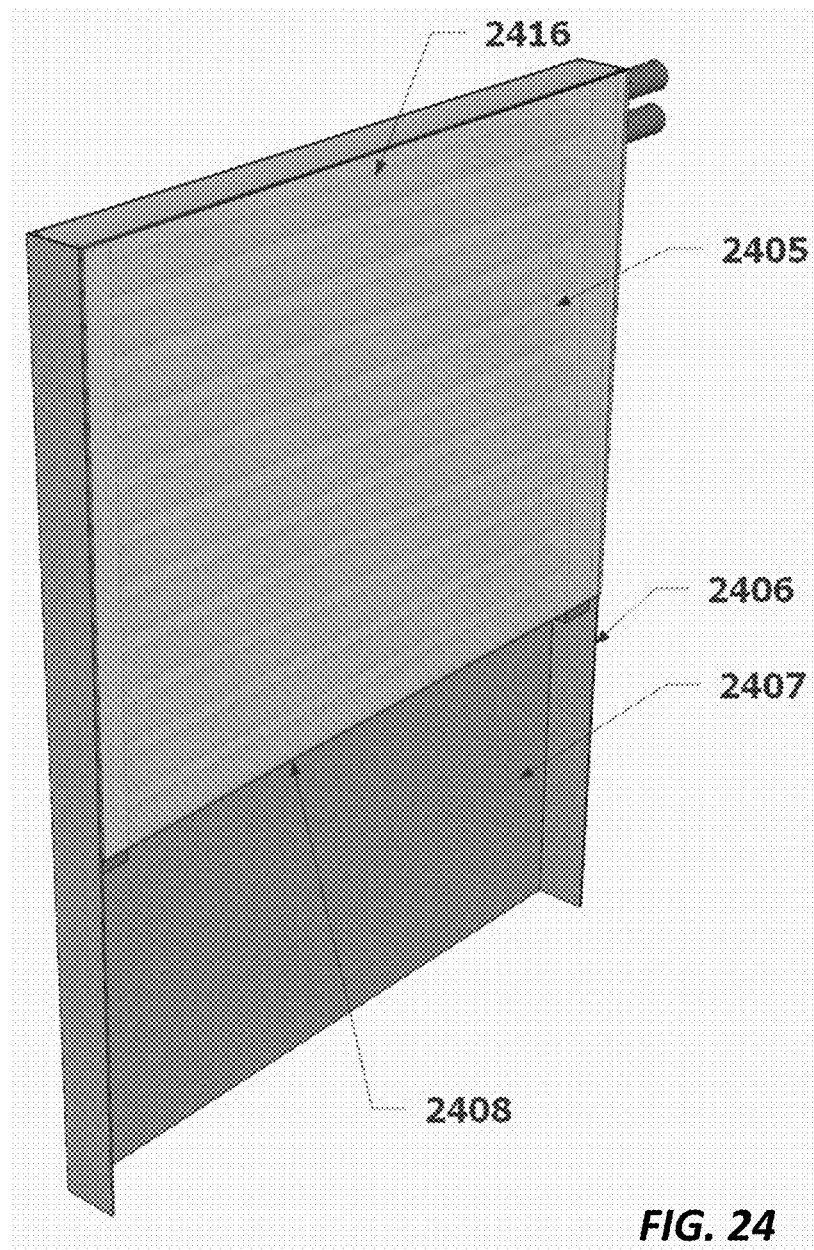
FIG. 24 is a perspective view of a drop-in condenser including condenser chamber components.

In some embodiments, additional components may also be installed along with a component defining a condensing chamber. For example, condenser components such as a primary condenser may be installed along with a condenser divider. FIG. 24 is a perspective view of a drop-in condenser including condenser chamber components. The drop-in condenser unit 2415 includes a plurality of condenser components in the form of condenser tubes 2416. In other embodiments, the condenser components need not be cylindrical tubes 2416 extending across the chamber 2405 but can be tubes of any appropriate size or shape, or can be embedded at least partially within one or more walls of the chamber 2405.

In the illustrated embodiment, the drop-in condenser unit 2415 also includes at least one wall which can form a part of a condensing chamber 2405 surrounding the condenser tubes 2416 once installed. In some embodiments, the drop-in condenser unit 2415 includes a shell 2406 surrounding at least a portion of the condenser tubes 2416, while in other embodiments the shell may include only a partial shell, and may interact with the walls of the chamber or other structures to form a complete condensing chamber. The partial shell may be permanently or non-permanently attached to the condenser.

By providing a drop-in condenser unit 2415 in conjunction with at least part of the walls forming the surrounding condensing chamber, the drop-in condenser unit 2415 may be optimized to operate within the dimensions of the surrounding or resultant condensing chamber. This can be advantageous for the operation of the system. In some embodiments, a drop-in condenser can include sidewall baffles or a similar structure attached to the shell or wall which modifies air flow around the condenser components.

A condenser may be designed so that during operation, vapor from the working fluid is not prevented from rising within the condensing chamber. However, excess space in the condensing chamber may not enhance condensing performance but may result in more volume occupied by uncondensed vapor, which may lead to larger changes in system pressure during changes in system power. Therefore the space between the condensing tube or tubes and the walls that surround them may be important to overall TPIC system performance.

In some embodiments, the drop-in condenser unit 2415 need not be surrounded on multiple sides by the shell 2406. In some embodiments, the drop-in condenser unit 2415 may be connected to a plane that would serve as the division between the condensing chamber and the secondary chamber once integrated into a TPIC system.

In other embodiments, the drop-in condenser unit 2415 may be connected to four surrounding walls with a removable lid. In this embodiment, it may be advantageous to extend the outermost wall 2407 below the level at which the boiled vapor would enter the condensing chamber in a TPIC system. The two walls adjacent perpendicular to the far wall may also be extended in a similar manner, so that the space between the surface of the working fluid and the lower edge of wall 2408 opposite wall 2407 can serve as a vapor inlet for the condensing chamber 2405, for example. The aforementioned walls may be extended so that, during operation, boiled vapor from the HGC cannot bypass the vapor inlet for the condensing chamber 2405.

The drop-in condenser unit 2415 may be secured in place within the TPIC system. In some embodiments, the drop-in condenser unit 2415 may be mechanically affixed to the interior of a TPIC vessel. For example, support system such as a hook or set of hooks may be used to suspend the assembly from the rim of the TPIC vessel. Alternatively, the drop-in condenser unit 2415 may be affixed to the TPIC vessel by non-mechanical means such as using two sided tape. Magnets, suction cups, screws, bolts, or any other suitable system to fasten the drop-in condenser unit 2415 to the TPIC vessel may be used.

Figure 6A:
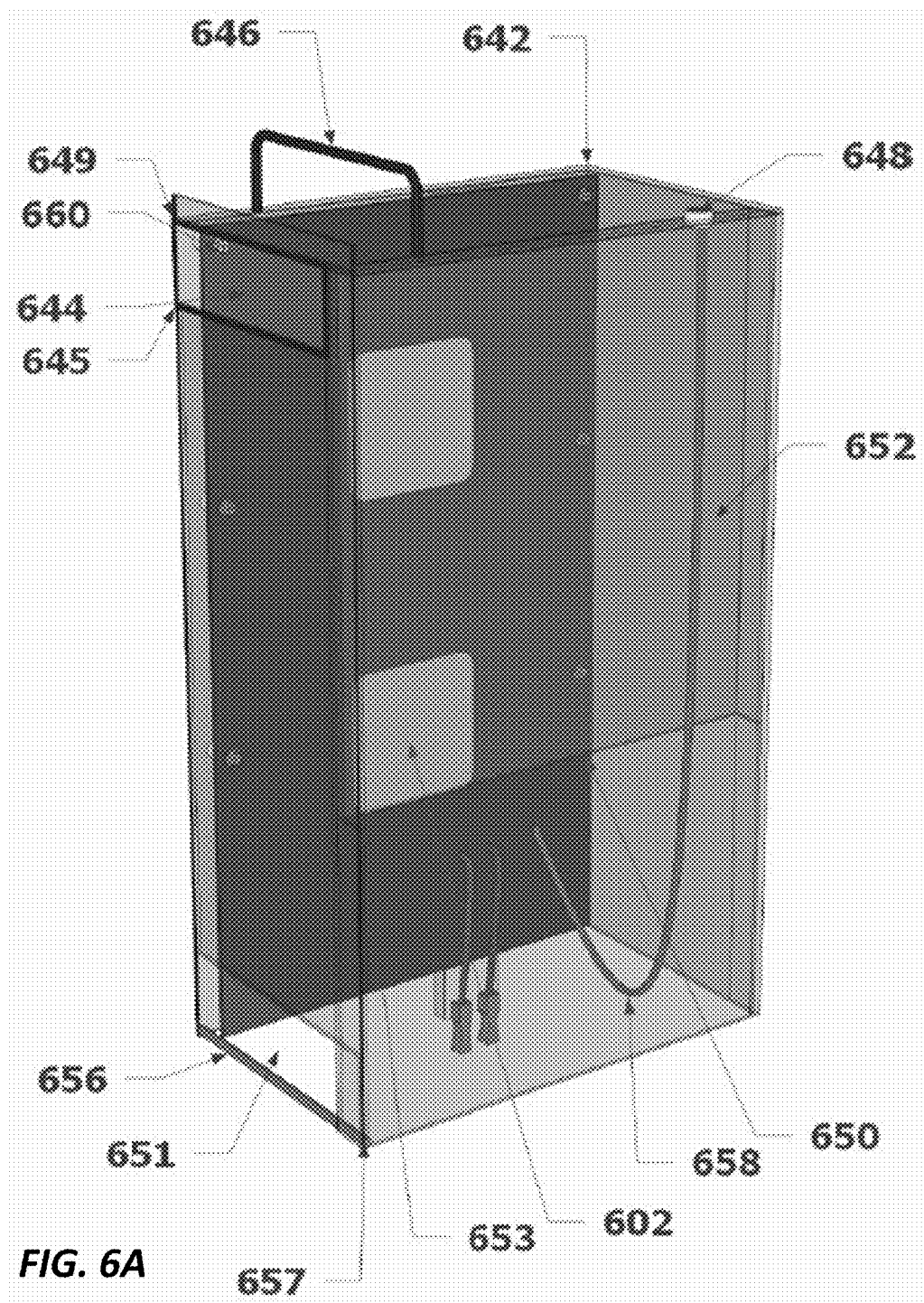
FIG. 6A is a perspective view of an immersion module of the TPIC apparatus of FIG. 5A.
Figure 6B:
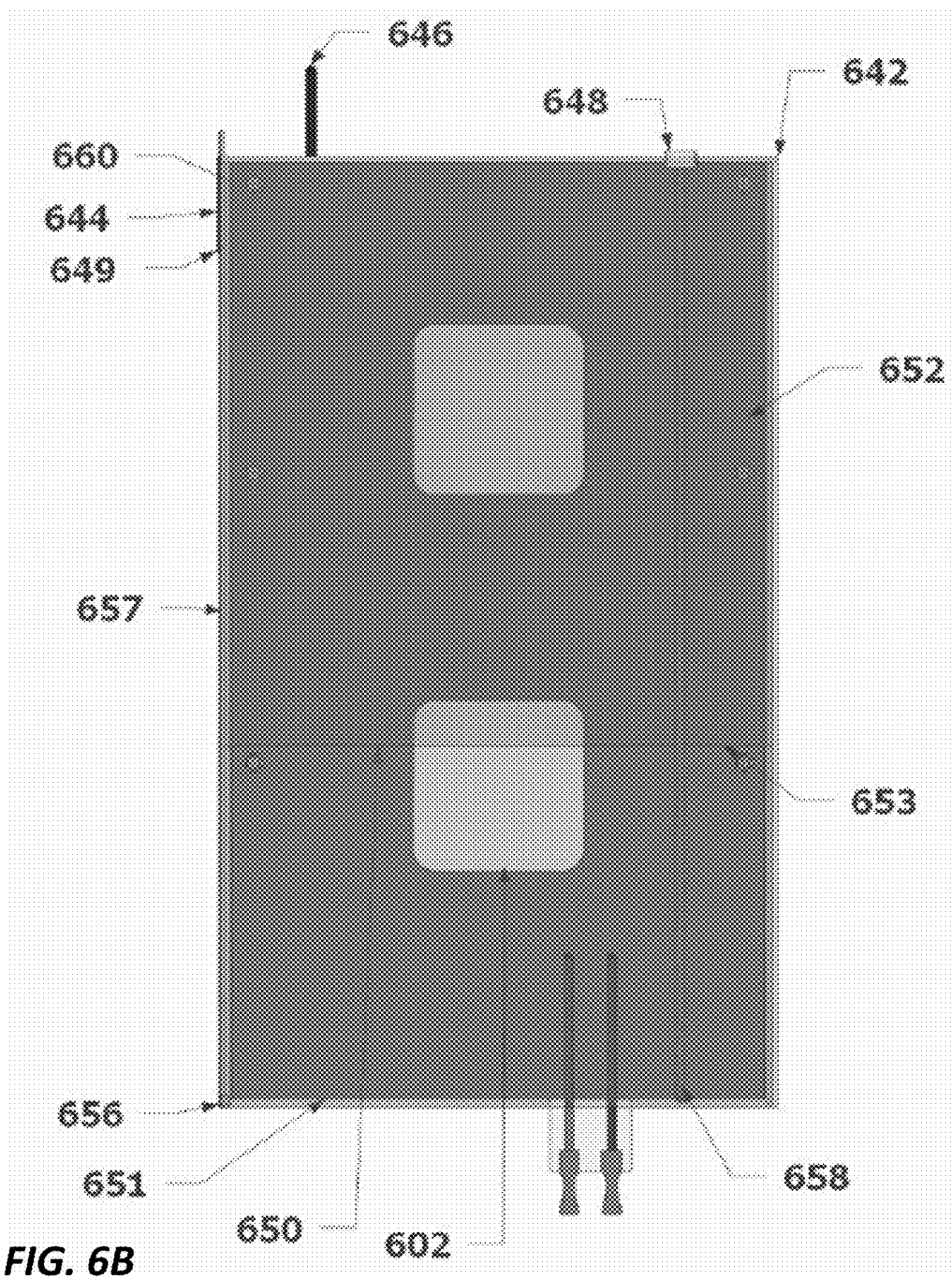
FIG. 6B is a front view of the immersion module of FIG. 6A.
Figure 6C:
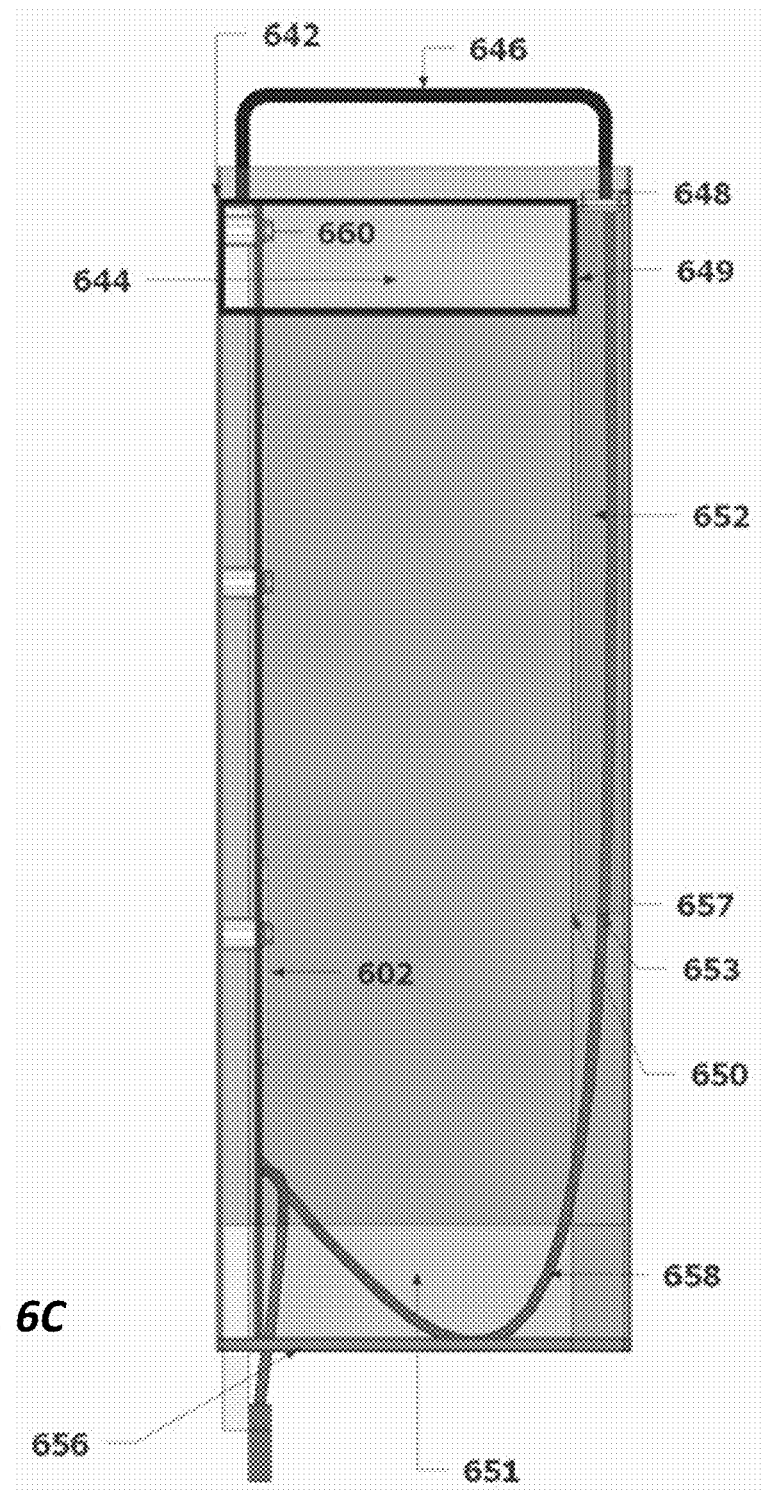
FIG. 6C is a side view of the immersion module of FIG. 6A.

FIG. 6A is a perspective view of an immersion module of TPIC apparatus of FIG. 5A, shown with an accompanying heat-generating component (HGC) disposed within the immersion module. FIG. 6B is a front view of the immersion module of FIG. 6A. FIG. 6C is a side view of the immersion module of FIG. 6A.

A HGC 602 is releasably attached to or otherwise secured within a partial shell 642, which may in some embodiments be constructed of a transparent or translucent material. The use of a transparent or translucent material can allow an operator to, for example, more easily identify the particular heat generating component secured within an immersion module. In the embodiment depicted in FIG. 6A, the component is secured by fasteners 660. A handle 646 attached to the partial shell 642 provides a secure grip for lifting the immersion module. Within the partial shell 642, a partition 650 creates a low pressure section 652 inaccessible by the vapor bubbles produced by the HGC 602 once immersed.

The module low pressure section 652 is, in the illustrated embodiment, a relatively small subdivision of the partial shell 642 interior created by a partition 650 extending below the fluid level once immersed. The module low pressure section 652 may or may not be partially above the natural fluid level of the working pool. The opening at the bottom 653 of the module low pressure section 652 is positioned out of the way of bubbles that could enter the module low pressure section 652. Because the low pressure section 652 is not subject to the pressure created by boiled vapor bubbles, it 652 allows cables 658 to penetrate the module using relatively inexpensive, pressure resistant cable feedthroughs 648, which need not be hermetic.

The vapor outlet 644 is an opening in the module through which vapor escapes the module during normal operation. The vapor outlet 644 may or may not be distinct from the module fluid inlet, described below. In this embodiment, the vapor outlet 644 is generally rectangular in shape. In other embodiments, any suitable shape can be used.

Unless specifically noted otherwise, a contact seal may be formed by contact between two facing surfaces. Depending on the materials, conditions, and the amount of force (if any) used to hold the surfaces together, such a seal provided may be hermetic level seal, a near-hermetic level seal, or may simply provide some resistance to vapor leakage. The degree of sealing provided by such a contact seal may vary in different embodiments.

The module sealing surface 645 is a portion of the module that contacts, either directly or indirectly, the sealing surface of the condensing chamber to provide a channel of fluid communication of a contact seal between the module and the condensing chamber. In the case of indirect contact, an O-ring, gasket 649 or other medium can be interposed between the module and condensing chamber to improve the level of seal achieved.

In this embodiment, the module sealing surface 645 extends around the perimeter of the vapor outlet 644, which in the illustrated embodiment is rectangular in shape. In other embodiments, the module sealing surface need not be enclosed. For example, a module sealing surface designed to seal a partially submerged vapor outlet would benefit little, if any, from a seal below the fluid level as vapor would need a substantial amount of pressure to displace the fluid level. Therefore, in such a situation, a sealing surface that runs across the top and down the sides of the vapor outlet, past the fluid level once submerged, may be as effective as and less costly than a sealing surface that runs the perimeter of the vapor outlet. In such an implementation, the upper surface of the fluid may effectively serve as the lower edge of the vapor outlet of the immersion module.

The fluid inlet 651 is an opening in the shell of the immersion module through which fluid enters the module during normal operation. The fluid inlet 651 may or may not be distinct from the module vapor outlet 644. For example, the fluid inlet 651 and the vapor outlet 644 may be contiguous sections of a single opening or aperture in the shell, with the boundary between the two being defined by the upper surface of the fluid level. In the illustrated embodiment, the fluid inlet 651 includes an opening in a sidewall 657 of the immersion module 650, formed as a shorter sidewall which does not extend down as far as the other three sidewalls, as well as an opening at the base of the shell 642. In other embodiments, the fluid inlet may be comprised of one or more openings in any of the sidewalls, or by differences in the heights of the various sidewalls, as well as an opening at or in the base of the shell 642. The fluid inlet 651 need not be a single contiguous opening, but may include multiple openings which are separated from one another by a portion of the shell 642 or another component of the immersion module.

Grooves 658 in the outer surface of the shell 642 that run along a wall of the module can provide a track to interface with guides affixed to the interior of the immersion container, as discussed in greater detail below with respect to FIGS. 9A-C. Such an interface can be used to allow translation of the immersion module along a path defined by the guides.

An integrated latch striker 656, by mating with an electronic rotary latch affixed to the bottom of the immersion container, provides a means of latching the immersion module to the floor of the immersion container, and can be used to hold the immersion module in place against force biasing or pulling the immersion module upwards.

Figure 7A:
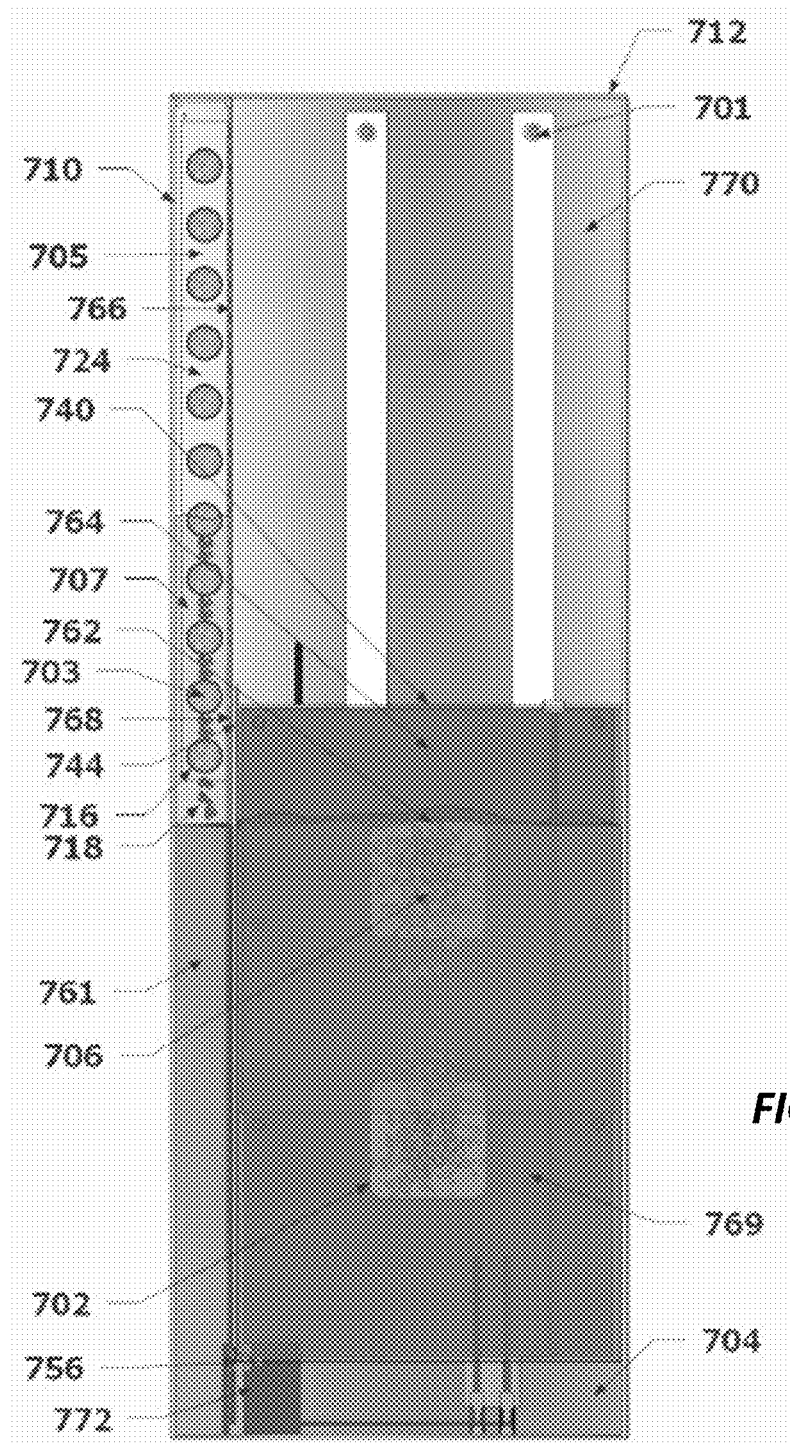
FIG. 7A is a cross-sectional view illustrating the operation of a TPIC apparatus such as the apparatus of FIG. 5A.
Figure 7B:
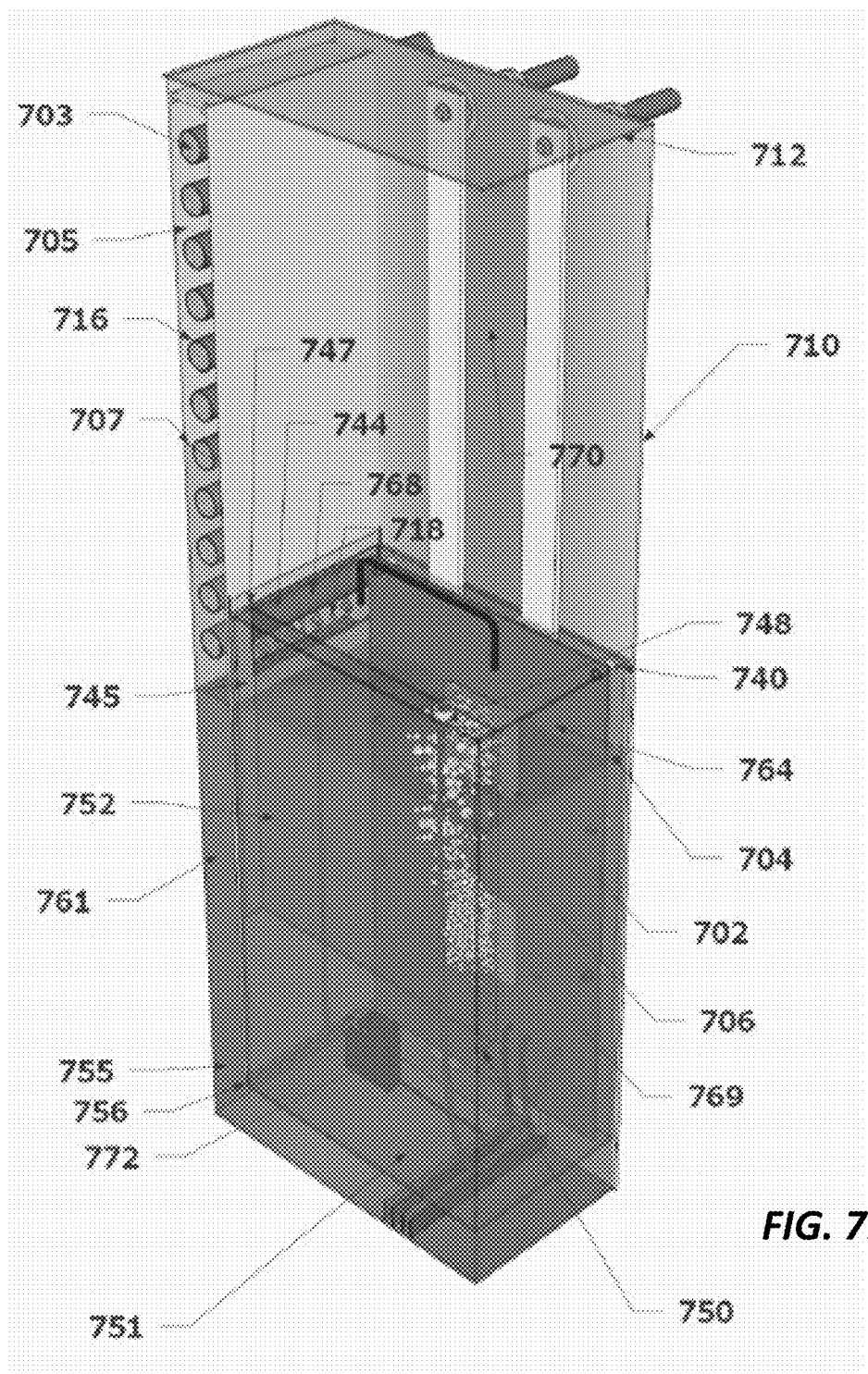
FIG. 7B is a cutaway perspective view illustrating the operation of a TPIC apparatus such as the apparatus of FIG. 5A.

FIG. 7A is a cross-sectional view that illustrates the inner workings of the TPIC apparatus. FIG. 7B is a cutaway perspective view that illustrates the inner workings of the TPIC apparatus.

The TPIC apparatus includes a vapor inlet 768, an opening through which vapor enters the condensing chamber 705 from an adjacent immersion module 740. The fluid outlet 755 is an opening through which fluid exits the condensing chamber 705. In this embodiment, the vapor inlet 768 is distinct from the fluid outlet 755. In other embodiments, the vapor inlet and vapor outlet may not be distinct. For example, the vapor inlet 768 and the fluid outlet 755 may be contiguous sections of a single opening or aperture in the walls of the condensation chamber, with the boundary between the two being defined by the upper surface of the fluid level.

The chamber sealing surface (CSS) 747 is a portion of a wall of the condensing chamber that contacts, either directly or indirectly, the module sealing surface 745 to provide a channel of fluid communication via a contact seal between the module 740 and the condensing chamber 705. In the case of indirect contact, an O-ring, gasket or other medium can be interposed between the module 740 and condensing chamber 705 to improve the level of seal achieved.

Because the contact seal made between the module 740 and the condensing chamber 705 is made within the sealed environment of the immersion container 710, the vapor passed through the contact seal will be confined by the seal as well as the pressure of the container interior. Any leakage from such a seal may stay in the system and increase the pressure on the exterior of the contact seal, which should improve the level of the seal. The contact seal between the module 740 and the condensing chamber 705 may also be aided by the relatively large cross section of the vapor outlet 744 as well as the relatively low pressure of the condensing chamber 705 interior.

In the illustrated, the CSS 747 surrounds the perimeter of the vapor inlet 768, which happens to be rectangular in shape. In other embodiments, the CSS 747 need not circumscribe the entire vapor inlet. For example, a CSS designed to seal a partially submerged vapor inlet would benefit little, if any, from a seal extending substantially below the fluid level as vapor would need a substantial amount of pressure to displace the fluid level. Therefore, in such a situation, a sealing surface that runs across the top and down the sides of the vapor inlet, past the fluid level once submerged, may be as effective as, and less costly than a sealing surface that runs the perimeter of the vapor inlet.

Once powered on, heat generated by the HGC 702 causes the DWF 704 to boil, forming vapor bubbles 706. Buoyancy causes the vapor bubbles to rise within the immersion module 740. As the bubbles break the surface 762 of the fluid, vapor is released to the top section of the immersion module 740. The module vapor zone 764 is the upper region of the module interior wherein boiled vapor accumulates and is eventually ejected from the module through the vapor outlet 744 as vapor pressure in the module vapor zone increases. While some non-condensable gas (NGC) will be present in the top section of the immersion module 740, the NCG will be displaced during operation of the system by the denser vaporized working fluid. The module immersion zone 769 is the region of the module interior that is immersed in and at least partially encloses a volume of working fluid.

As vapor from the module vapor zone 764 enters the condensing chamber 705 through the vapor inlet 768, it comes into contact with the condensing coils 716 and transfers latent heat to a secondary working fluid 703, condensing into a liquid 718 in the process. Gravity then pulls the liquid 718 downwards towards to the working fluid pool 704. Within the condensation chamber 705, the equilibrium between the vapor and condensation gives definition to the vapor zone 707. Above the vapor zone is a region 724 that contains a mixture of air and vapor.

The wall or walls of the condensing chamber 705 subdivide the tank into two sections in the area above the immersion module 740. Because the immersion module 740 directs all or substantially all of the vapor into the condensing chamber, the vapor zone 707 is confined to the condensing chamber 705, and the area directly above the immersion module 740 is comparatively free from vapor. The height of the vapor zone 707 is dependent on the rate of vaporization due to the amount of power supplied to the HGC 702 and the rate of condensation at the coils, but would not be substantially affected by the width of the area that the vapor zone 707 can fill. Thus, the height of the vapor zone would remain substantially similar in the absence of the confinement provided by the condensing chamber 705.

In the absence of the subdivision provided by the condensing chamber, the vapor zone 707 would be at a similar height, but would extend across the entire tank, greatly increasing the amount of vaporized working fluid present in the system during operation, as the vaporized working fluid at the opposite end of the tank would not experience substantial condensation until it reaches the condensing coils. Thus, the volume occupied by the vapor zone 707 is less than it would be if not for the confinement provided by the condensing chamber 705. Therefore, for a given increase in power supplied to the HGC 702, a smaller amount of air/vapor mixture is displaced than would be if not for the confinement of the vapor zone 707 provided by the condensing chamber 705. A subdivided TPIC system will more quickly reach equilibrium, as less working fluid is required to be vaporized to reach the equilibrium height of the vapor zone 707. A subdivided system can therefore effectively provide a smaller cross-sectional size in the condensing chamber 705 and reduce the volume of the vapor zone, while still maintaining a larger cross-sectional size in the working fluid bath region, allowing the positioning of more or larger HGCs 702, directing the vapor generated by those HGCs 702 into the smaller condensing chamber.

In addition to requiring a shorter time to reach an equilibrium state, the reduced volume of vaporized working fluid at the equilibrium state can reduce the amount of NCG which is displaced and/or compressed during operation of the system. Depending on the design of the system, this can have multiple effects on the design and/or operation of the system. In a vented system, the amount of gas that must be vented during system startup can be significantly reduced, reducing the displacement loss of vaporized working fluid vented along with the gas. In a system with a volume or pressure compensation device, as discussed in greater detail below, the size, cost, and operation of the volume compensation device can be reduced as there is less volume or pressure change to compensate for.

In this embodiment, upon leaving the condensing chamber, the condensate 718 runs through a condensate return column 761, a confined section that accepts condensate from the condensing chamber 705 and for some length, isolates the condensate before it merges with the working fluid pool 704. Because the condensate in the condensate return column 761 is always flowing in one direction, it can be an ideal place for a submerged subcooling heat exchanger, as discussed in greater detail below with respect to FIG. 20.

The container will also include a stratified buffer zone (SBZ) in the secondary chamber 770, a region of the container to which boiled vapor and turbulence caused by fluid movement do not have direct access. The secondary chamber 770 can be bounded by the container lid at the top, the wall of the condensing chamber 705 on at least one side, one or more walls of the container on other sides, and the top of one or more immersion module(s) 740 and/or the upper level of the working fluid along the bottom. While boiled vapor may not have direct access to the secondary chamber 770, some fluid evaporation may slowly diffuse into the secondary chamber 770 under normal operating conditions, the amount depending at least in part on the surface area of the exposed working fluid pool between modules. In addition, as discussed in greater detail below, other embodiments may include passive or active fluid communication between the condensing chamber and the secondary chamber 770. Therefore it may be beneficial to fabricate module shells with strict tolerances so that, in operation, the inter-module spacing is minimized. Furthermore, an elastomeric seal (not shown) around the crown of one or more modules or along the sides of one or more modules may be added to seal any inter-module spacing that may exist.

Fluid may also be introduced to the secondary chamber 770 during the module removal process. As a module is ejected and suspended in the "up" position, it will drip fluid back down to the newly exposed area of the working fluid pool, directly below the ejected module. Between the warm fluid draining and the evaporation from the exposed area of the working fluid pool, some vapor may be added to the secondary chamber 770.

Because the secondary chamber 770 can in some embodiments be isolated from the air/vapor mixture generated within the immersion modules and condensing chamber during operation of the HGCs, it will be relatively stagnant. The lack of turbulence or other disturbance will allow vapor molecules, which are relatively dense, to settle downwards while displacing relatively light molecules of the gases which comprise air. Therefore, any vapor that enters the secondary chamber 770 will settle along the bottom of the secondary chamber 770, away from points at which the vapor can escape into the atmosphere, namely, the lid and feedthrough seals while the system is closed and the container opening while the system is open.

Even the nominal amount of vapor pressure in the secondary chamber 770 during normal operation may be undesirable, especially for poorly sealed immersion systems. As mentioned above, fabricating modules with minimal inter-module spacing will reduce the amount of evaporation and resultant vapor pressure. The use of elastomeric seals to further minimize inter-module spacing may also reduce evaporation and resultant vapor pressure. Yet another way to lower the vapor pressure of the secondary chamber 770 is the use of a condenser to condense the working fluid vapor within, as discussed in greater detail below with respect to FIGS. 22A and 22B

In the illustrated embodiment, an electronic rotary latch 772 holds the module in place during normal operation. The latch 772, affixed to the bottom of the immersion container 710, prevents the immersion module 740 from upwards movement by engaging and securing the module's latch striker 756 into the "locked" position of the latch 772. In other embodiments, magnets, screws and other holding mechanisms may be used to secure the module during normal operation. In other implementations, the immersion modules may rest in the lowered position during normal operation, and an apparatus such as a stepper motor may be provided to move the immersion modules upwards when needed, or the immersion modules may be raised manually.

Figure 8A:
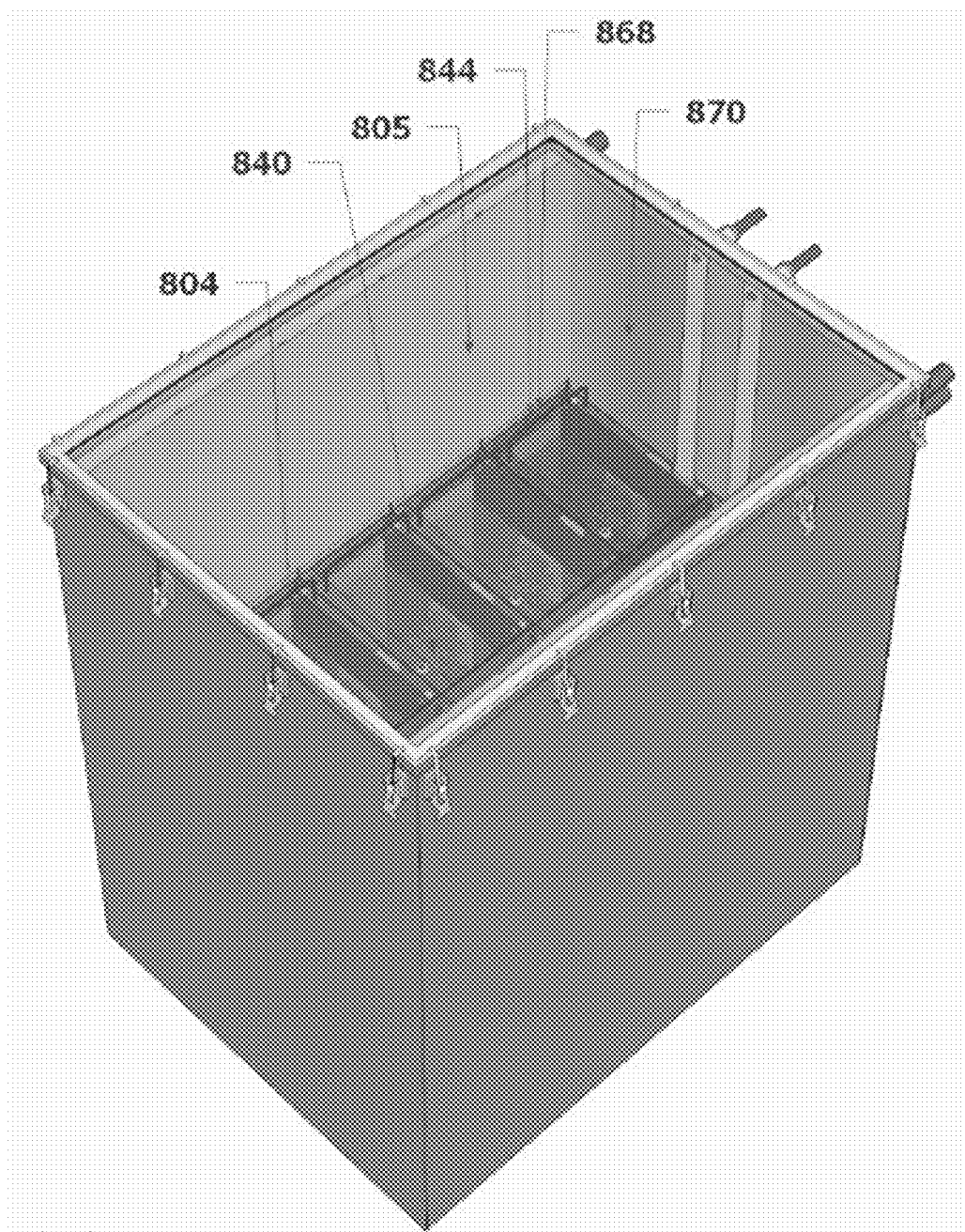
FIG. 8A is a perspective view of another embodiment of a TPIC apparatus configured to reduce loss of working fluid through the use of multiple immersion modules.
Figure 8B:
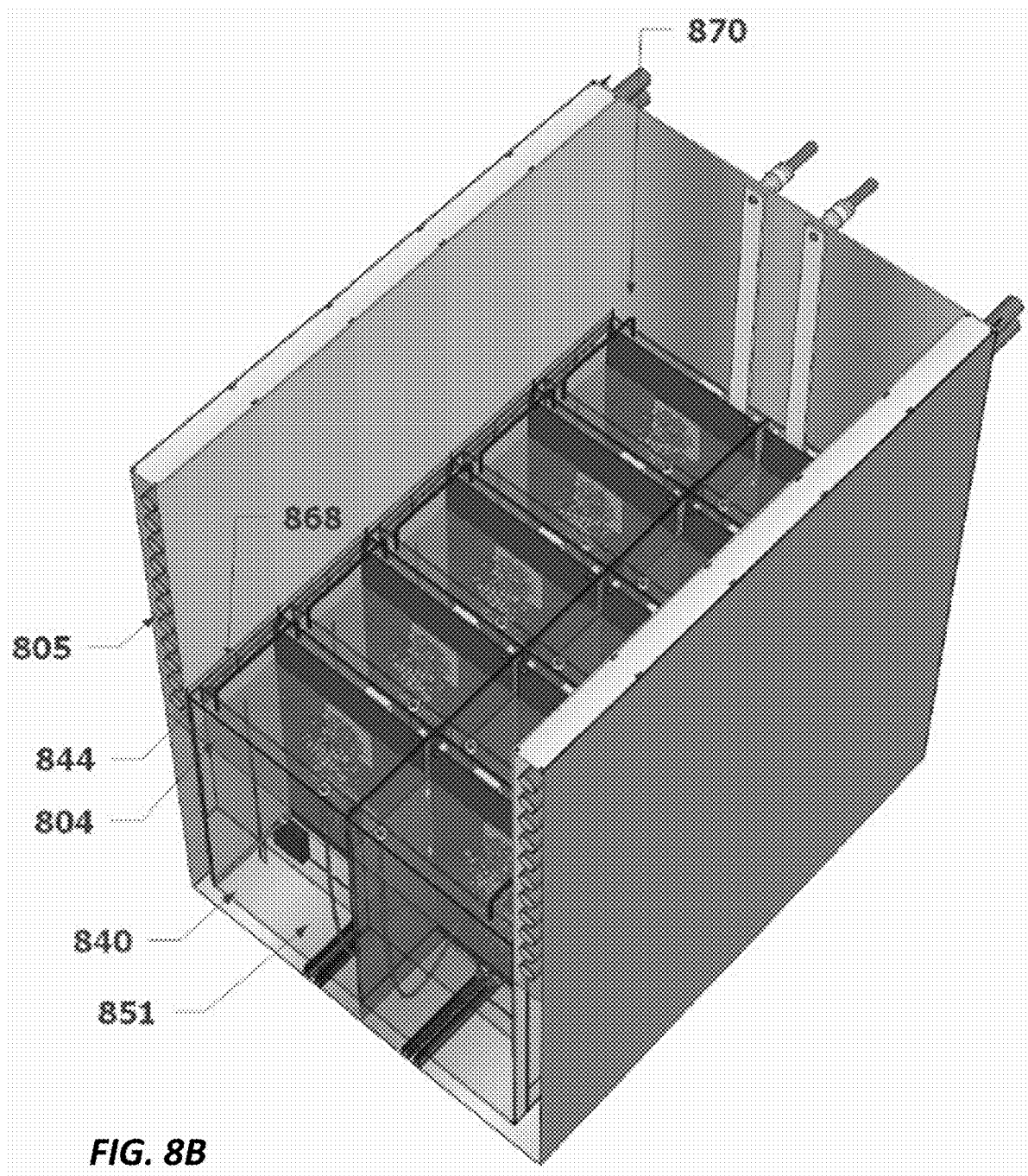
FIG. 8B is a cutaway perspective of a TPIC apparatus such as the apparatus of FIG. 8A.

The embodiment shown in FIG. 5A is scalable to cool multiple modules. FIG. 8A is a perspective view of an extended embodiment of the TPIC apparatus depicted in FIG. 5A. FIG. 8B is a cutaway perspective of a TPIC apparatus such as the apparatus of FIG. 8A. As shown, multiple modules 840 can be deployed next to one another and operated independently while being connected to the same condensing chamber.

Such a TPIC apparatus can provide improved reliability as compared to a single phase liquid cooled server rack (SLCSR) with a plurality of nodes, each attached by a pair of quick-disconnect (QD) fittings. An SLCSR can include a chassis, a central manifold, a QD fluid outlet, a QD fluid inlet, and an SLCSR node Like an SLCSR node, a member module 840 of the embodiment shown in FIG. 8A can be removed for maintenance without interrupting the cooling of other members of the group. However, the physical mechanism by which a SLCSR node connects to the SLCSR central manifold and the physical mechanism by which the immersion module 840 of the TPIC apparatus depicted in FIG. 8A connects to the condensing chamber 805 are quite different. An SLCSR node requires two independent liquid tight QD connections to exchange heat with the central manifold. Embodiments of immersion modules such as immersion module 840 can utilize only a crude face seal between the module vapor outlet 844 and the condensing chamber vapor inlet 868 in order to complete the heat exchange circuit. Because the module 840 is immersed in the working fluid pool 804 and the module's coolant supply is the pool 804 itself, no seal is required to supply a module 840 with coolant via fluid inlet 851.

In the implementation of FIGS. 8A and 8B, a single condensation chamber may include multiple vapor inlets 868, each configured to be placed in fluid communication with a different immersion module. As a module is ejected or raised, and suspended in a raised or "up" position for draining, there exists the possibility that the vapor from adjacent modules may enter the secondary chamber 870 through the vapor inlet 868 of the condensing chamber 805.

Figure 9A:
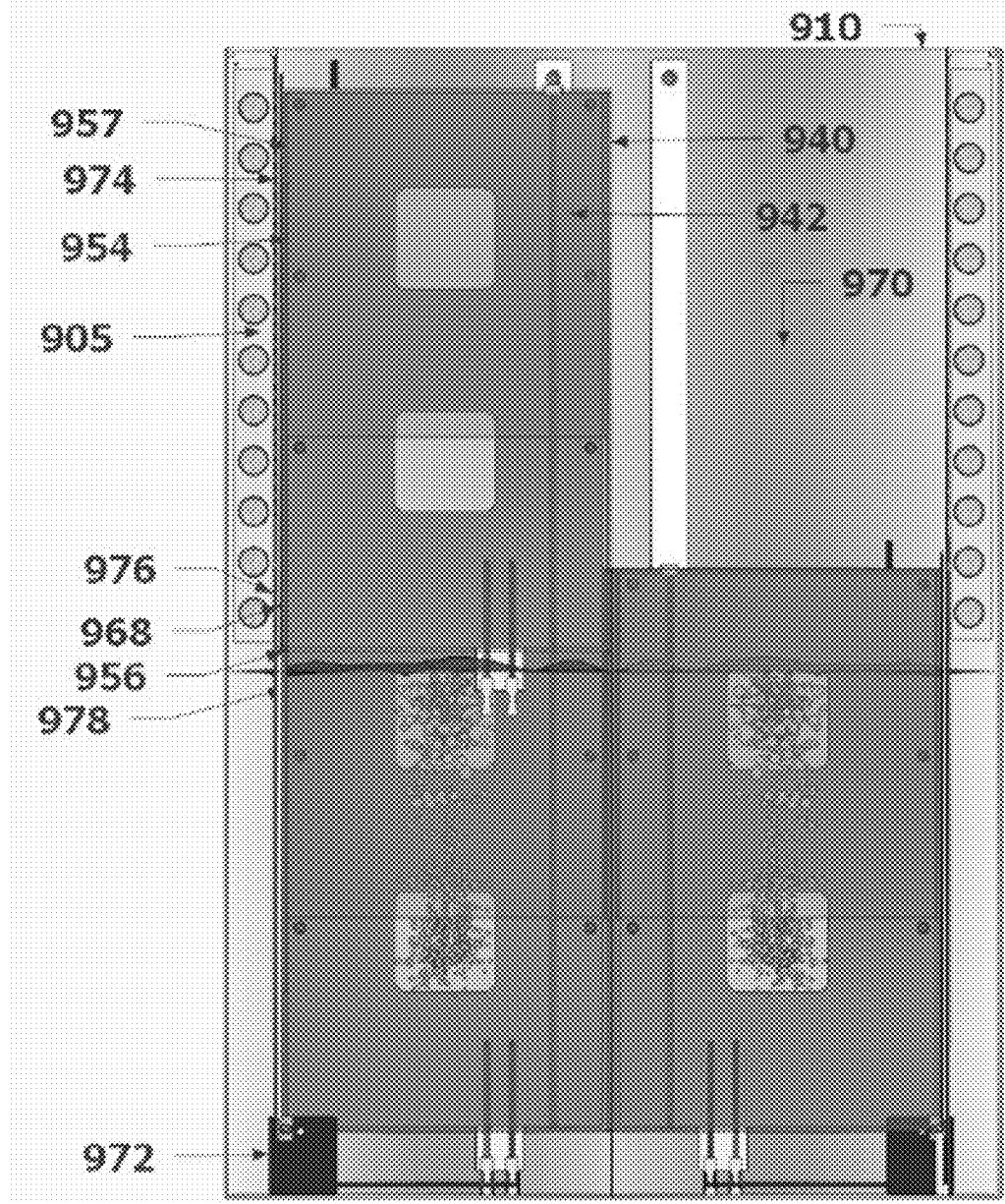
FIG. 9A is a cross-sectional view illustrating the closing of a vapor outlet to isolate the interior of the immersion tank from the condensing region of the TPIC apparatus of FIG. 8A.
Figure 9B:
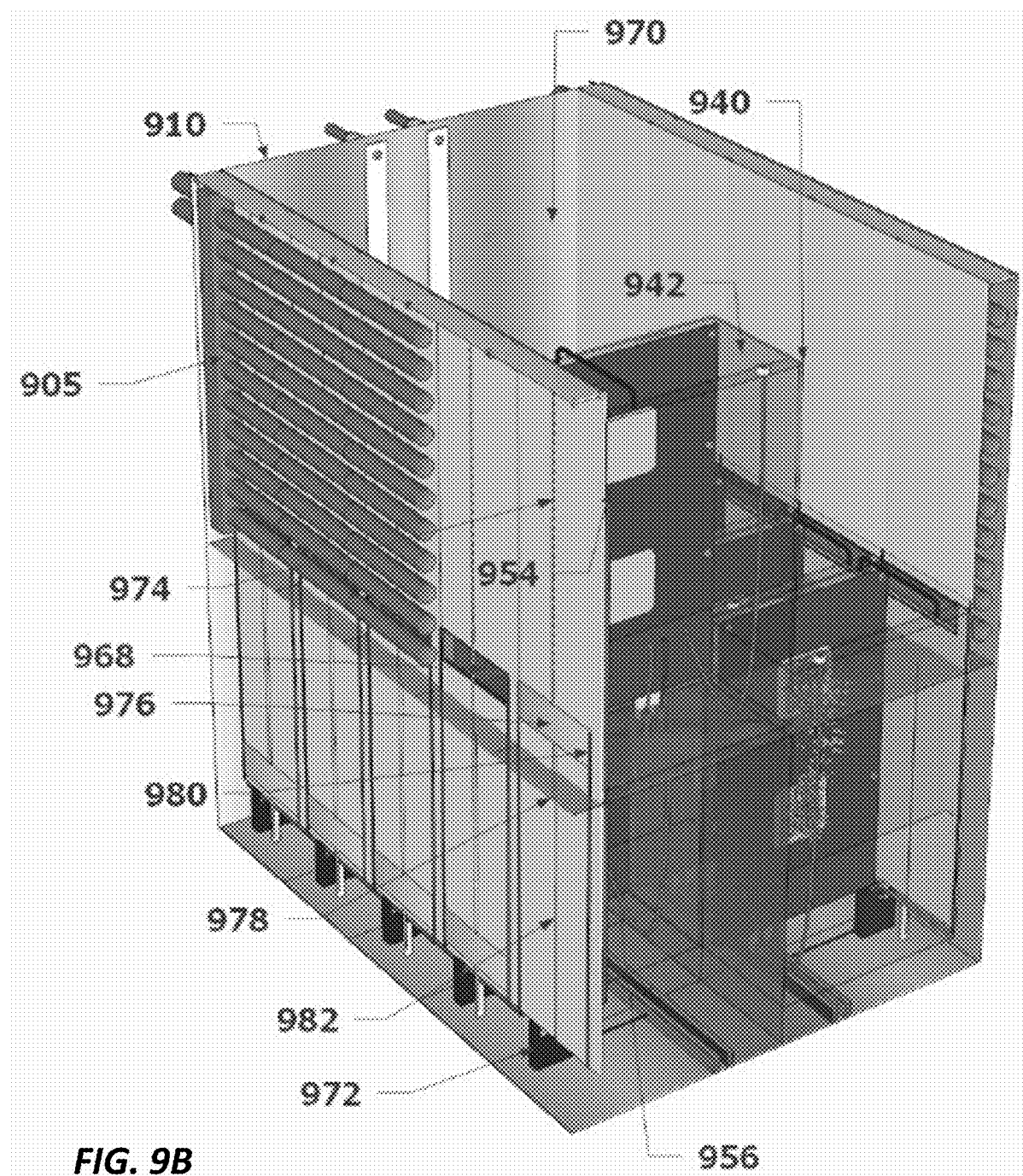
FIG. 9B is a cutaway perspective view illustrating the closing of a vapor outlet to isolate the interior of the immersion tank from the condensing region of the TPIC apparatus of FIG. 8A.
Figure 9C:
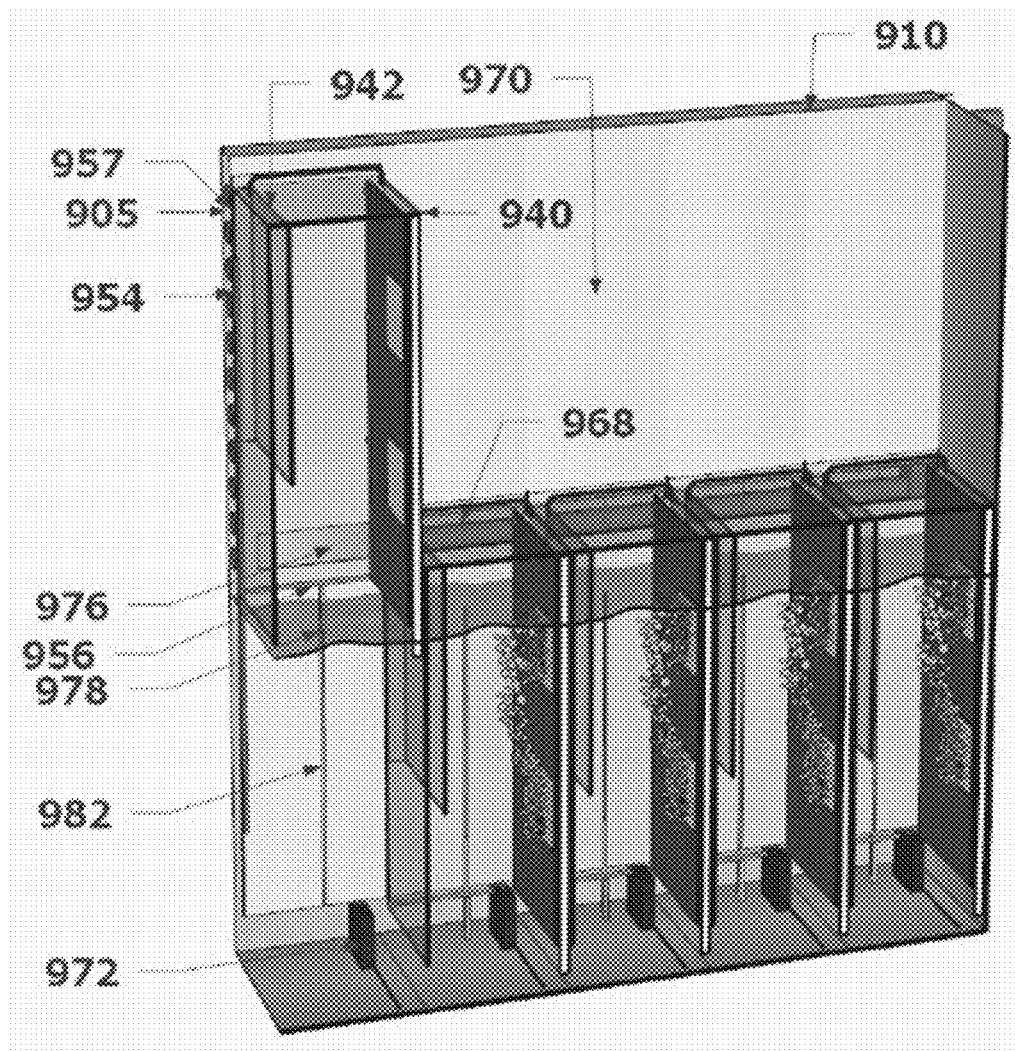
FIG. 9C is another cutaway perspective view illustrating the closing of a vapor outlet to isolate the interior of the immersion tank from the condensing region of the TPIC apparatus of FIG. 8.

In order to prevent such gas flow, a blockage mechanism such as the mechanism shown in FIG. 9 can be employed. FIG. 9A is a cross-sectional view illustrating the closing of a vapor outlet to isolate the interior of the immersion module from the condenser region of the TPIC apparatus of FIG. 8. FIGS. 9B and 9C are cutaway perspective views from different angles illustrating the closing of a vapor outlet to isolate the secondary chamber from the condensing chamber of the TPIC apparatus of FIG. 8.

In this embodiment, when the electronic latch 972 is released, an extension spring 974 contracts, pulling a sliding gate assembly 976, held in place by guides 980, upwards. Because the tooth 978 of the sliding gate 976 is in contact with the latch striker 956 of the module 940, the module is also ejected upwards by the contraction of the extension spring 974. The module is confined to vertical movement by the interface between the small grooves cut in a sidewall 957 of the module shell 942 and the small guides 954 affixed to the interior of the immersion container 910. The gate assembly 976 stops its upward movement when the gate assembly tooth 978 contacts the top of the tooth channel 982. At this point, the sliding gate is in position to block vapor within the condensing chamber 905 from reaching the secondary chamber 970. As the module in pushed down into operating position, the module latch striker 956 will depress the gate tooth 978 and the sliding gate assembly 976, opening the vapor inlet 968 of the condensing chamber 905.

An example of another mechanism that can be used to block vapor from exiting the condensing chamber is a gravity or spring powered flap valve positioned on the condensing side of the vapor inlet. The flap would keep the condensing chamber vapor inlet closed until vapor from the module forces the flap upwards, opening the vapor inlet.

In addition to mechanisms that block vapor at the vapor inlet, baffles or tube sheets can be placed around the condensing tubes to prevent vapor from drifting along the length of the condensing chamber and exiting the chamber at any open vapor inlets. In addition, the size and shape of the condenser tubes or other condenser components can be different at different heights, as discussed in greater detail below.

Although certain embodiments of vapor redirection structures is depicted in FIG. 5A through FIG. 9, vapor redirection structures of a wide variety of other configurations and designs may be utilized. Vapor redirection structures of different shapes and sizes may be used within a single TPIC system to support or overlie HGCs of different sizes and shapes. In some embodiments, a single vapor inlet may be configured to be placed in fluid communication with more than one immersion module or other vapor redirection structure. In one such embodiment, a single vapor inlet can be configured to be placed in fluid communication with two vapor redirection structures, such as two adjacent immersion modules, or can be configured to be placed in fluid communication with any number of vapor redirection structures. In some embodiments, the system may include only a single vapor inlet, dimensioned such that it can be placed in fluid communication with all immersion modules in the system. In some embodiments, a vapor inlet configured to be placed in fluid communication with multiple immersion modules may include multiple blocking mechanisms. In some particular embodiments, each blocking mechanism can be configured to block different portions of the vapor inlet as various immersion modules are moved away from the vapor inlet.

Figure 10A:
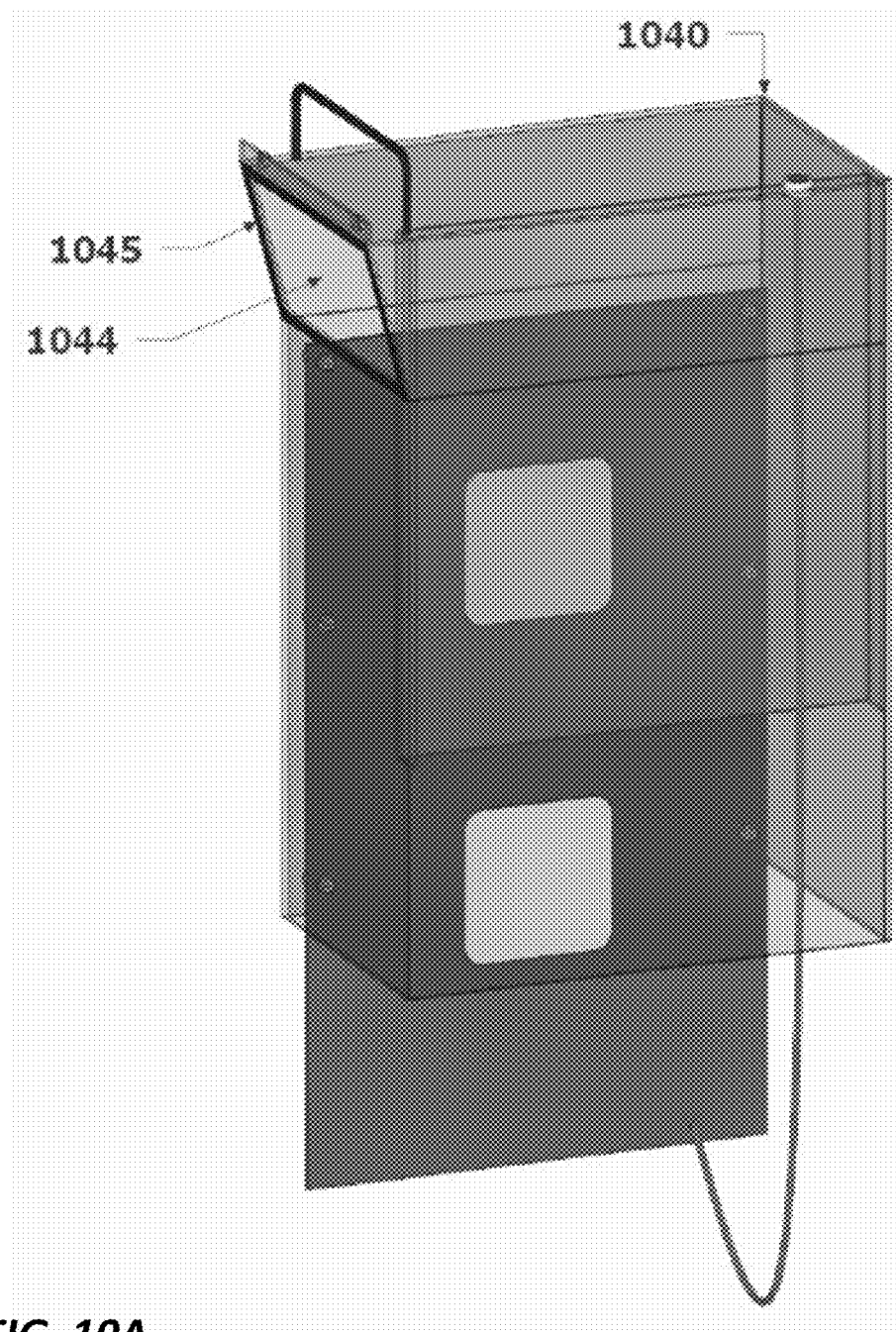
FIG. 10A is a perspective view of an alternative embodiment of an immersion module, in which the gasket is oriented at an angle.
Figure 10B:
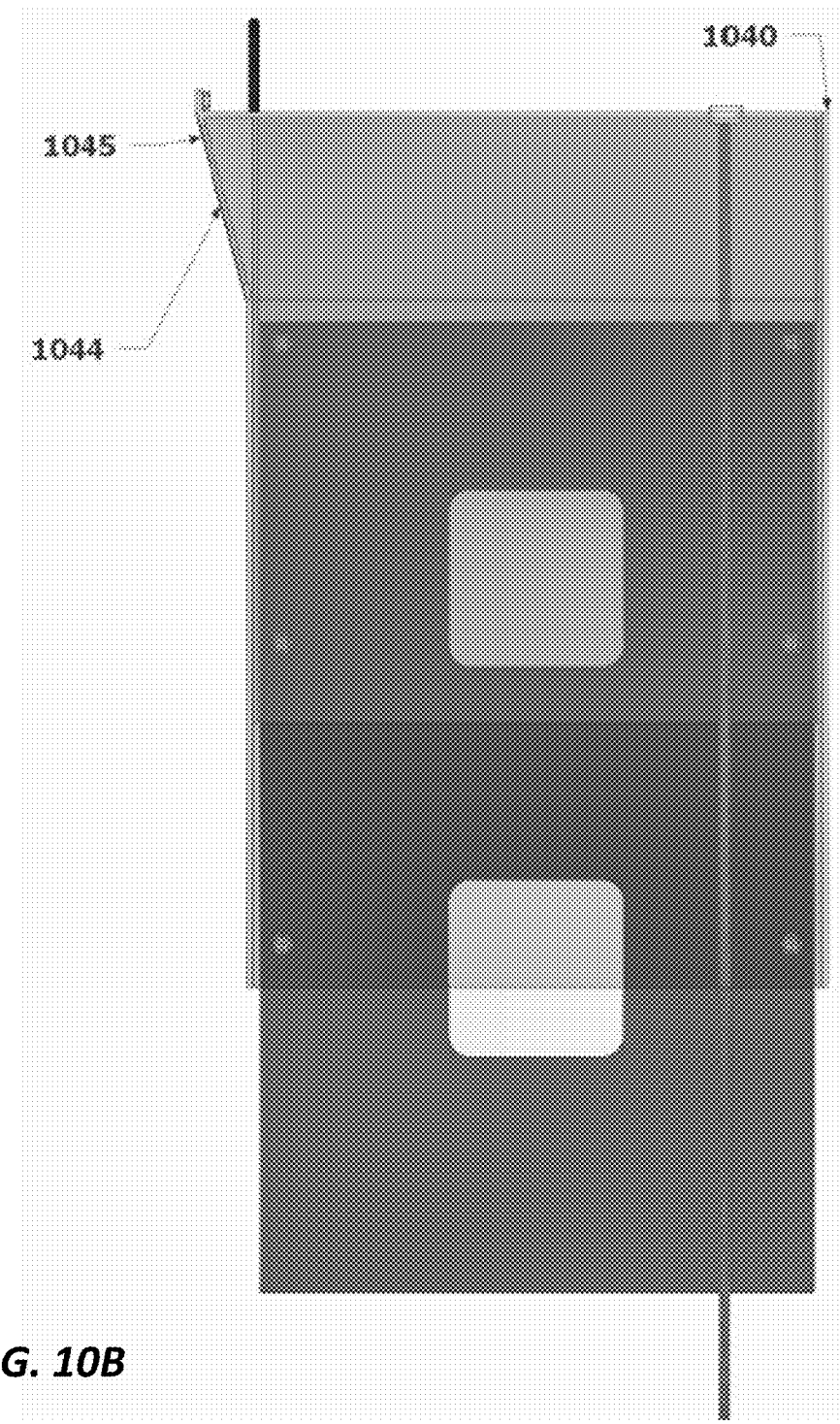
FIG. 10B is a front view of the immersion module of FIG. 10A.
Figure 10C:
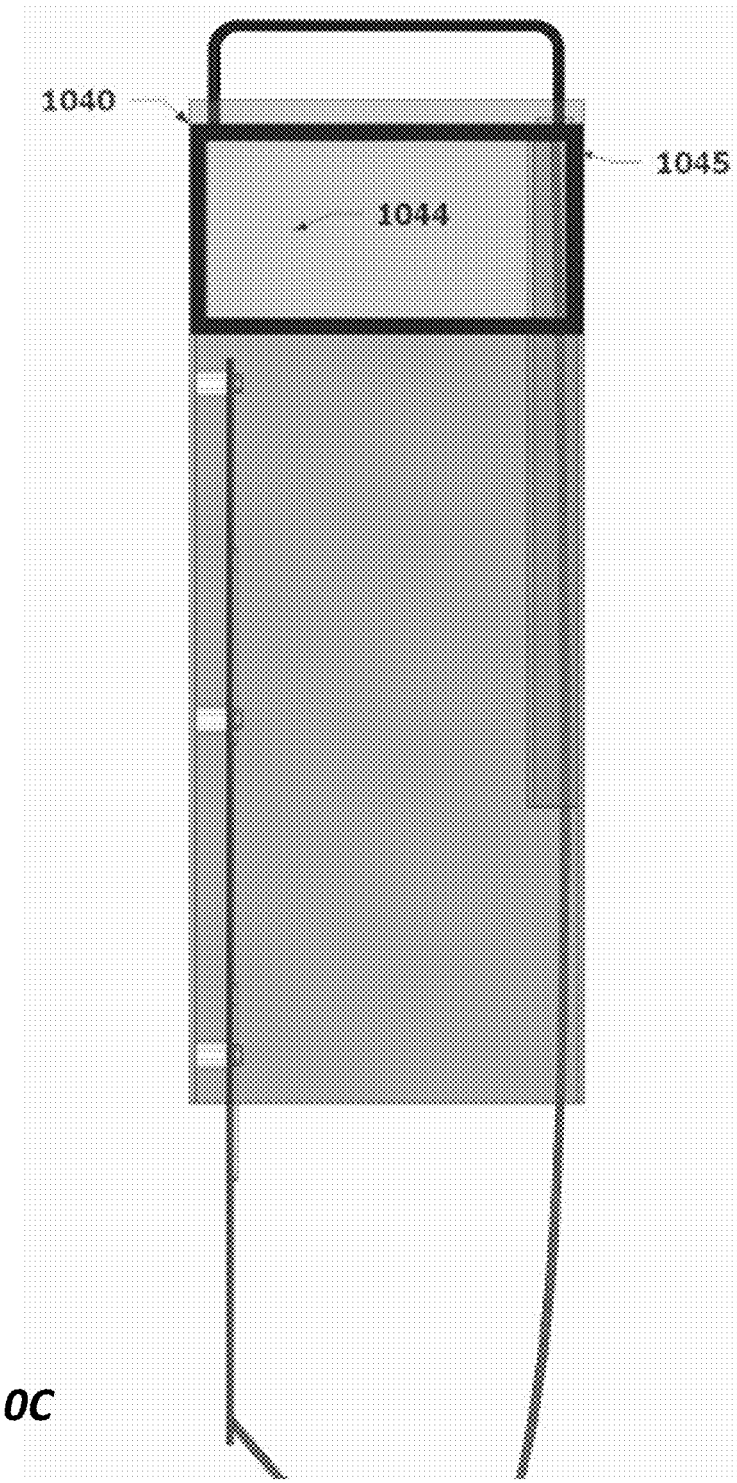
FIG. 10C is a side view of the immersion module of FIG. 10A.

FIG. 10A is a perspective view of an alternative embodiment of an immersion module, in which the module sealing surface 1045 is oriented at an angle. FIG. 10B is a front view of the immersion module of FIG. 10A. FIG. 10C is a side view of the immersion module of FIG. 10A. It can be seen that the immersion module 1040 of FIGS. 10A-10B differs from the immersion modules 540 of FIG. 5A through FIG. 9 in that a section of the immersion module 1040 including the vapor outlet 1044 is oriented slightly downward at an angle to the vertical. In such an embodiment, a downward force exerted by a latch or other restraining mechanism on the immersion module 1040 to hold the immersion module 1040 in place will help to maintain a seal around the vapor outlet 1044 of the immersion module 1040. A contact seal between the vapor outlet and the vapor inlet, as defined above, may be provided in a variety of configurations.

FIG. 11 is a perspective view of an alternative embodiment of an immersion module which includes a radial o-ring 1184. In this embodiment, the immersion module consists of two components; a module plug and a module receptacle. The removable top section of the immersion module, the module plug 1183, includes at least one radial o-ring 1184 extending around its perimeter. In this embodiment, the lower portion of the module, the module receptacle 1186, can be either permanently or temporarily affixed to the container interior 1110 or to the condensing chamber 1105, or both. In some implementations, the module receptacle 1186 may be constructed of a metallic material, but in other embodiments the module receptacle 1186 can be made of a transparent polymer or any other suitable material or combination of materials.

When the module plug 1183 is pressed into the module receptacle 1186, the radial o-ring 1184 forms a contact seal, such that the area within module receptacle 1186 above the fluid surface is sealed, and the vaporized working fluid will be directed towards the vapor outlet 1144 of the immersion module.

In some embodiments, the module plug 1183 may be held in place by a frictional fit, while in some other embodiments, one or more flanges or lips (not shown) extending from interior surfaces of the module receptacle may serve as a stop or provide additional support.

In some embodiments, other seal configurations can be used. FIG. 12 is a perspective view of an alternative embodiment of an immersion module which includes an axial o-ring 1284. In such an embodiment, the removable top section of the immersion module, the module cover 1283, may not be press-fit into an opening in the immersion module, but may instead be held in place and the seal maintained by gravity alone. In some embodiments, the axial o-ring 1284 may be located on top of the lower section of the immersion module, the module receiver 1286, as shown. In other embodiments, the o-ring could be placed on a lip or flange extending inward from the top of the module receiver 1286. In other implementations, the o-ring may be disposed underneath the module cover.

In certain embodiments discussed above, the upper surface of the vapor redirection structure or immersion module is described as being above the level of the working fluid in the tank. In other embodiments, however, a vapor redirection structure may be used which is partially or entirely immersed within the working fluid. Such an arrangement will not impede the operation of the boiling of the working fluid adjacent the HGC, and may allow the use of a robust fluid seal to seal components of the vapor redirection structure. Immersion of components of an immersion module or vapor redirection structure can allow the components to form a more robust seal.

As discussed elsewhere herein, in some embodiments one or more HGCs may underlie a vapor redirection structure without being mechanically connected to or supported by the vapor redirection structure. FIG. 25A is an exploded perspective view of a TPIC system which includes a vapor redirection structure 2540 which is configured to overlie a HGC 2502 without mechanically supporting the underlying HGC 2502. The vapor redirection structure 2540 includes an upper section 2546 of the vapor redirection structure 2540 and a plurality of walls 2542 extending downward from the upper section 2546. An open side or section of the vapor redirection structure 2540 may provide a vapor outlet 2544. In other embodiments, a shorter sidewall or sidewall section may be used to provide a vapor outlet, instead of omitting a sidewall altogether. In some embodiments, the vapor redirection structure 2540 is not configured to be mechanically affixed to the underlying HGC 2502, although contact between the two may nevertheless occur, depending on the size and position of the HGC 2502.

In the illustrated embodiment, the vapor redirection structure 2540 has a rectangular cross section defined by walls 2542. In some embodiments, at least some of the walls 2542 can be at least partially immersed in a bath of liquid to provide a fluid seal along those walls. In some embodiments, the upper section 2546 of the vapor redirection structure 2540 may not be brought into contact with the liquid and the vapor may exit the vapor redirection structure at a level above the level of the liquid, while in other embodiments, even the upper section 2546 of the vapor redirection structure 2540 may be brought into contact with the liquid and the vapor may exit the vapor redirection structure 2540 at a level below the level of the working fluid.

FIG. 25B shows the vapor redirection structure of FIG. 25A in its operating position. Magnets 2548, which in the illustrated embodiment are located in or adjacent the upper section 2546 of the vapor redirection structure 2540, can be used to provide a non-permanent connection to retain the vapor redirection structure 2540 in place during operation. At least some portions of the sidewalls 2542 may be immersed within the working fluid to form a liquid seal on the sides of the vapor redirection structure other than the vapor outlet 2544. The sidewalls 2542, with the help of the liquid seal, can prevent the vapor generated by the underlying HGC 2502 from escaping into the overlying secondary chamber 2570, instead laterally redirecting most or all of the vapor into the condensing chamber 2520.

Figure 25C:
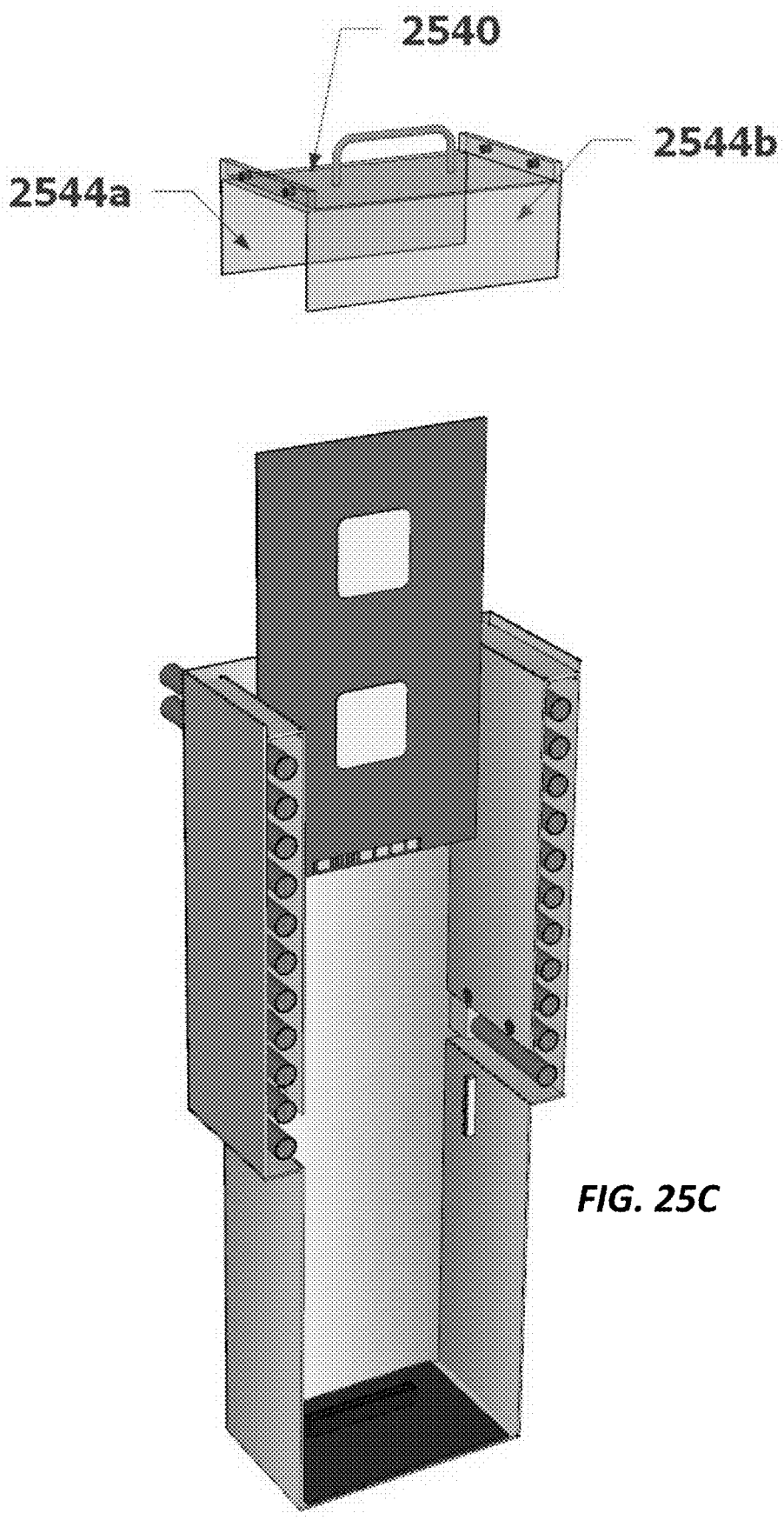
FIG. 25C shows another embodiment of a vapor redirection structure which includes multiple vapor outlets.

FIG. 25C shows another embodiment of a vapor redirection structure which includes multiple vapor outlets. The vapor redirection structure 2540 of FIG. 25C is similar in structure to the vapor redirection structure 2540 of FIGS. 25A and 25B but includes two missing sidewalls on opposite sides of the vapor redirection structure 2540, forming first and second vapor outlets 2544a and 2544b. The vapor redirection structure 2540' 2540 can be used, for example, in conjunction with a TPIC vessel which includes two condensing chambers on opposite sides of one another. In other embodiments, a similar structure can be used as a bridge between two vapor redirection structures, or a vapor redirection structure and a condensing chamber, forming part of a vapor path which laterally displaces vapor from an underlying HGC as well as vapor from an adjacent vapor redirection structure.

In other embodiments, the vapor redirection structure need not be a structure which redirects vapor on its own, but can instead include one or more components which can interact with the walls of the TPIC tank or other components to define a vapor redirection structure. For example, in some embodiments, an overlying vapor redirection structure can be permanently or semi-permanently attached to a wall of a TPIC vessel. For example, a vapor redirection structure can be hingedly attached at one end to a wall of the TPIC vessel, or to a wall dividing a condensing chamber from a secondary chamber. The structure may be moved between an operating position in which the vapor redirection structure laterally redirects vapor generated adjacent an underlying HGC, and a second position in which access is provided to access or install an underlying HGC, such as by flipping the structure upwards. Once the HGC or HGCs are in place, the structure may be flipped down to the operating position. Magnets, latches, or any other suitable temporary retaining structure may be provided at another portion of the vapor redirection structure away from the hinged edge, such as along the opposite edge from the hinged edge, to provide further securement when the vapor redirection structure is in the operating position.

In some embodiments, the vapor redirection structure can be a vapor redirection structure of the type discussed elsewhere herein, such as the vapor redirection structures of FIGS. 25A-25C. In some embodiments, the vapor redirection structure need not include downwardly extending components or aspects, and can include only a generally planar section. In other embodiments, any appropriate shape may be used as a hingedly attached vapor redirection structure.

In some embodiments, a flexible material and/or a hinged structure can be used to form part of a seal or vapor containment path between the immersion module and a portion of the condensing chamber. For example, as shown in FIG. 26A, a section 2620 of a flexible material may be attached to a vapor redirection structure 2640 in a manner which allows the flexible section 2620 to flex in the direction of the vapor path between the HGC (not shown) and the condensing chamber (not shown). The vapor redirection structure 2640 is similar in structure to the vapor redirection structure 2540 of FIGS. 25A and 25B, but differs in that a flexible section 2620 is secured to a portion of the vapor redirection structure 2640 above the vapor outlet 2644 of the vapor redirection structure 2640.

In some embodiments, the flexible section 2620 may be a thin strip of an appropriate material, such as a flexible polymer or elastomer. In some embodiments, the strip can include a material which provides some resistance against the permeation of vaporized working fluid.

Figure 26B:
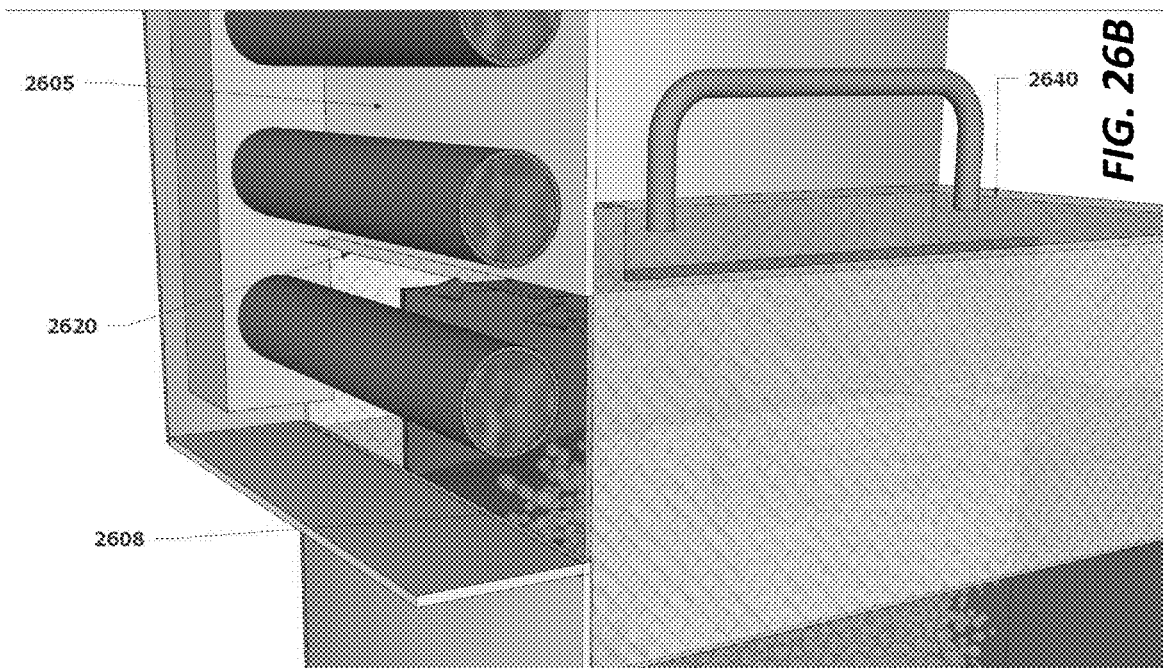
FIG. 26B shows the vapor redirection structure of FIG. 26A during operation, with the flexible section displaced.
Figure 26A:
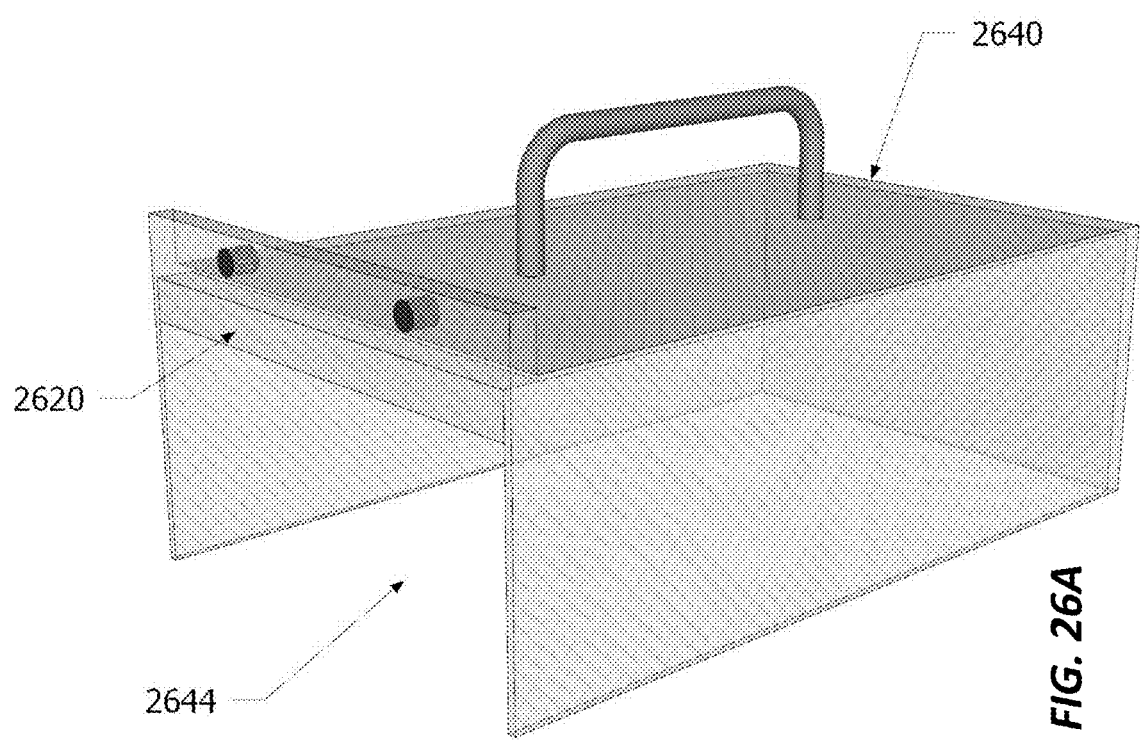
FIG. 26A is a perspective view of a vapor redirection structure including a strip of flexible material.

FIG. 26B shows the vapor redirection structure of FIG. 26A during operation, with the flexible section displaced. As can be seen in FIG. 26A, the flexible section 2620 is pushed away from the vapor redirection structure 2640. If there is any open space between the vapor redirection structure 2640 and the condensing chamber 2605, the flexible material can shield this open space, preventing or minimizing vapor flow through the open space 2604 and directing all or most of the vapor 2608 into the condensing chamber 2605.

While the illustrated embodiment depicts a flexible section 2620, similar utility may be provided by a hinged section of rigid material. The use of a hinged and/or flexible section can allow for an effective seal during operation even when a tight seal is not provided between the vapor redirection structure 2640 and the condensing chamber 2605. In some embodiments, the vapor pressure and/or vapor flow can displace the flexible or hinged section outward during operation of the HGC, providing an effective seal or enhancing an existing seal during operation of the HGC. In some embodiments, the hinged or flexible section need not contact the walls of the condensing chamber to provide a vapor path which prevents or inhibits leakage of vapor between the vapor redirection structure and the condensing chamber. For example, if the end of the hinged or flexible section extends laterally underneath the wall of the condensing chamber, the vapor will flow along the hinged or flexible system and upwards into the condensing chamber, even if there is space between the wall of the condensing chamber and the outwardly displaced hinged or flexible section.

Figure 13A:
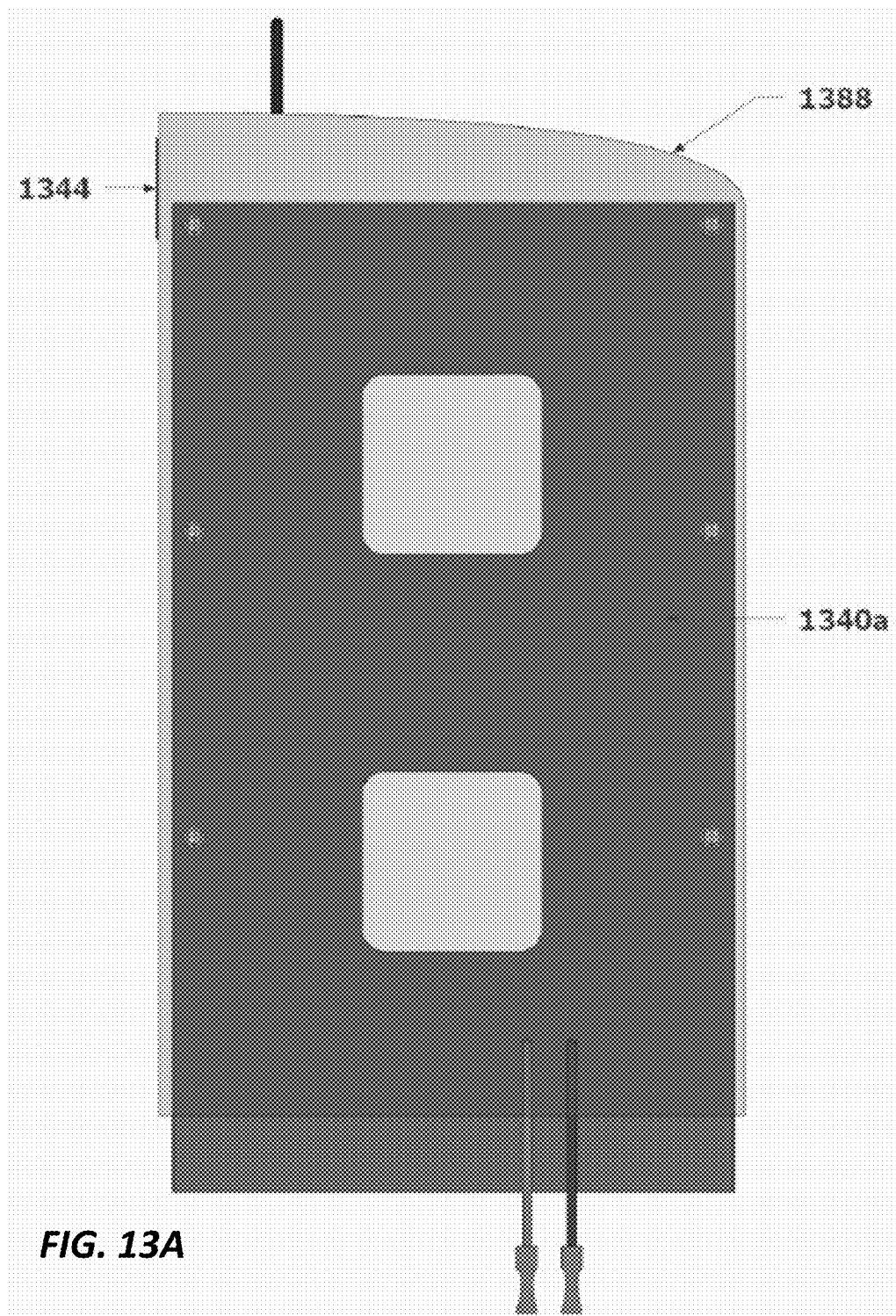
FIG. 13A is a side cross-sectional view of an immersion module with a curved upper surface.

In some embodiments, the upper surface of the closed vapor redirection structure or immersion module may be shaped to direct vaporized working fluid towards the vapor outlet. FIG. 13A is a side cross-sectional view of an immersion module with a curved upper surface. The immersion module 1340a includes a curved upper surface 1388 which increases in height from the side opposite the vapor outlet 1344 to the side of the vapor outlet 1344. In other embodiments, other shapes may be possible, but a configuration in which the height continually increases across the length of the upper surface of the immersion module 1340a can prevent pockets of stagnant vapor from collecting at the top of the immersion module 1340a.

Figure 13B:
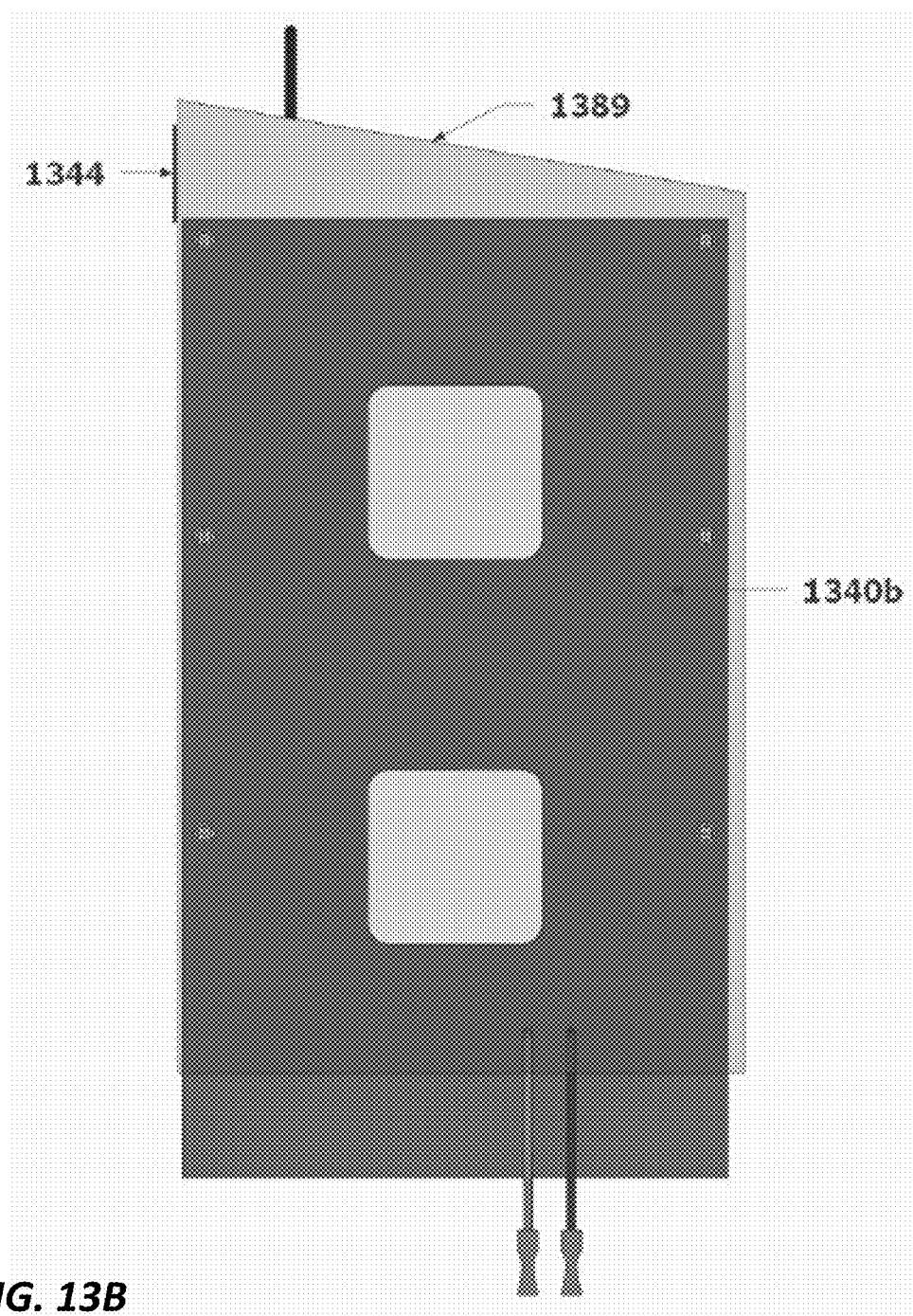
FIG. 13B is a side cross-sectional view of an immersion module with an angled upper surface.

In other embodiments, the upper surface may be generally planar. FIG. 13B is a side cross-sectional view of an immersion module with an angled upper surface. The immersion module 1340b includes a planar upper surface 1389 which increases in height from the side opposite the vapor outlet 1344 to the side of the vapor outlet 1344.

In other embodiments, any other suitable shape may be used, including any suitable combination of planar and curved surfaces. While a shaped upper surface may provide the benefits discussed above, other embodiments of vapor redirection structures and immersion modules may include generally horizontal upper surfaces. The underside of an upper surface that is horizontal on top can be contoured to provide an upper surface of an immersion module having a desired shape.

Figure 27:
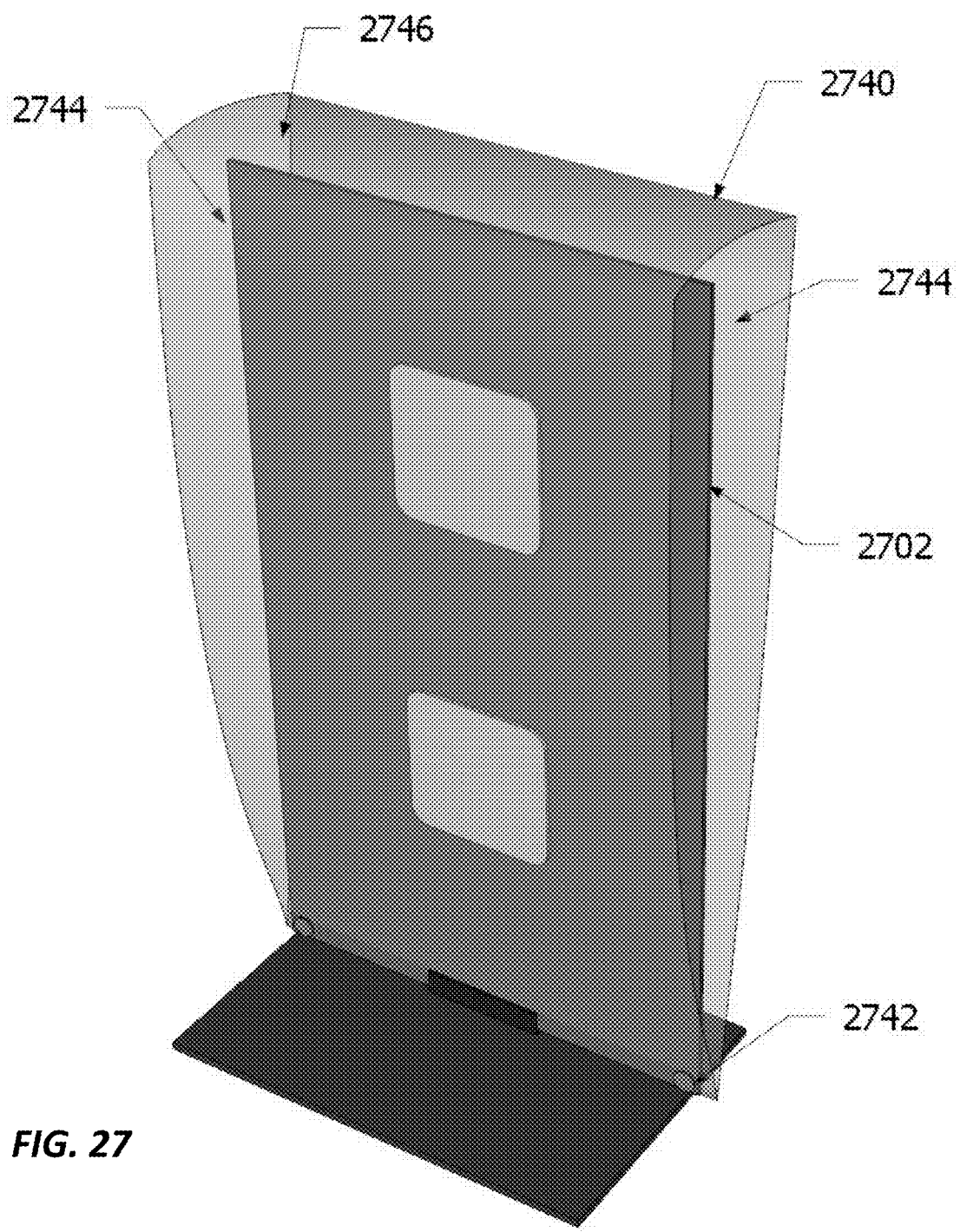
FIG. 27 is a perspective view of a vapor redirection structure using flexible material.

In some embodiments, a flexible material may be used as a vapor redirection structure, or as part of a vapor redirection structure. FIG. 27 illustrates the use of a flexible material as a vapor redirection structure. The vapor redirection structure 2740 is formed by folding a flexible material over the top of the HGC 2702. In the illustrated embodiment, the base of the vapor redirection structure is secured to the HGC 2702 or a supporting component by fasteners 2742 or any other suitable securement method at or near the base of the HGC 2702. In such an embodiment, all or most of the vapor generated during operation of the HGC will be generated within the space defined by the vapor redirection structure 2740. In other embodiments, the vapor redirection structure need not be secured directly to the HGC 2702, but may instead be secured to other components of the TPIC system.

In the illustrated embodiment, the vapor redirection structure 2740 forms vapor outlets 2744 on either side of the vapor redirection structure 2740. In other embodiments, one of the sides may be sealed via a fastener, adhesive, or other method to constrain the vapor outlet to one side of the vapor redirection structure. In some embodiments, an asymmetrical strip of material or an asymmetrical fastener arrangement can be used to cant the upper region 2746 of the vapor redirection structure 2740 to one side, so that the buoyant vapor will be biased to exit through the raised side of the upper region 2746 of the vapor redirection structure 2740.

In some embodiments, the upper region 2746 may be defined only by the natural flexure of the material, while in other embodiments, a comparatively rigid section may be used to provide further control and definition over the shape of the upper region 2746 and/or the vapor redirection structure 2740 as a whole. In some embodiments, wires or other structural components may be included to provide additional structural integrity, such as one or more wires sandwiched between or adhered to polymer sheets.

Any suitable material can be used to form the vapor redirection structure 2740. In some embodiments, the vapor redirection structure may include a flexible polymeric or elastomeric material, a combination of the two, or any other suitable material. In some implementations, some or all of the vapor redirection structure 2740 may be formed from a transparent or translucent material to allow TPIC system operators to visually inspect The flexible material forming vapor redirection structure 2740 need not be completely impervious to working fluid vapor. Because the vapor has at least one outlet 2744, the vapor may follow the path of least resistance out of the outlet 2744, and will not continue to push against and ultimately permeate the vapor redirection structure 2740. Commonly available polymer sheeting such as LDPE and PVC may provide more than enough resistance to create an effective vapor redirection structure 2740.

A flexible vapor redirection structure may provide a low-cost vapor redirection structure which does not require machining, molding, die casting, or another complex manufacturing or assembly process.

In some embodiments, the flexible material can include tabs extending from or cut out from the upper section 2746, which can provide a seal or define a fluid path between the vapor redirection structure 2740 and an adjacent condensing chamber (not shown). As discussed above, these flexible structures may be pushed outward and/or upward by vapor flow, and may act to confine or otherwise constrain the vapor flow.

In some embodiments, multiple flexible sheets can be used to collectively act as a vapor redirection structure. A flexible material can be used a secondary redirector to direct vapor generated at a lower portion of a HGC outward and away from upper portions of the HGC, to facilitate heat transfer away from the upper portions of the HGC to the working fluid. For example, in an embodiment in which a HGC is vertically tall, or includes multiple heat-generating regions or components arranged vertically, an additional flexible material can be secured at a location along the HGC or between the two heat-generating regions or components.

In some embodiments, the additional flexible material can be folded over the top of the HGC and form an interior vapor redirection structure, which can direct vapor generated adjacent the lower portions of the HGC away from the upper portions of the HGC as the vapor rises, either by itself or in conjunction with an overlying outer vapor redirection structure. In some embodiments, the additional flexible material can be attached at only one side, and float freely along the other edge. By directing vapor away from upper portions of the HGC, the vapor may be prevented from interfering with boiling occurring adjacent the upper portions of the HGC.

Other variations of vapor redirection structures can be formed using flexible materials. In other embodiments, a single sheet of flexible material may be attached to the HGC at multiple locations, to form multiple vapor outlets at different heights along the HGC. In other embodiments, a vapor redirection structure formed from a flexible material can be used in conjunction with other vapor redirection structures or immersion modules described herein.

Figure 14:
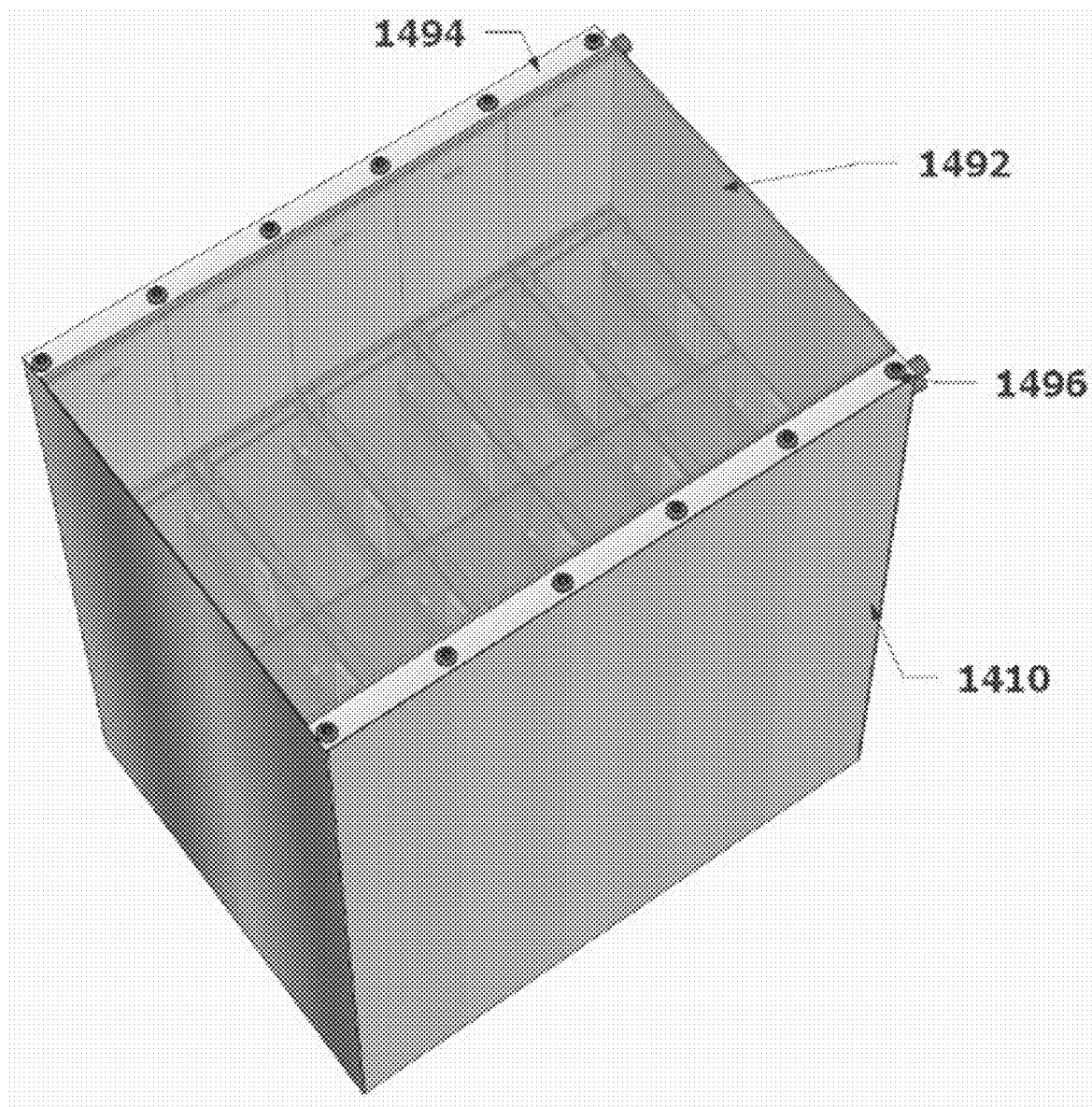
FIG. 14 is a perspective view of a TPIC tank which includes multiple lids, including at least one lid configured to allow access to the electronic components.

FIG. 14 is a perspective view of a TPIC container which includes multiple lids, including at least one lid configured to allow access to the electronic components. The TPIC container 1410 includes a first lid 1492 which can be positioned over the basin of working fluid to allow easy access to the electronic components positioned therein, along with any immersion modules disposed within the container 1410. The first lid 1492 may in some embodiments be formed from a transparent or partially transparent material, but can in other embodiments be formed from an opaque or nontransparent material. The first lid 1492 may be releasably secured along one or more edges to allow the lid 1492 to be opened, such as through the use of latches or any other suitable mechanism. In some embodiments, the first lid 1492 may be secured at one end via a hinge, such that the lid 1492 may be rotated to an open position to allow access, while in other embodiments, the lid 1492 may be completely removed.

The TPIC container 1410 may also include a second lid 1494 which allows access to the condenser coils and other TPIC system components that may not require frequent maintenance. Because the need to access such components may be less frequent than the need to access the submerged electronic components, the second lid 1494 may be more securely sealed, such as through the use of screws 1496, bolts or similar more secure fasteners. In some embodiments, the second lid 1494 may be larger than the first lid 1494, and the first lid 1494 may cover an opening within the second lid 1494.

In other embodiments, the second lid and the first lid may be adjacent to one another, and may not overlap. In other embodiments, a plurality of first lids may be used to cover open sections of a single larger, second lid or to cover open sections of a multitude of second lids.

By using smaller first lids, the cross section of the secondary chamber exposed to the ambient environment while the lid is open is reduced. A smaller exposed cross section not only restricts the area through which vapor diffusion can occur, it also restricts the area through which cross drafts can "dip" into the secondary chamber and displace some vapor in the process.

Although a liquid fluid seal is generally a highly effective way to seal the interior of a TPIC system from boiled vapor, it may increase the amount of evaporated vapor in the system because the surface of the liquid fluid used to create the seal is now exposed to the vessel's interior. In some embodiments, other structures may be used to limit exposure of the fluid to the ambient environment, both during operation of the TPIC system and when the tank is opened and exposed to the ambient environment.

Figure 28:
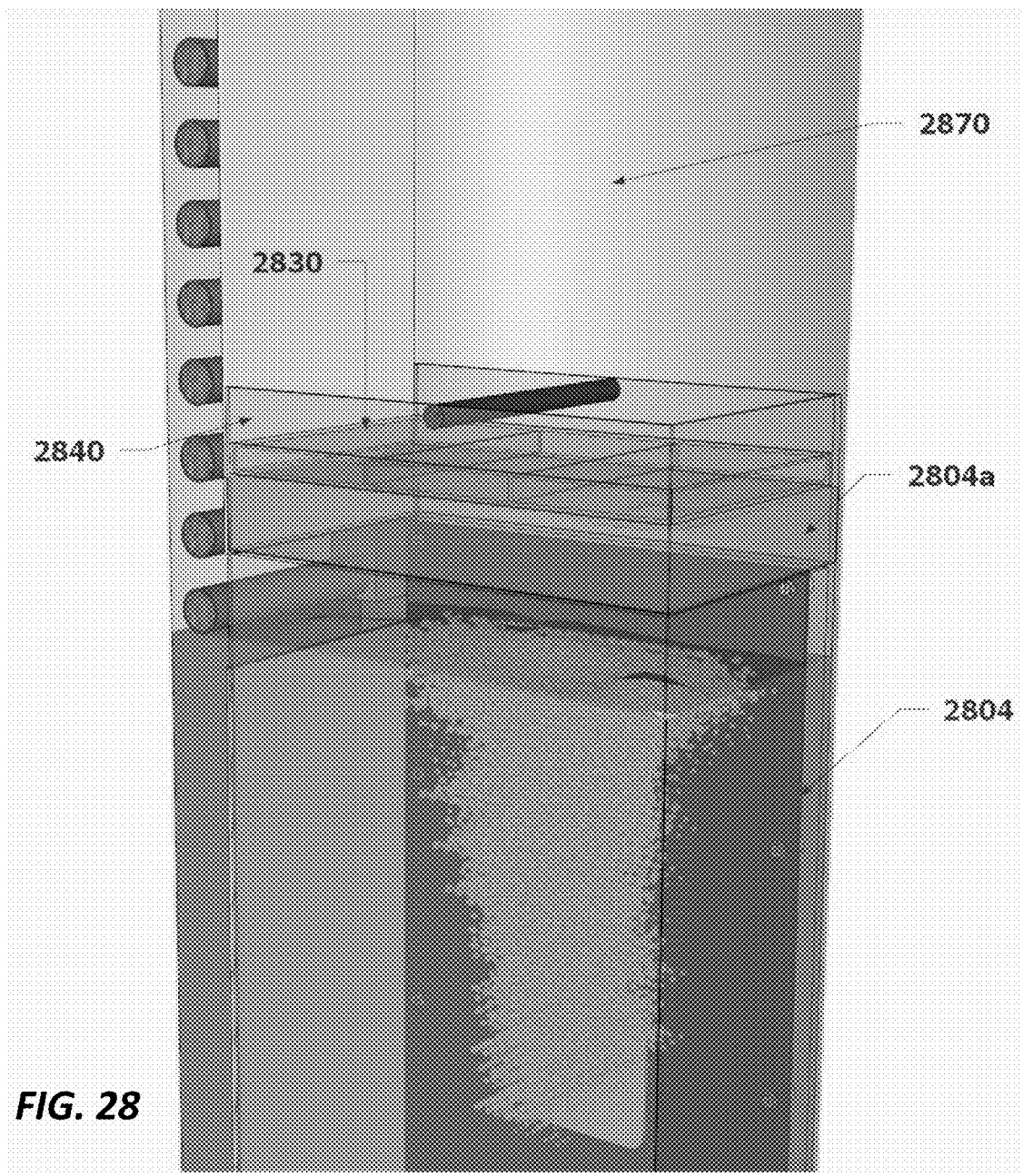
FIG. 28 is a perspective view of a TPIC system which utilizes a floating structure to inhibit evaporation of working fluid overlying an immersed vapor redirection structure.

FIG. 28 is a perspective view of a TPIC system which utilizes a floating structure to inhibit evaporation of working fluid overlying an immersed vapor redirection structure. The TPIC system includes a vapor redirection structure 2840 which is at least partially immersed in the working fluid 2804, such that a portion 2804a of the working fluid 2804 overlies portions of the vapor redirection structure 2840 and is exposed to the interior of the secondary chamber 2870. While the vapor redirection structure 2840 may be effective to prevent or inhibit flow of the underlying vapor into the secondary chamber 2870, the overlying working fluid 2804a may evaporate into the secondary chamber, wherein it may be vulnerable to loss mechanisms such as displacement or drag-out loss.

To reduce this evaporation, a float 2830 is disposed in the area overlying the vapor redirection structure 2840. The float 2830 reduces the exposed surface area of the overlying portion 2804a of the working fluid 2804, reducing the rate of evaporation into the secondary chamber 2870.

The float 2830 may be at least partially hollow, or may be solid. A wide variety of materials can be used to form the float 2830. In particular, the working fluids used in many TPIC systems are relatively dense, and materials or structures that may not float on liquids such as water may nevertheless float on the overlying portion 2804a of working fluid 2804.

In the illustrated embodiment, the float 2830 covers a substantial portion of an underlying vapor redirection structure 2840. In other embodiments, however, multiple floats may be used to cover a single immersion module or other vapor redirection structure, or a float may cover portions of multiple immersion modules or other vapor redirection structures. Floats can be used to cover any exposed fluid in a TPIC system, including fluid which does not overly a vapor redirection structure or a HGC.

In some embodiments, a float may be tethered or otherwise constrained relative to an underlying vapor redirection structure. Tethering a float to an underlying structure or structures can ensure that the liquid sealing each structure is covered by a float. A tether can allow the float to move vertically, so that the float remains in contact with the surface of the fluid during changes in the fluid level. As an alternative, a float retainer such as a sidewall, or similar upwardly extending structure can be used to constrain lateral movement while providing vertical movement freedom. A guide post or a plurality of guide posts can extend through or adjacent a float to allow vertical movement while constraining lateral movement. A wide variety of other structures can also be used to allow some vertical movement while constraining lateral movement of the float.

Evaporation of working fluid 2804a may still occur around the perimeter of a float 2830. For this reason, even with the use of a float 2830 or a set of floats, a condenser placed in the secondary chamber 2870 may provide additional control over the total amount of vapor that accumulates in the secondary chamber 2870. The use of a condenser within the secondary chamber 2870 is discussed in greater detail below.

Another way to reduce the evaporated vapor in the secondary chamber is to subcool the liquid providing the liquid seal for the modules. Although the TPIC system may be designed so that the overlying liquid 2804a will not boil under typical operating conditions, it may heat up to near-boiling temperatures, increasing the rate of evaporation. Cooling the overlying liquid 2804a to lower temperatures can reduce the rate of evaporation from uncovered areas of overlying liquid 2804a.

In some embodiments, a single heat exchanger can serve as both a condenser and a sub cooler in the secondary chamber. In some embodiments, integrating a heat exchanger into one or more of the walls that define the secondary chamber may represent a convenient way to condense and subcool the fluid in the secondary chamber.

As an alternative, or in conjunction with a float, a buoyant liquid less dense than the working fluid can cover some or all the surface of the working fluid, inhibiting or preventing exposure and evaporation of the working fluid. A liquid with a density lower than that of the liquid working fluid may be poured into the secondary chamber to prevent the working fluid liquid from evaporating. Like the aforementioned solid float, a buoyant liquid prevents or inhibits evaporation by covering the exposed surface area of the working fluid liquid.

Because the surface of the buoyant liquid may be exposed to the interior of the secondary chamber, the buoyant liquid itself may be subject to evaporation. In some embodiments, the buoyant liquid may be chosen to have a low vapor pressure. Furthermore, in some embodiments a buoyant liquid may be chosen that is inexpensive relative to the working fluid liquid, so that evaporation and possible loss of the buoyant liquid may not be as costly as evaporation and loss of the working fluid. Distilled and deionized water, mineral oil and other hydrocarbons represent a sample of the potentially suitable liquids that could be used.

Figure 15A:
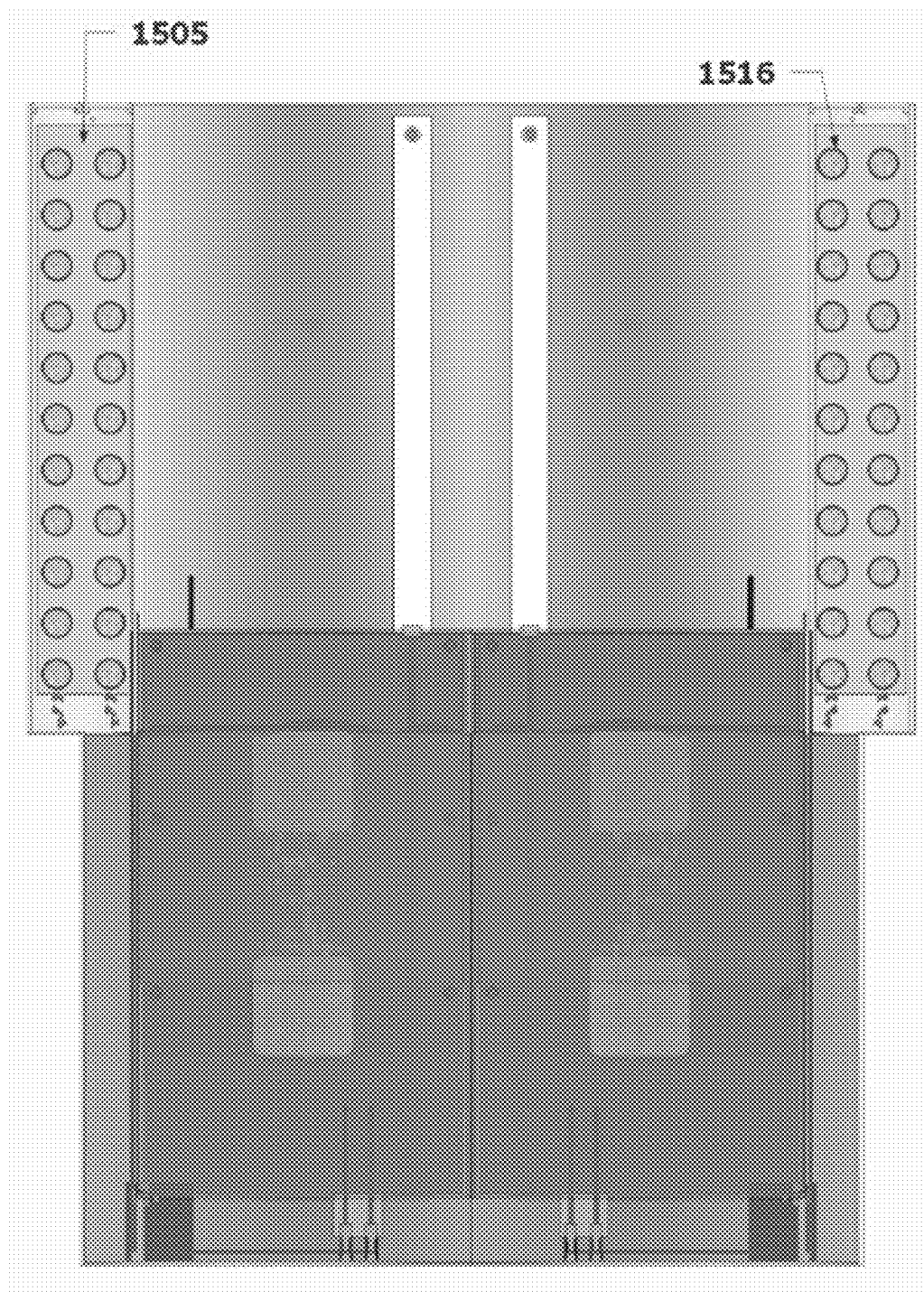
FIG. 15A is a cross sectional view of another embodiment of a TPIC tank, in which the condenser coils are located within a wider upper section of the TPIC tank.

FIG. 15A is a cross sectional view of another embodiment of a TPIC tank, in which the condenser coils are located within a wider upper section of the TPIC tank. The extra width can be used to accommodate a larger condensing chamber 1505. In this embodiment, the larger condensing chamber contains a condenser with an additional column of condensing tubes 1516. In other embodiments, instead of additional condensing tubes, larger tubes may be used. In other embodiments, condensers that feature flat tubes or tubes with fins or any other appropriate heat exchange medium may be used.

Figure 15B:
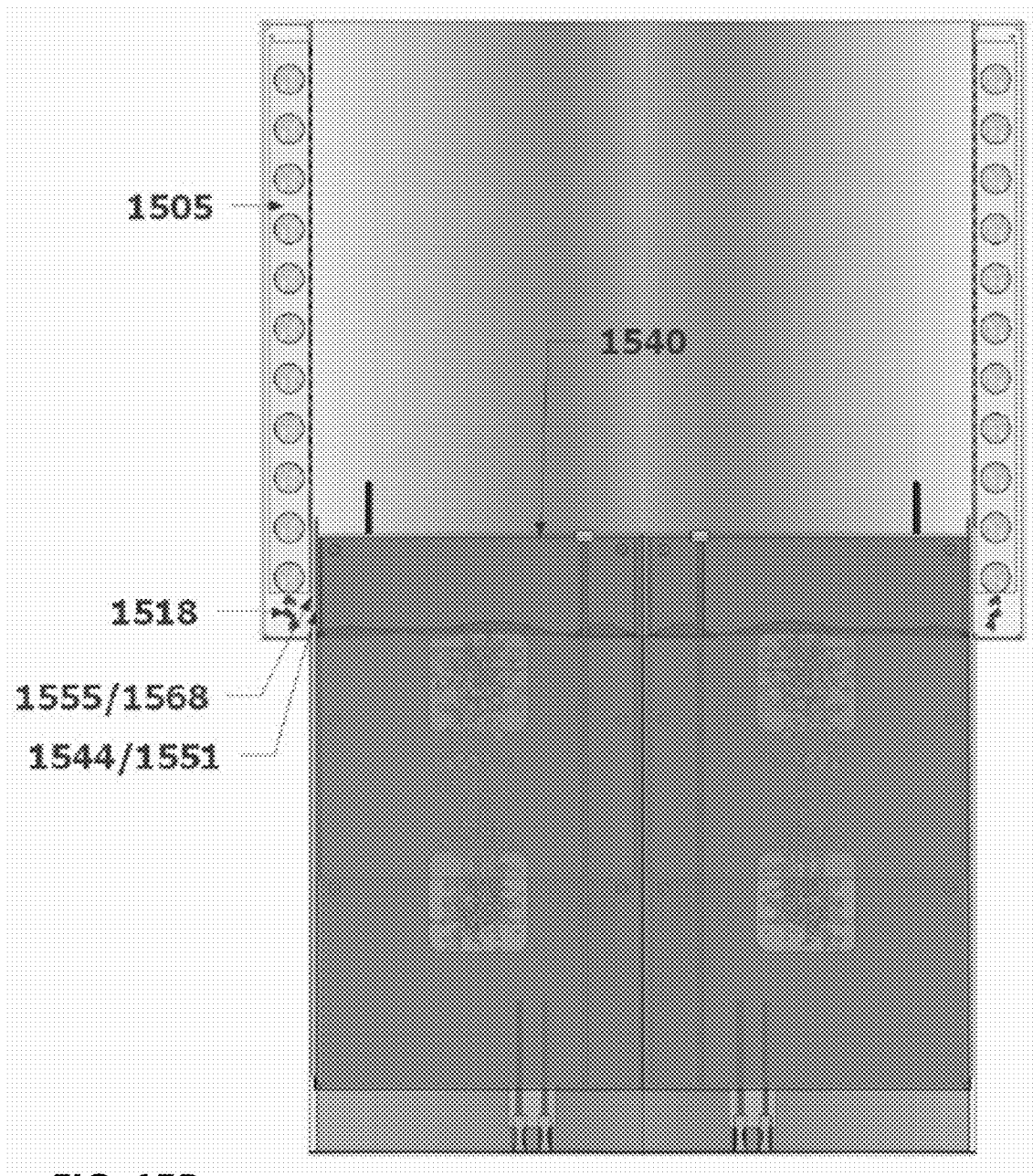
FIG. 15B is a cross sectional view of another embodiment of a TPIC tank, in which the upper section is wider than the lower section of the tank.

FIG. 15B is a cross sectional view of another embodiment of a TPIC tank featuring an upper section wider than the lower section of the tank. This embodiment is identical to the embodiment introduced in FIG. 8, except this embodiment does not have a condensate return column. As a result, the condensate 1518 from the condensing chamber 1505 returns directly to the immersion module 1540 through the only opening available for fluid communication with the module 1540. Therefore, the module vapor outlet 1544 and the module fluid inlet 1551 are indistinct, as are the chamber vapor inlet 1568 and the chamber fluid outlet 1555.

Figure 16:
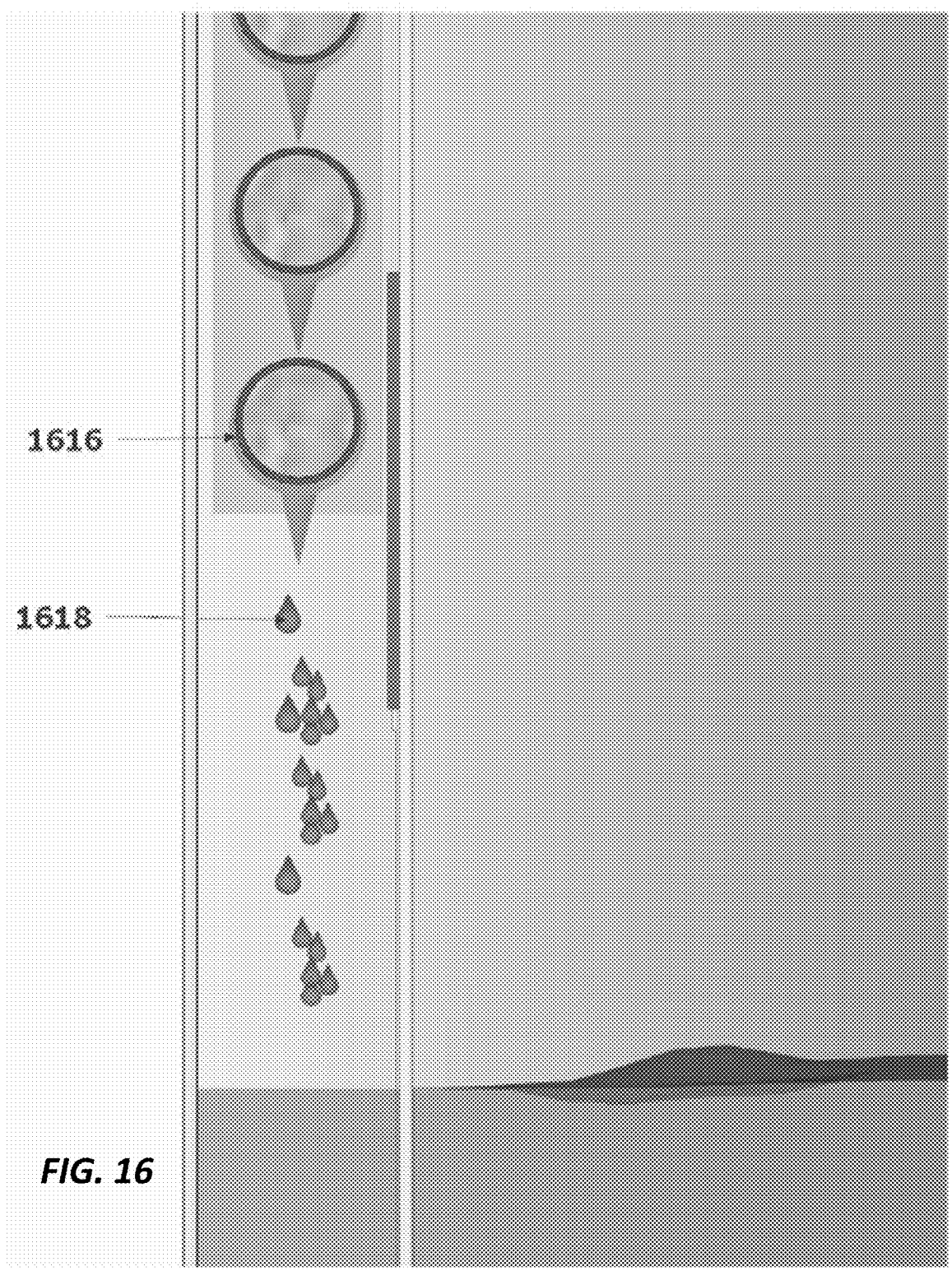
FIG. 16 is a detailed cross-sectional view of the condensing region of a TPIC apparatus designed to reduce fluid loss.

In some embodiments, TPIC systems may include features configured to increase the efficacy of the condenser coils. While described herein with respect to TPIC systems which also include immersion modules or other features for inhibiting working fluid loss, these features may also be included in any TPIC system, or any other system which utilizes condenser coils. FIG. 16 is a detailed cross-sectional view of the condenser region of a TPIC apparatus. In some embodiments, the condenser coils 1616 may be stacked vertically, such that a portion of an upper condenser coil directly overlies an underlying condenser coil. As vapor condenses on the coils, the condensed fluid 1618 will drip off of the coils. When the coils are generally circular or rounded in cross-section, the condensed fluid will tend to drip directly from the lowest point of the coils.

Figure 17A:
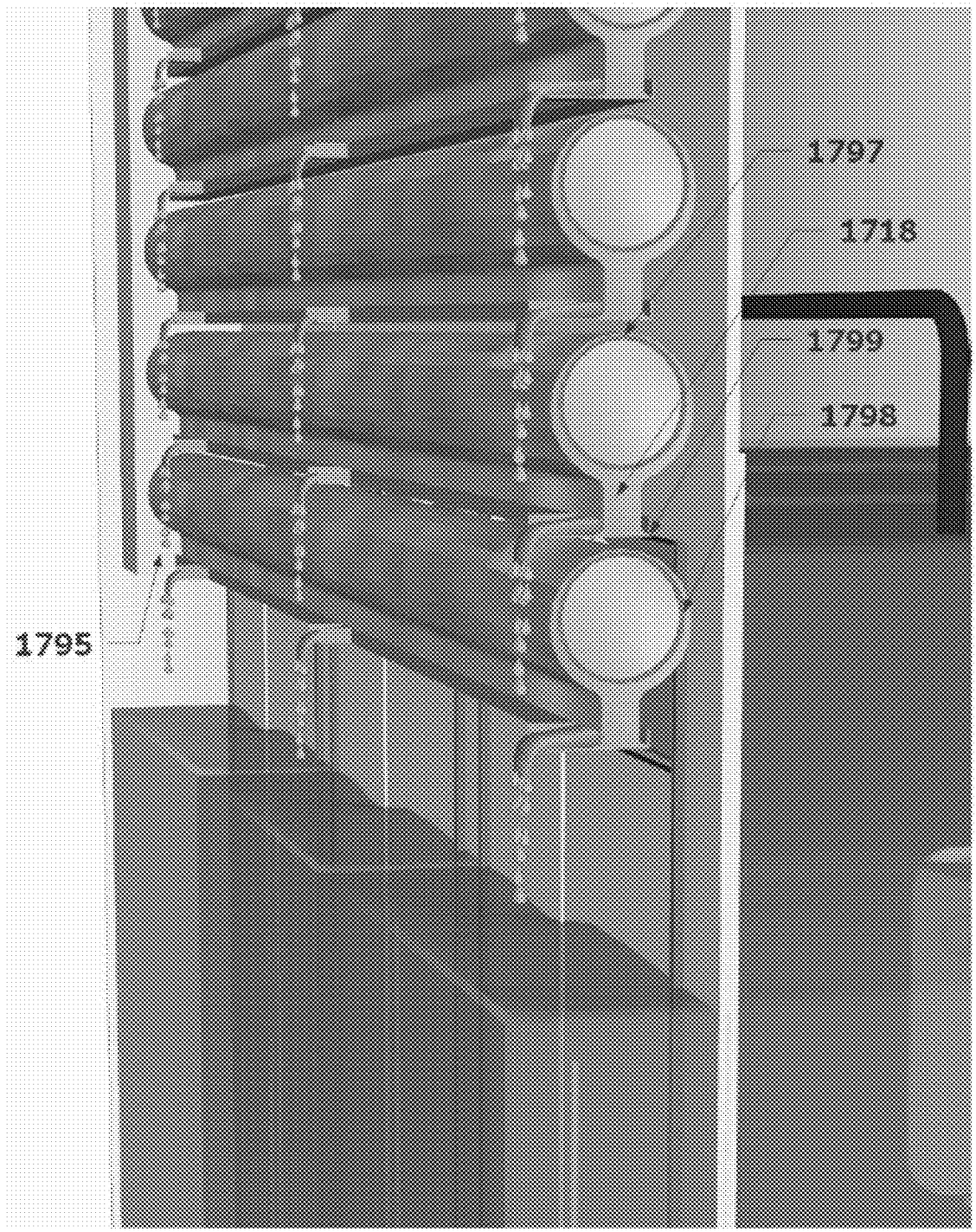
FIG. 17A is a cutaway perspective view of the condensing region of a TPIC apparatus which includes an inundation roof configured to capture and redirect condensation from an overlying condenser coil to improve the efficacy of an underlying condenser coil.

If the rate of condensation is too great, the coils can become inundated with fluid, reducing the efficacy of the coils as vaporized fluid cannot directly contact portions of the surface area of the individual tubes. As fluid drips downward onto the underlying tubes from overlying tubes, the fluid runoff can contribute to the inundation of the coil, and reduce the overall efficiency of the condenser. FIG. 17 is a cutaway perspective view of a condenser region of a TPIC apparatus which includes an inundation roof configured to capture and redirect condensation from an overlying condenser tube to improve the efficacy of an underlying condenser tube. The condenser 1795 includes an upper tube 1797 and a lower tube 1798. An inundation roof 1799 disposed between the upper tube 1797 and the lower tube 1798 collects condensed fluid 1718 and redirects it away from the lower tube 1798.

In this embodiment, the inundation roof 1799 has a "U" shaped cross sectional profile so that it can channel the fluid to an outlet 1793, where the fluid is allowed to fall down towards the working fluid pool 1704. By collecting the condensate 1718 and releasing it at a limited number of predefined points, the influence of the falling condensate on the surrounding vapor is reduced and as a result, the turbulence created by the falling condensate is reduced. To reduce turbulence even further, the outlets of the inundation roof can be positioned so that the falling condensate is released onto a nearby wall. Another way of reducing the turbulent effects of the falling condensate is to angle the inundation roof outlet downwards with respect to the horizontal and position it over a vertical tube that terminates below the working fluid pool.

Although the illustrated embodiment utilizes a "U" shaped or other channel like cross sectional profile, other embodiments may include a simple planar inundation roof which may be sufficient to prevent falling condensate from inundating lower tubes. Such a planar inundation roof may be generally horizontal or it may be angled in such a way to bias to the flow of the deflected condensate.

Figure 17B:
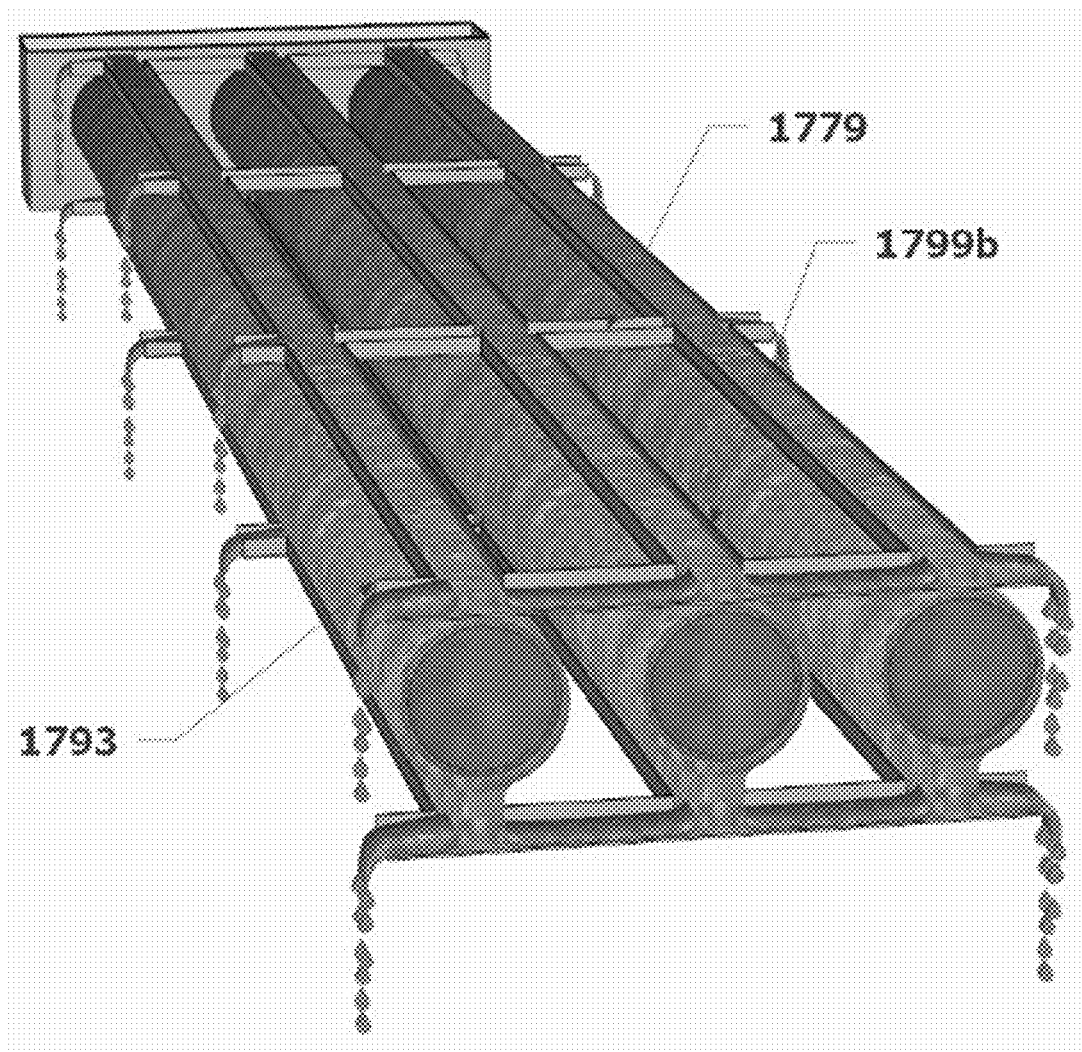
FIG. 17B is a cutaway perspective view of another embodiment of the inundation roof in which the roof over multiple condensing tubes are connected together and share condensate outlets.

FIG. 17B is a cutaway perspective view of another embodiment of the inundation roof in which the sections of the inundation roof extending over multiple condensing tubes are connected together and share condensate outlets. In this embodiment, the inundation roof 1799b for a row of tubes is created by joining several inundation roofs, similar to those of FIG. 17A, by way of bridge channels 1779.

Figure 18:
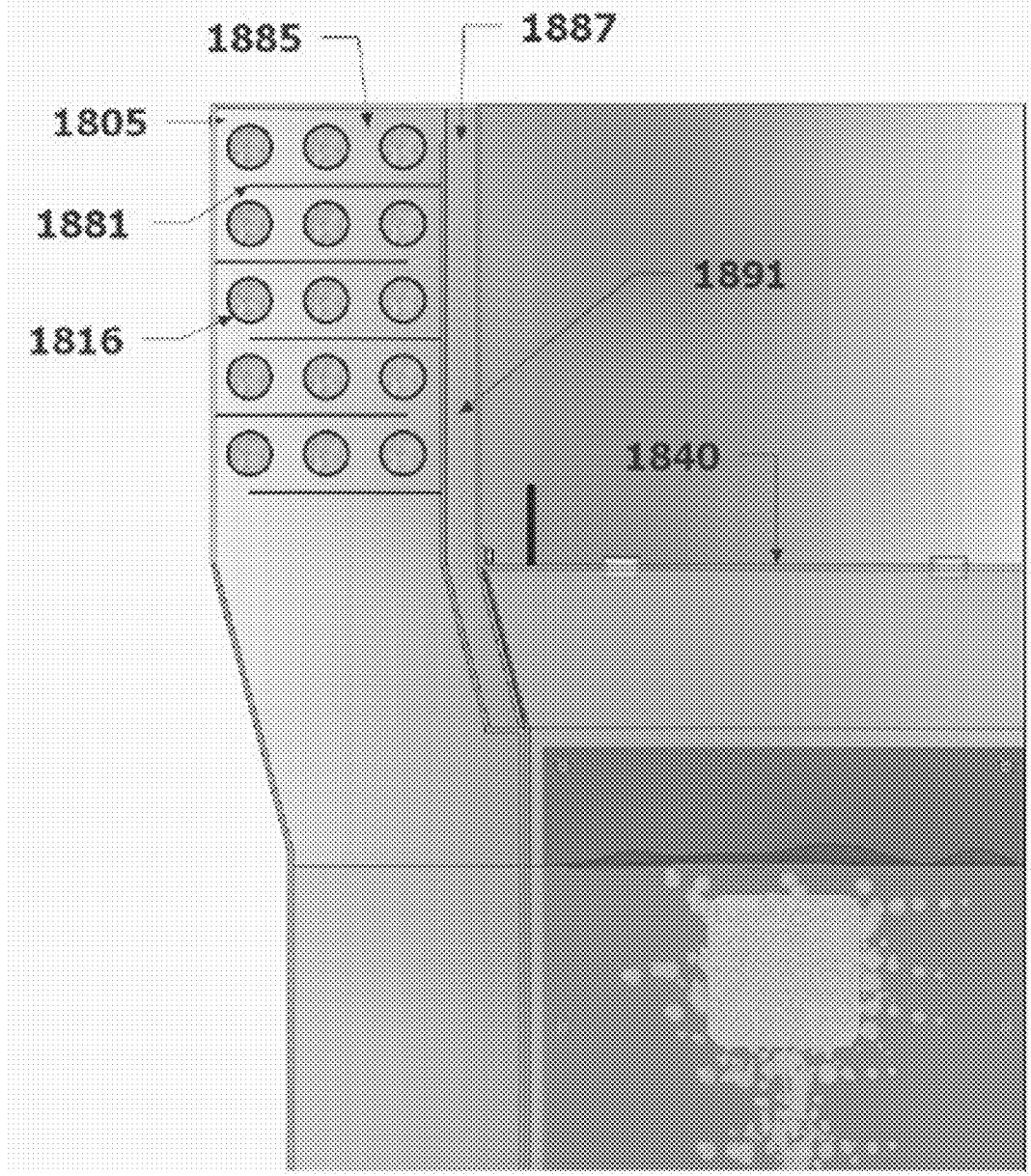
FIG. 18 is a side-cross section of another embodiment of a TPIC apparatus in which the vaporized working fluid is routed upwards before flowing downward over the condenser coils.

FIG. 18 is a side-cross section of another embodiment of a TPIC apparatus in which the vaporized working fluid is routed upwards inside the condensing chamber 1805 before flowing downward over the condenser coils. A partition within the condensing chamber 1805 creates a vapor channel 1891 in which the vapor from the immersion module 1840 flows upward before flowing out of the vapor channel outlet 1887 and coming into contact with the condensing tubes 1816. In this embodiment, the vapor channel outlet 1887 is positioned in line with the top row of the condensing tubes 1816. In other embodiments, the vapor channel outlet may be positioned at a lower point within the condensing chamber.

In this embodiment, transversal baffles 1881 have been added to the interior of the main section 1885 to increase the velocity of the vapor flowing over the condensing tubes 1816 and to increase the effective surface area of the condensing tubes 1816. In other embodiments, double segmental transversal baffles or doughnut and disc type baffles can be used. In other embodiments, the baffles may be omitted entirely.

By reducing the amount of vaporized working fluid in the region overlying the sealed immersion modules, displacement loss and diffusion loss of working fluid can be reduced.

In some embodiments, features can be included which minimize the amount of vaporized working fluid which flows from the condensing chamber to the secondary chamber. Because vaporized working fluid has a higher density than air, stratification of the vaporized working fluid and the air will occur with time, causing vaporized working fluid to settle near the bottom of a region which contains a mixture of air and vaporized working fluid.

In general gas velocity in the condensing chamber may be highest near the vapor inlet. As the vapor rises within the condensing chamber and becomes condensed into liquid, the amount of vapor, as well as the velocity of the vapor decreases. At the top of the condensing chamber, the composition of the gas may be primarily air and a relatively small amount of working fluid vapor.

During periods of equilibrium between boiling and condensing, the velocity of the vapor/air mixture near the top of the condensing chamber may be close to zero, even though the gas velocity at the vapor inlet may be high. During changes in power level, the velocity of vapor/air mixture at the top of the condensing chamber will be relatively low, but may not be zero. For example, during an increase in power, the vapor zone will grow within the condensing chamber and the air/vapor mixture will be forced out of the top of the condensing chamber and into a VCD, the secondary chamber or the atmosphere.

Figure 29A:
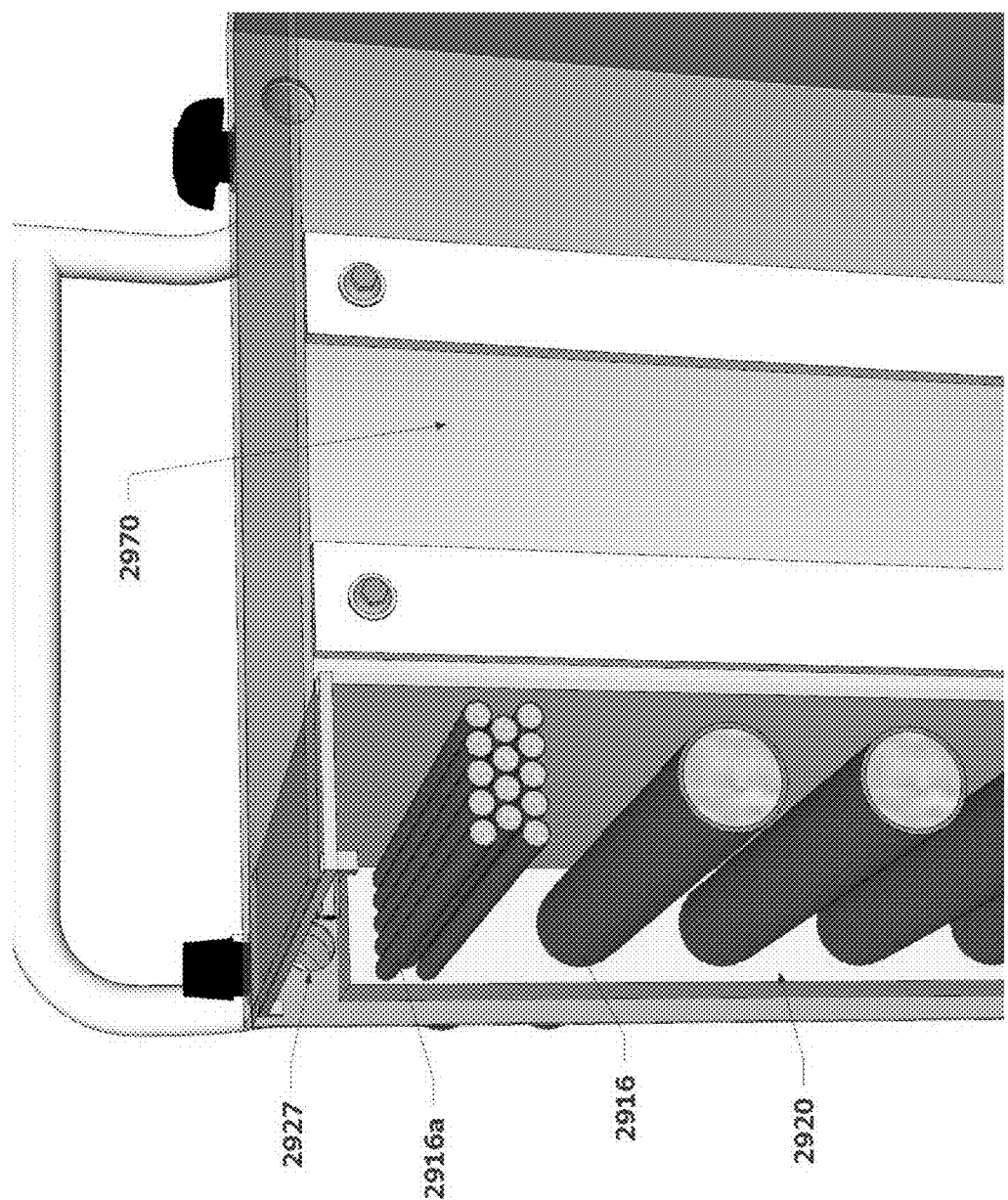
FIG. 29A is a perspective cross-sectional view of a TPIC system which includes a dense section of condenser components near the top of the condensing chamber.

In some embodiments, the condensing chamber may be designed to more effectively condense the working fluid vaper in the slower-moving, vapor-lean gas near the top of the condensing chamber. FIG. 29A is a perspective cross-sectional view of a TPIC system which includes a dense section of condenser components near the top of the condensing chamber. In the illustrated implementation, the dense section of condenser components serves as a filtering condenser section, and includes a plurality of thinner condenser tubes 2916a packed closely together, in contrast to the larger, vertically-spaced primary condenser tubes 2916 lower in the condensing chamber 2920.

Before the gas can reach the outlet from the condensing chamber 2920 to the secondary chamber 2970, which in the illustrated embodiment is a valve 2927, the gas must pass through the dense plurality of thinner condenser tubes 2916a. When the gas passes through this upper section, the small amounts of vapor in the air/vapor mixture at this height may be more effectively condensed.

In the illustrated embodiment, the plurality of closely bundled condenser tubes 2916a is integrated into the same manifold that distributes water or other cooling fluid to the primary condensing tubes 2916. In other embodiments, however, the filtering condenser section may be physically separate from the primary condenser. The filtering condenser need not be a dense bundle of thinner condenser tubes 2916a. Any apparatus or feature that may condense slow moving gas mixtures with low levels of vapor more effectively than can the primary condenser tubes 2916 may be used. For example, a row of flat condenser tubes with corrugated fins, such as those of an automotive radiator, may be used. In other embodiments, the upper section of the condensing chamber 2920 may be dimensioned or shaped to control the flow of gas through the section or increase the effective surface area of the condenser components in that section, increasing the efficacy of condenser tubes or other condenser components in that area. For example, the condensing chamber may narrow near the top of the condensing chamber 2920, or may include baffles or similar structures to control or redirect gas flow.

Figure 29B:
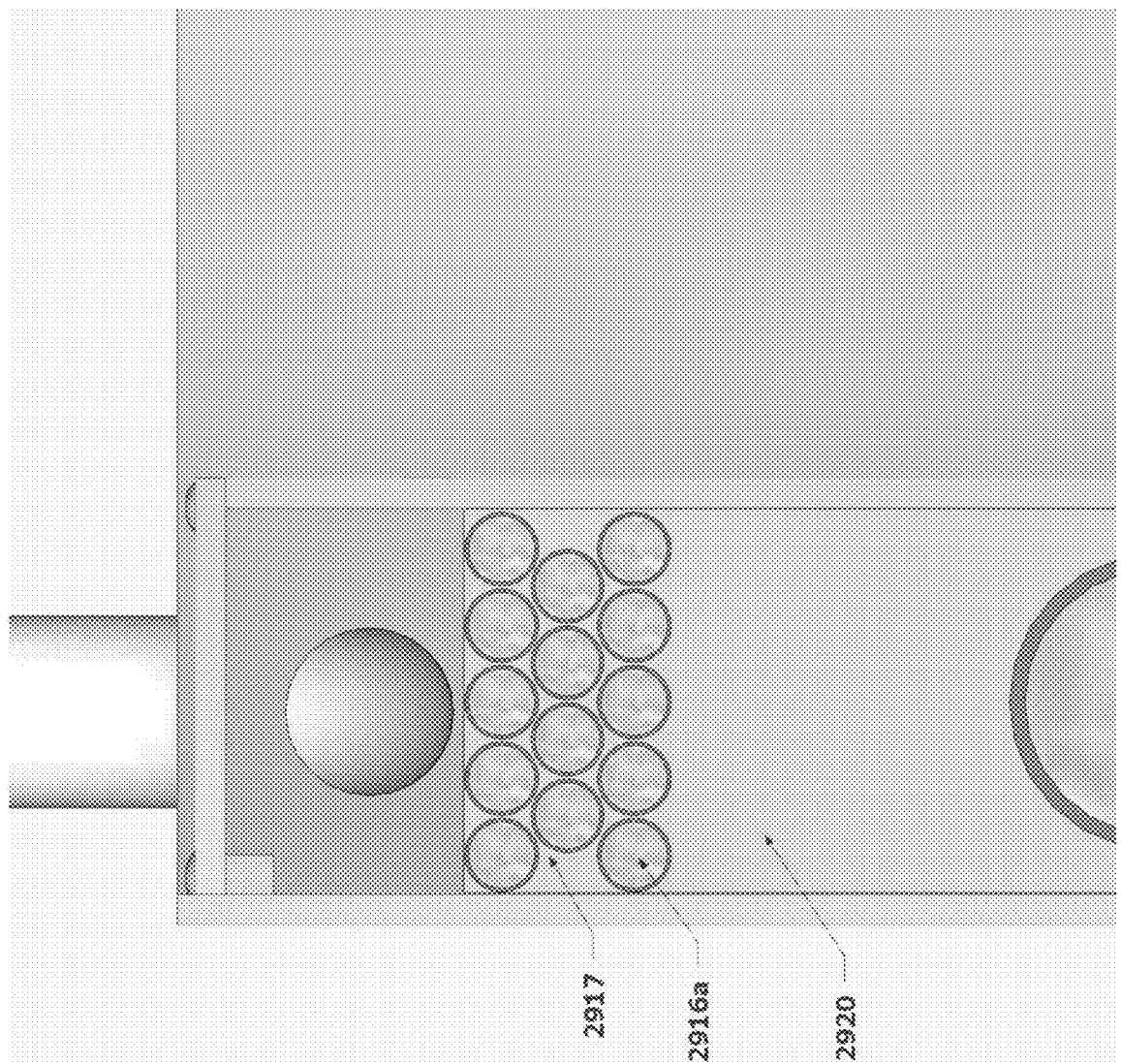
FIG. 29B is a cross-sectional view of the upper portion of the condensing chamber of the TPIC apparatus of FIG. 29A.

FIG. 29B is a cross-sectional view of the upper portion of the condensing chamber of the TPIC apparatus of FIG. 29A. As can be seen in FIG. 29A, the gas passageways 2917 of between the thinner condenser tubes 2916a of the filtering condenser section are narrow compared to the passages past the primary condenser tubes. As air/vapor mixture passes through the gas passageways 2917, the sparsely spaced molecules of vapor have an improved chance of condensing on a condensing surface.

Although the gas passageways 2917 of the filtering condenser section may appear to be highly restrictive to the gas in the condensing chamber 2920, in operation, they may not represent an additional or substantial point of resistance to the active gas in the TPIC system. Clogging of the gas passageways 2917 by liquid condensate may be minimal because of the low amount of vapor and resulting liquid condensate in the region. Furthermore, while the narrow gas passageways 2917 may be restrictive to a large mass flow rate, such as the mass flow rate of the vapor near the bottom of the condensing chamber 2920, they may not restrict the comparatively low mass flow rate of the air/vapor mixture in the upper region of the condensing chamber 2920.

Depending on the design of the TPIC system, minimizing the amount of vapor in air as it passes out of the condensing chamber 2920 and into the secondary chamber 2970 can have multiple effects on the design and/or operation of the system, as discussed in greater detail elsewhere. In a vented system, the amount of gas that must be vented during system startup can be significantly reduced, reducing the displacement loss of vaporized working fluid vented along with the gas. In a system with a volume or pressure compensation device, the size, cost, and operation of the volume compensation device can be reduced as there is less volume or pressure change for which to compensate.

Placing the condenser-side of a channel that provides fluid communication from the condensing chamber to the secondary chamber higher in the condensing chamber can reduce the vapor content of the gas flowing from the condensing chamber to the secondary chamber. However, the gas at a given height in the condensing chamber may contain more vapor than the gas at the same height in the secondary chamber. If the gas flows laterally from a point at a given height in the condensing chamber to a point at the same height in the secondary chamber, it may enrich the vapor content of the gas in the upper region of the secondary chamber. If the chamber is opened or vented before conditions allow the vapor to settle in the secondary chamber, vapor loss due to displacement and other mechanisms may increase.

FIG. 30A is a perspective cross-sectional view of a TPIC system which includes a partially vertical fluid communication channel between the condensing chamber and the secondary chamber. The inlet 3035 of the fluid channel 3031 on the condenser side is at a higher height than the outlet 3037 of the fluid channel 3031. By depositing the air/vapor mixture into the secondary chamber 3070 at the lower height of the outlet 3037 the relatively heavy vapor molecules may tend to stay at the height at which they were deposited or sink farther downwards.

During decreases of system power, the vapor zone in the condensing chamber will contract, creating a vacuum in the condensing chamber relative to the secondary chamber. Gas may be transferred from the secondary chamber to the condensing chamber to fill this vacuum. The total amount of gas required to equalize the pressures of the adjacent chambers depends on the amount of condensable gas, or vapor, in the gas mixture.

Vapor that is expelled into the top of the condensing chamber will eventually become condensed into liquid as it sinks within the condensing chamber. The volume eventually occupied by a vapor-rich gas mixture in the condensing chamber may be a mere fraction of the original total volume of gas introduced into the top of the condensing chamber.

By filling the vacuum in the condensing chamber with a vapor-lean gas mixture, the total amount of gas shifted into the condensing chamber may be minimized, as a vapor-lean gas mixture will undergo a smaller reduction in volume within the condensing chamber compared to a vapor-rich gas mixture. By minimizing the amount of gas shifted during periods of power change, overall turbulence in the system is minimized as is the mixing of vapor and air.

The same fluid communication channel 3031 may be used for the inter-chamber shifting of gas in both directions. However, such an arrangement may result in vapor-rich gas moving from the secondary chamber to the primary chamber during decreases in power level. In other embodiments, a separate communication channel can be used to transfer gas from the secondary chamber to the condensing chamber when system power decreases. By using separate channels for each direction of gas flow, it may be possible to minimize the amount of vapor in the upper regions of both chambers through cycles in power level.

The fluid communication channel 3031 having a height drop between the inlet 3035 and the outlet 3037 may be limited to one-way gas movement from the condensing chamber 3020 to the secondary chamber 3070 by using a check valve at some point along or adjacent the fluid communication channel 3031. For gas movement from the secondary chamber 3070 to the condensing chamber 3020, a separate opening which includes another check valve can be provided near the top of the divider between the condensing chamber 3020 and the secondary chamber 3070.

In other embodiments, a flap with an elastomeric seal placed over the outlet end of a communication channel may be used to provide one way gas flow. In other embodiments, a check valve or valve-like mechanism may be integrated into the channel itself. Any suitable mechanism to ensure one way gas flow may be used.

In certain embodiments of TPIC systems, the design of the condensing chamber may be particularly suited for a communications channel with a height differential between the inlet and the outlet. For example, in some embodiments, the condensing chamber may extend above the other parts of the TPIC system, including the top of the secondary chamber. FIG. 30B is a perspective cross-sectional view of a TPIC system with an extended condensing chamber. For such a system, the vapor zone may potentially rise above the level of the secondary chamber. In such a case, a simple perforation in the dividing wall near the top of the secondary chamber may result in vapor, rather than NCG, being expelled into the secondary chamber during periods of increasing system power, as the equilibrium vapor zone may extend past the top of the secondary chamber.

By using one or more communications channels with a height differential between the inlet and the outlet, vapor-lean gas may be allowed to shift between the two chambers with minimal mixing of air and vapor. When using two communication channels, a check valve or other device that ensures one way gas flow can be used for each channel. For an embodiment in which the condensing chamber extends above the top of the secondary chamber, a tube or similar structure within or adjacent the extended portion of the condensing chamber may extend the inlet of the fluid communication channel to a region of vapor-lean gas.

Figure 19:
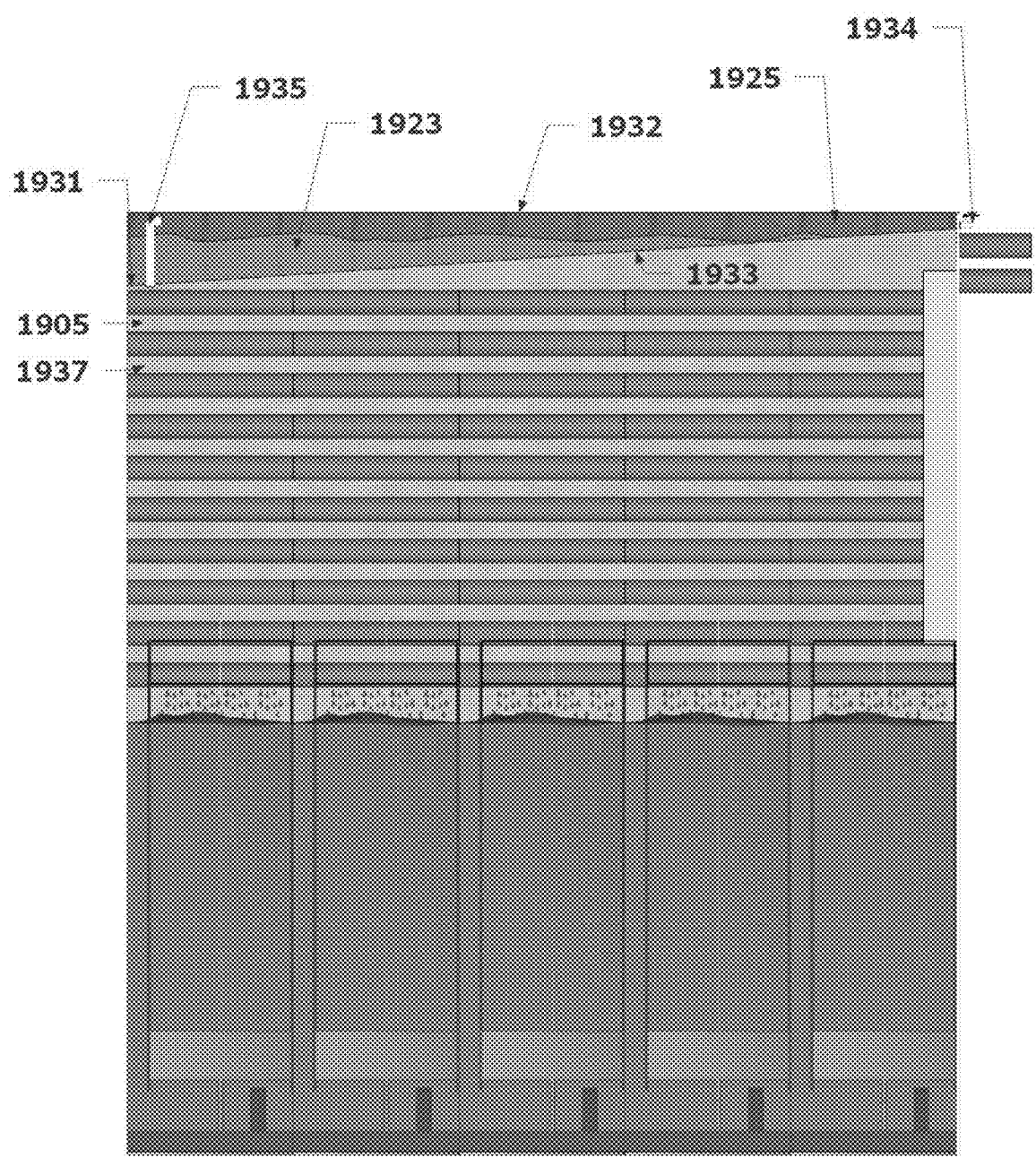
FIG. 19 is a side cross-sectional view of a settling sub-chamber featuring an angled lower surface.

Other structures may also be used in some embodiments to control the vapor content of gas passing between the condensing chamber and the secondary chamber. FIG. 19 is a side cross-sectional view of a settling sub-chamber featuring an angled lower surface. A partition 1933 within the condensing chamber creates a settling sub-chamber 1932 through with air/vapor mixture must pass before it can exit the condensing chamber 1905.

Air/vapor mixture enters the settling sub-chamber 1932 through a relatively small inlet pipe 1935 in fluid communication with the main section 1937 of the condensing chamber 1905. The inlet pipe 1935 may have a check valve built into it, so that air/vapor mixture can only enter the settling sub chamber through it.

In other embodiments, instead of an inlet pipe, an inlet diffusion assembly, such as a capped perforated pipe, may be used. In other embodiments, a simple perforation in the partition may be sufficient to allow air/vapor mixture into the settling sub chamber 1932.

On the end opposite of the inlet pipe 1935, a ball valve 1934 can serve as an outlet for the air/vapor mixture in the settling sub-chamber 1932. The ball valve 1934 may be in fluid communication with other sections of the tank, the ambient environment, or a volume compensation device either internal or external to the tank, such as a set of metallic bellows or an expansion chamber. In the illustrated embodiment, the ball valve 1934 is oriented horizontally. In other embodiments, the ball valve can be oriented vertically. For example, the ball valve could be screwed into the top of the settling sub chamber.

Due to the relatively small cross section of the inlet pipe 1935 and relatively large cross section of the settling chamber, the velocity of the air/vapor mixture entering the settling sub chamber 1932 will be relatively low. Because the slow moving air/vapor mixture must travel the length of the sub-chamber 1932 before it can exit the sub-chamber 1932, it may settle and stratify in the process.

In this embodiment, the partition 1933 that serves as the bottom of the sub-chamber 1932 is angled so that the dense vapor stratum 1923 will naturally sink downwards, away from the outlet ball valve 1934, leaving an upper layer 1925 comprised primarily of air near the outlet ball valve 1934. As a result, the amount of vapor in the gas mixture ejected from the sub-chamber 1932 through the ball valve 1934 can be minimized.

Should the stratum of vapor 1923 fall below the saturation temperature of the working fluid, it may condense to a liquid. A small perforation in the partition near the inlet pipe 1935 can be used to provide a return outlet 1931 for the dense stratum of vapor 1923 or for any liquid condensate above. In some embodiments, a check valve may be integrated into to the return outlet so that air/vapor mixture cannot enter the sub-chamber through it.

Figure 20:
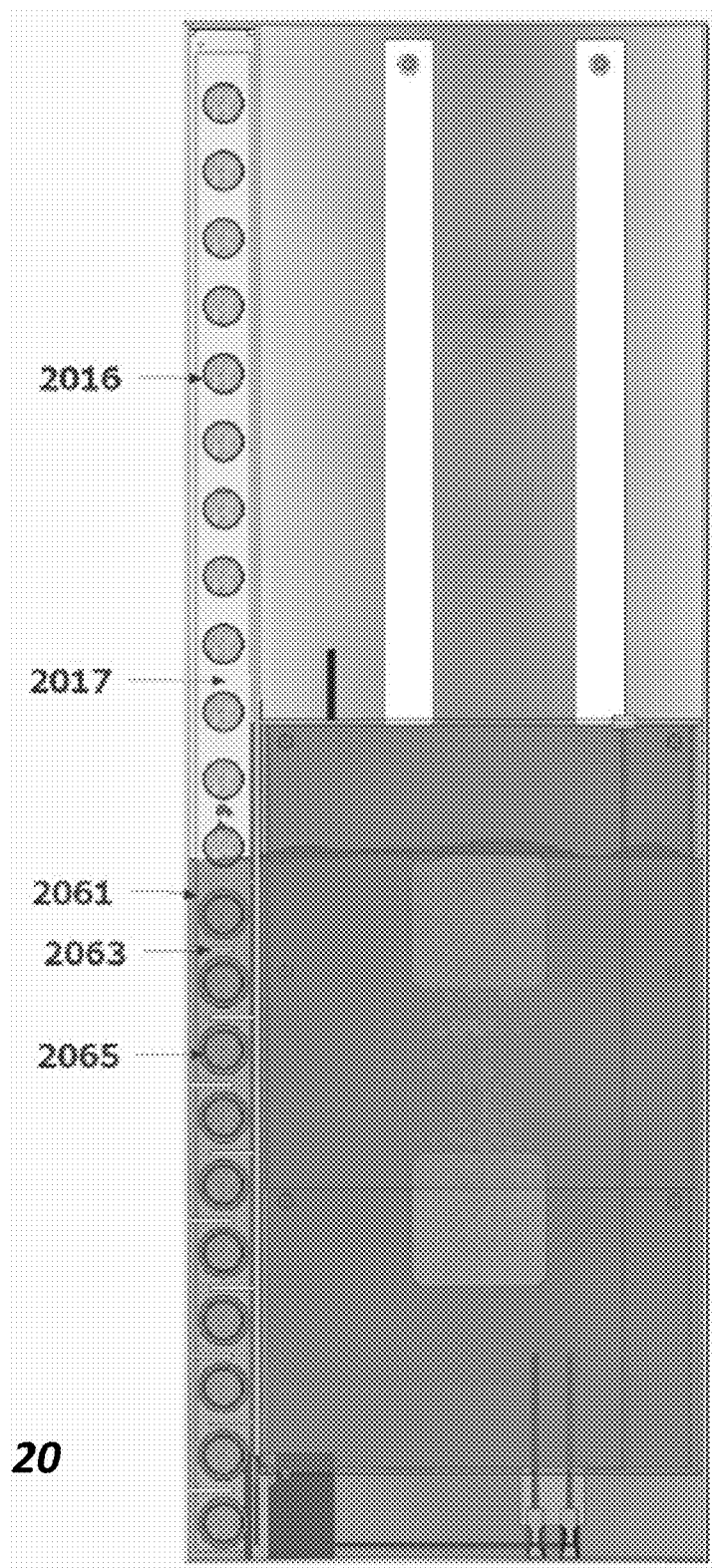
FIG. 20 is a cross-sectional view of a TPIC system which includes a supplemental heat exchanger configured to remove heat energy from the working fluid.

FIG. 20 is a cross-sectional view of a TPIC which includes a heat exchanger configured to remove heat energy from the working fluid. A heat exchanger positioned below the fluid level, such that the heat exchanger is directly in contact with the working fluid rather than in contact with vaporized fluid, may be used for subcooling of the working fluid. In this embodiment, the subcooling heat exchanger includes finned round tubes 2065 positioned in the condensate return column 2061 below the surface of the fluid. In other embodiments, the subcooling tubes need not be finned nor round, and can be flat, oval, or in any other suitable shape or configuration. Furthermore, the tubes can be smooth, or may include features such as fins to increase the surface area of the tubes. In other embodiments, the heat exchanger need not be tube heat exchanger, but may instead be any suitable heat exchange structure for subcooling the fluid, such as one or more plate-type heat exchangers, which may be disposed either against a wall of the fluid basin or at least partially spaced apart from the wall of the fluid basin.

In addition to being void of vapor, the condensate return column is an ideal confine for subcooling because the working fluid within it, motivated only by gravity, continually flows downward as additional fluid drips down from the condenser pipes above. Therefore, the fluid flow required for effective heat exchange will be consistent, predictable and free of charge. Yet another benefit to subcooling the working fluid in a region that is supplied fluid in the form of condensate is that the starting temperature of the fluid to be cooled will be known; it will be the saturation temperature of the fluid.

In one embodiment, the subcooling tubes 2065 can be supplied secondary cooling fluid by the same manifold 2017 that supplies the condensing tubes 2016. In other embodiments, the subcooling tubes may be cooled by a secondary working fluid separate from the fluid supplied to the condenser tubes. Cooling the subcooling tubes independently of the condenser tubes may allow the end user more control over the amount of subcooling achieved.

Transversal baffles 2063 added to the interior of the condensate return column 2061 increase the condensate flow velocity and the resultant sub cooling of the condensate. In other embodiments, double segmental transversal baffles or doughnut and disc type baffles can be used. In other embodiments, the baffles may be omitted entirely.

Figure 21:
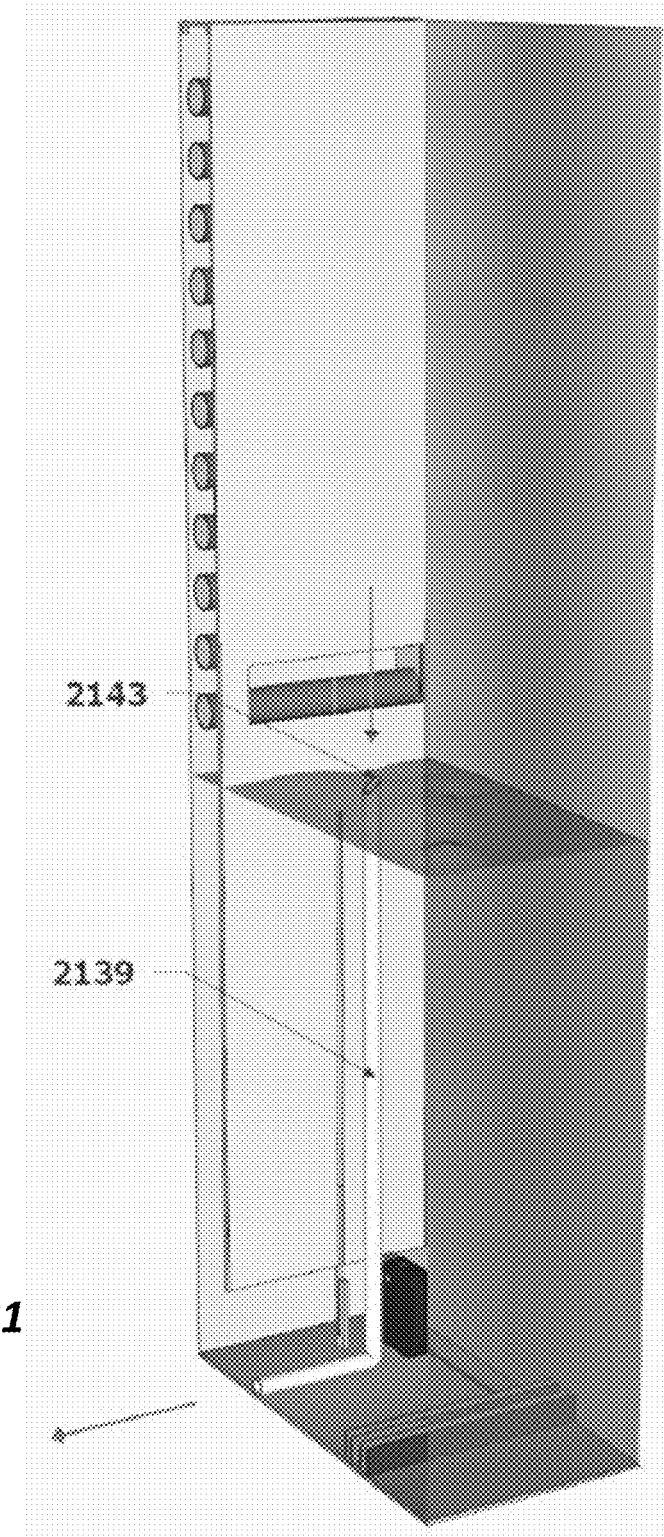
FIG. 21 is a perspective view of a filtration system which can be included within the area covered by an immersion module.

In some embodiments, a filtration system can be included within the immersion tank to remove impurities which could impact the dielectric properties of the working fluid. FIG. 21 is a perspective view of a filtration system which can be included within the area covered by an immersion module. In this embodiment, a fuel pump (not shown) forces potentially contaminated working fluid through standard cartridge filter (not shown) for filtration. The inlet of the pump is supplied potentially contaminated fluid by a manifold connected to a plurality of supply pipes 2139. In this embodiment, the inlet 2143 of the pipe is positioned near the surface of the working fluid to collect contaminants, many of which are pushed to the surface by buoyancy. Other contaminants may become entrained by the bubbles created during the TPIC process and carried to the surface of the working fluid. In other embodiments, a separate intake pipe may be positioned so that its inlet lay on the bottom of the immersion container to collect any relatively dense contaminants. A return pipe to each module is not necessary since the filtered fluid is returned to the common working fluid pool from which all modules draw fluid necessary for operation.

As described elsewhere, the generation of vapor within a TPIC system will increase the pressure within the TPIC system. Depending on a variety of factors, including but not limited to the internal volume of the TPIC system, the working fluid used, the cooling capacity of the TPIC system, TPIC systems may include additional components to compensate for this pressure differential during operation. In some embodiments, the pressure may bleed off through the use of a vent, or the pressure of the TPIC system may be lowered prior to operation. In other embodiments, at least one volume compensation device may be provided to compensate for the vapor generation.

Figure 22:
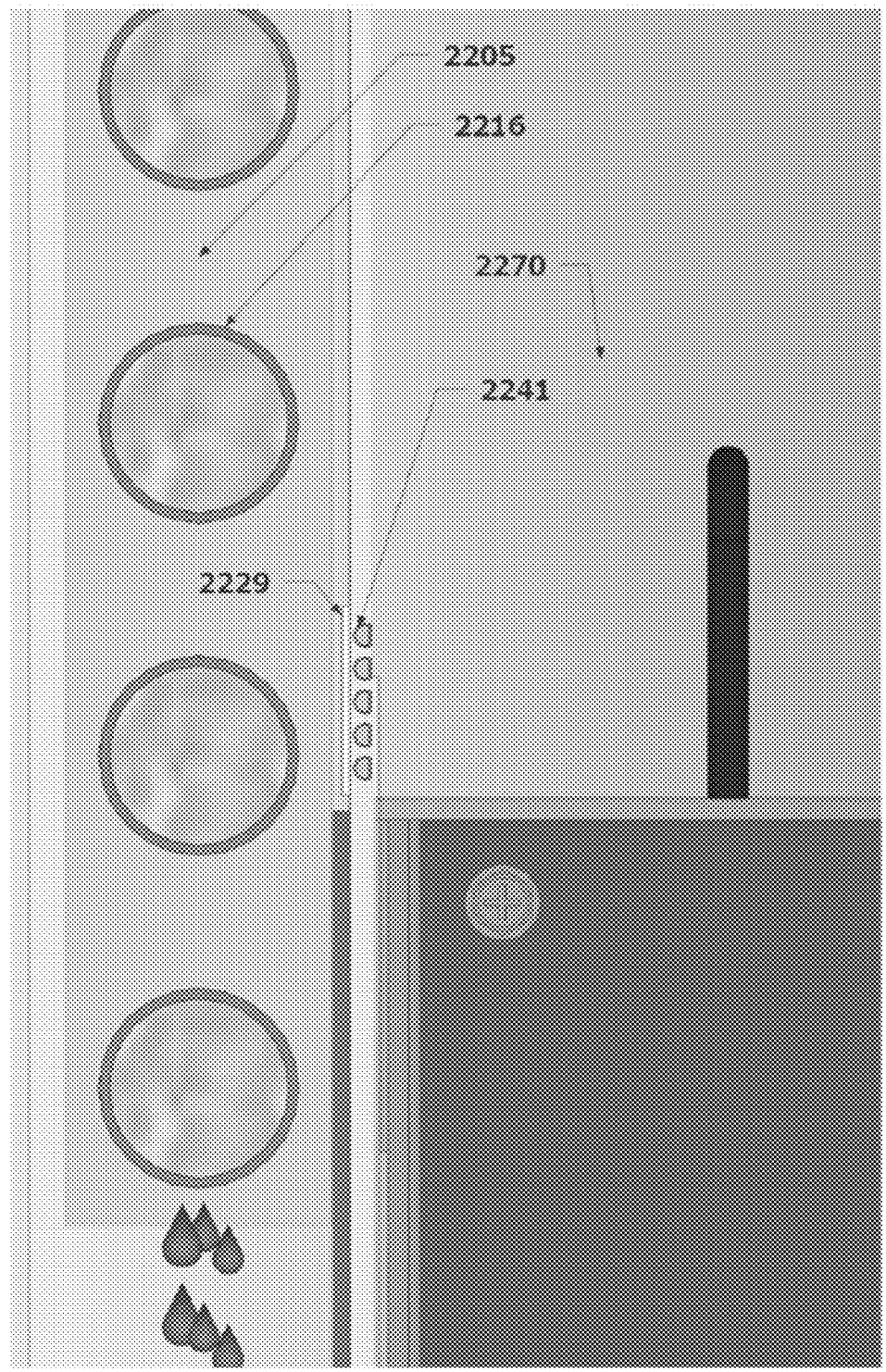
FIG. 22 is a cross sectional view of partially flattened condensing tubes integrated into the condensing chamber wall for the purpose of condensing vapor within a secondary chamber.

In other embodiments, if the vapor pressure in the secondary chamber increases to a level which is greater than is ideal for the seals of the TPIC system, it can be reduced through the use of a condenser in the secondary chamber, whether with or without an additional volume compensation device such as the bellows discussed above. FIG. 22 is a cross sectional view of partially flattened condensing tubes integrated into the condensing chamber wall for the purpose of condensing vapor within the secondary chamber. In contrast to the elevated secondary condensers which can be used in an open tank TPIC system, the pressure-reducing condensing tubes 2241 can be positioned near the bottom of the secondary chamber 2270 where condensable vapor is most likely to exist. In this embodiment, the pressure-reducing condensing tubes 2241 are embedded into the condensing chamber wall 2227. A strip of thermal insulation 2229 placed on the condensing chamber wall 2227 can be used to prevent the vapor in the condensing chamber 2205 from transferring heat to the pressure-reducing condensing tubes 2241.

In this embodiment, the pressure-reducing condensing tubes 2241 are supplied secondary cooling fluid independently of the primary condensing tubes 2216. Cooling the pressure-reducing condensing tubes 2241 independently of the primary condenser tubes 2216 may allow the end user more control over the amount of pressure reduction achieved in the secondary chamber 2270. However, it may be economical to cool both the primary and the pressure reducing condenser tubes with the same fluid.

In other embodiments, the pressure reducing condensing tubes may be placed behind a thermally conductive portion of the condenser wall. The condensing tubes 2241 shown in FIG. 22 are merely illustrative, and any suitable shape or design of condensing structures can be used. The condensing tubes need not be partially flattened round tubes, as shown. They can be mostly flat, oval, round, or otherwise shaped. Furthermore, the tubes can be smooth or feature a type of enhancement such as fins. In other embodiments, a pressure-reducing heat exchanger can be placed directly in the secondary chamber.

In contrast to the flow modulation of the primary conductor in a system without a separate condensing chamber, discussed above, flow modulation of a secondary condenser such as secondary condenser 2241 can be more effective in controlling the pressure of the TPIC system, particularly the pressure of the secondary chamber 2270.

Figure 32:
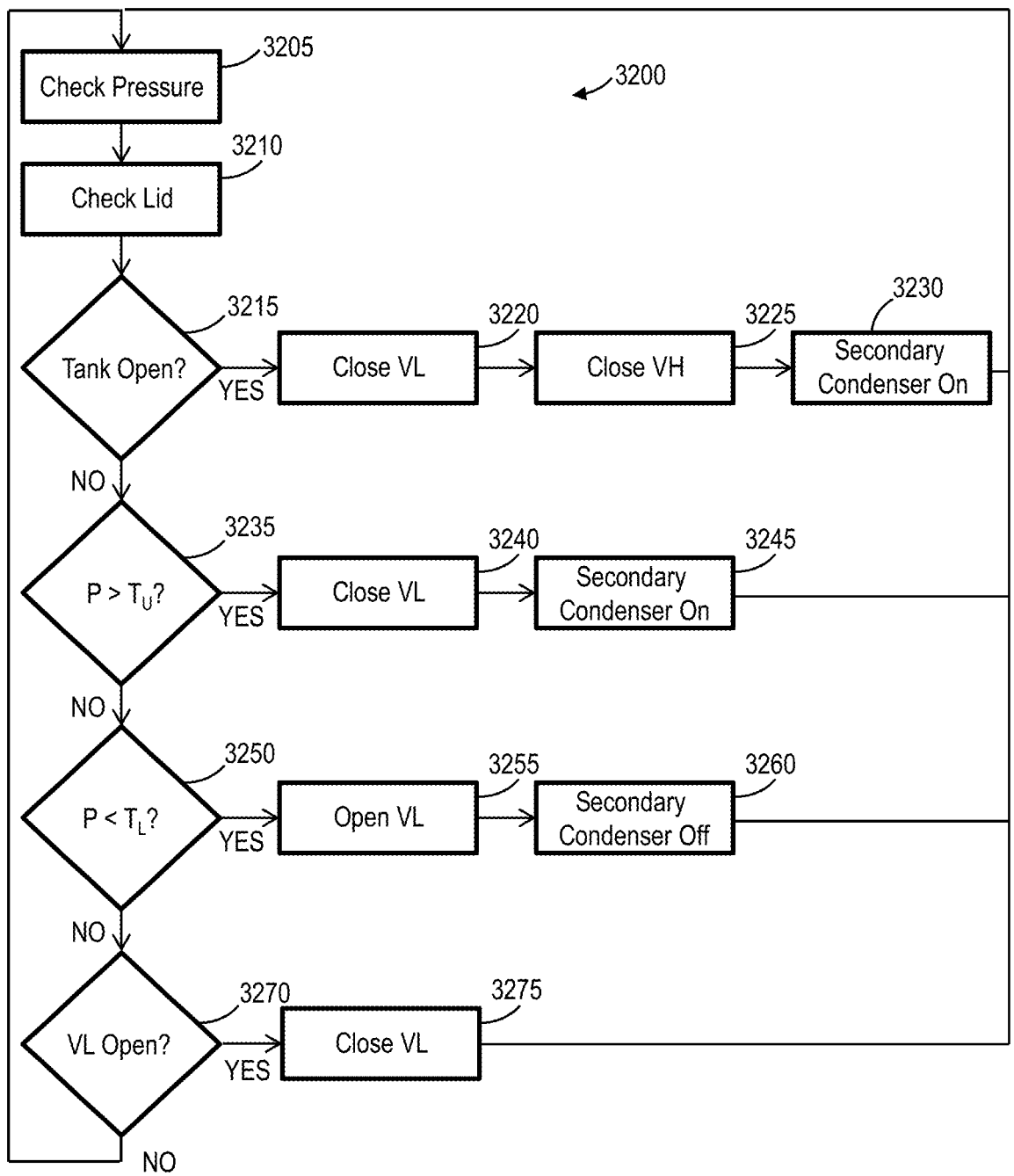
FIG. 32 is a flow diagram illustrating a sample control scheme for a TPIC system including a partially isolated condensing chamber and a secondary chamber including a secondary condenser in thermal communication with the secondary chamber.

FIG. 32 is a flow diagram illustrating a sample control scheme for a TPIC system including a partially isolated condensing chamber and a secondary chamber including a secondary condenser in thermal communication with the secondary chamber. The process 3200 begins at a state 3205 where a pressure sensor within the TPIC system can be checked. The process can then move to a state 3210 where a lid sensor is checked, and to a state 3215 where a determination is made as to whether the tank is open. If the lid sensor indicates that the lid is open, exposing the secondary chamber to the ambient, the process moves to a state 3220 where a lower vent (if present) between the secondary chamber and the condensing chamber is closed if it is currently open, and a state 3225 where an upper vent (if present) between the secondary chamber and the condensing chamber is closed if it is currently open. This effectively isolates the secondary chamber, sealing off the condensing chamber which may contain a more vapor-rich gas mixture.

The process then moves to a state 3230 where the secondary condenser is turned on if it is currently off.

By turning the secondary condenser on when the tank is opened, at least some of the vapor in the secondary chamber can be condensed, reducing the amount of vapor present in the air and susceptible to loss mechanisms such as displacement loss. In addition to recuding the overall amount of vapor in the air, this can effectively lower the height of the vapor zone, even if the vapor zone is not completely settled, concentrating the vapor present in the secondary chamber near the bottom of the secondary chamber, and providing further protection against displacement loss.

If the system determines at stage 3215 that the tank is closed, the process moves to a state 3235 where the pressure reading of the closed secondary chamber is evaluated. In some embodiments, the pressure reading of stage 3205 can be performed at this point in the process, rather than before the lid check. If the pressure differential between the closed secondary chamber and the exterior of the tank is above an upper threshold $T_U$ or pressure range due to the secondary chamber being at a higher pressure than the ambient, the process can move to a state 3240 where the lower vent (if present) between the secondary chamber and the condensing chamber can be closed if currently open, preventing air flow from the secondary chamber to the condensing chamber, and then moves on to a state 3245 where the secondary condenser is turned on if it is not already on, to lower the pressure of the secondary chamber. Any suitable threshold can be used here, but in an exemplary embodiment the upper threshold $T_U$ is set to +0.5 PSI In contrast, if the pressure reading is not above the particular threshold, the process can move to a state 3250 where the pressure reading is evaluated to determine if the pressure reading of the closed secondary chamber is below a lower threshold value $T_L$ or pressure range. If the pressure differential between the closed secondary chamber and the exterior of the tank is below a lower threshold $T_L$ or pressure range, such as due to the secondary chamber being at a lower pressure than the ambient, the process can move to a state 3255 where the lower vent (if present) between the secondary chamber and the condensing chamber can be opened if currently closed, permitting air flow from the secondary chamber to the condensing chamber, and then moves to a state 3260 where the secondary condenser is turned off, allowing pressure to build in the secondary chamber. Any suitable threshold can be used here, but in an exemplary embodiment the lower threshold $T_L$ is set to −0.5 PSI. In some particular embodiments, the upper threshold TU and the lower threshold TL can be the same value.

If the pressure is neither above nor below the threshold pressures or pressure range, the process moves to a state 3270 where the lower vent is checked and a determination is made as to whether the lower vent is open. If the lower vent is opened, the process can move to a state 3275 where the lower vent is closed. If the lower vent is already closed, the system can return to stage 3205 or wait for a period of time before returning to stage 3205. Similarly, once the system reaches one of stages 3230, 3245, 3260, or 3275, the system can return to stage 3205, or wait for a period of time before returning to stage 3205.

In various embodiments, other control systems can be used, and certain of the above steps may be performed in different orders, may be omitted, or may be performed simultaneously with other steps. In addition, other steps not shown above may also be used.

The above process flow illustrates examples of ways in which the secondary condenser can be used to regulate the pressure of the secondary chamber. If the secondary chamber pressure is too high, the secondary condenser can be used to lower the pressure of the secondary chamber. Similarly, if the secondary chamber is exposed to the ambient, the secondary condenser can be used to condense the vapor within the secondary chamber to reduce vapor loss through displacement or other mechanisms. When the secondary chamber pressure is too low, the secondary condenser can be turned off to allow pressure to build and reduce the vacuum.

Although the above process flow describes the use of a high valve and a low valve, other valve configurations and structures can also be used. For example, the "high valve" allowing flow at least from the condensing chamber to the secondary chamber may be located adjacent or along a fluid channel with a height differential between the inlet on the condenser side and the outlet on the secondary chamber side, such that the outlet of the high valve may be at a lower point within the secondary chamber. In other embodiments, the "low valve" allowing flow at least from the secondary chamber into the condensing chamber may be located at any height in the TPIC system.

Figure 33:
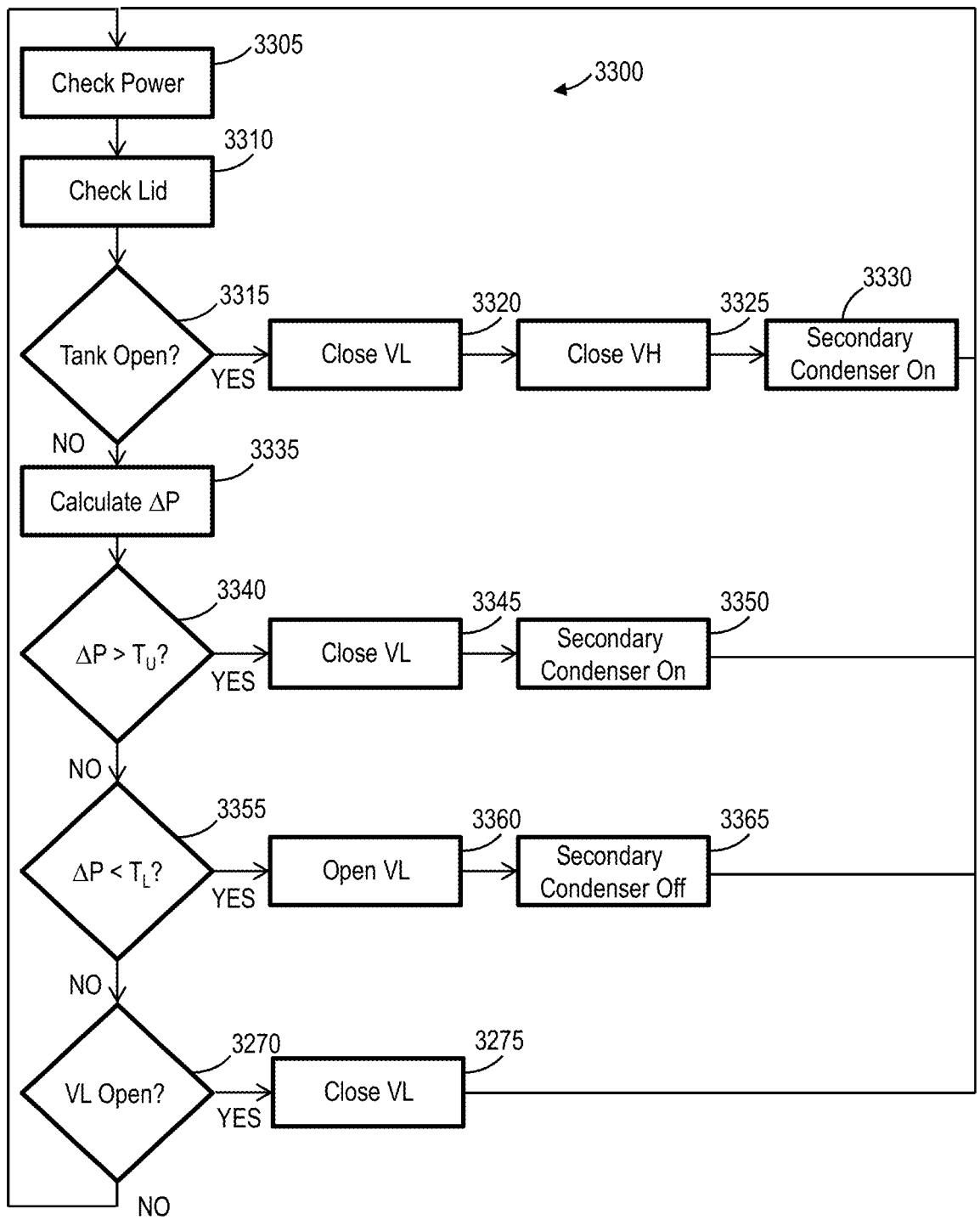
FIG. 33 is a flow diagram illustrating an alternative control scheme for a TPIC system including a partially isolated condensing chamber and a secondary chamber including a secondary condenser in thermal communication with the secondary chamber.

In other embodiments, the secondary controller may be activated or deactivated proactively in response to system power changes, rather than reactively in response to the resultant pressure changes. FIG. 33 is a flow diagram illustrating an alternative control scheme for a TPIC system including a partially isolated condensing chamber and a secondary chamber including a secondary condenser in thermal communication with the secondary chamber.

The control scheme 3300 begins at a stage 3305 where the power level of the system is evaluated. The system power level may be a measure of the power drawn by the HGCs being cooled by the TPIC system. In some embodiments, this may be an evaluation of a change in power level since a previous reading, while in other embodiments this may be an evaluation of the overall power level. The system also moves to a stage 3310 where a lid sensor is checked, and a stage 3310 where a determination is made as to whether the tank is open. If a determination is made at stage 3315 that the tank is open, exposing the secondary chamber to the ambient, the process moves to a state 3320 where a lower vent (if present) between the secondary chamber and the condensing chamber is closed if not already closed, and a state 3325 where an upper vent (if present) between the secondary chamber and the condensing chamber is closed if not already closed. As discussed above, this effectively isolates the secondary chamber, and the process then moves to a state 3330 where the secondary condenser is turned on to minimize vapor loss from the open tank.

If the tank is closed, the process moves to a stage 3335 where the recent change in system power ΔP is calculated. For example, in an exemplary embodiment, the system can evaluate the change in power over the last five seconds, by subtracting a measured or recorded power level five seconds ago from the current measured or recorded power level. Any other suitable time period may be used, however, depending on the level of precision and control desired. The system then moves to a stage 3340 where the power change is evaluated to determine if it is above a particular threshold $T_U$. If so, the process moves to a stage 3345 where the lower vent (if present) is closed if not already closed, and a stage 3345 where the secondary condenser is turned on if not already turned on, in anticipation of a pressure increase due to the increase in system power level. By evaluating the power level, the secondary condenser may be turned on in anticipation of pressure changes, rather than waiting for the pressure change to occur, which may reduce the magnitude of a pressure swing within the TPIC system. In some embodiments, the overall power level may be evaluated, rather than the change in power level.

If the change in power level is not above an upper threshold, the process moves to a stage 3355 where the power change is evaluated to determine if it is below a lower threshold $T_L$. If so, the process moves to a stage 3360 where the lower vent (if present) is opened if not already open, and a stage 3365 where the secondary condenser is turned off if not already turned off, in anticipation of a pressure decrease due to the decrease in system power level.

If the change in power level is between the upper threshold and the lower threshold, the process can move to a stage 3370 where the state of the lower vent is checked to confirm that it is closed. If the lower vent is opened, the process moves to a stage 3375 where the lower vent is closed. If the lower vent is closed, the process can return to stage 3305 after a predetermined period of time, such as the five second interval between power readings of the illustrated implementation. The system can similarly return to stage 3305 after a predetermined period of time after reaching stages 3330, 3350, 3365, or 3375.

The use of power measurements and pressure measurements to regulate the operation of the secondary condenser are not mutually exclusive. In some embodiments, system power levels can be monitored to predicatively adjust the operation of the secondary condenser and/or valves between the secondary chamber and the condensing chamber, and pressure levels may also be monitored to reactively control or adjust the operation of the secondary condenser if the anticipatory operation of the secondary condenser does not maintain pressure within a desired operating range.

By dynamically adjusting the pressure within the secondary chamber during use, the size of a volume compensation device, if present, can be reduced. This is because the pressure swing between a powered-off system to a system running at maximum power can be reduced by dynamically adjusting the vapor pressure within the secondary chamber. Thus, a pressure compensation structure such as a secondary condenser within the secondary chamber can be used in conjunction with or even in place of a volume compensator. The pressure compensation structure can also be used in a vented system without a closed volume compensator and reduce the displacement loss of vapor by condensing vapor within the secondary chamber and reducing the amount of vapor present at the top of the secondary chamber.

FIG. 34 illustrates a control scheme which can be utilized when a closed TPIC system without a volume compensation device is powered on. In particular, the control scheme is configured to be utilized in conjunction with a TPIC system which includes a temperature sensor disposed in the secondary chamber. In some embodiments, the temperature sensor may be disposed at a height in the chamber where the underlying gas volume is equal in volume to the volume of the condensing chamber, although other configurations are possible.

The process 3400 begins at a start stage 3405, and moves to a stage 3410 where the primary condenser is turned on, and a stage 3415 where the HGCs are powered on. The lower valve is opened (if needed) at stage 3420 and the upper valve is closed (if needed) at stage 3425. With the upper valve closed and the lower valve open, the vapor will gradually fill the secondary chamber and the condensing chamber. As the vapor fills from the bottom of the chamber, gas will be displaced from the vent near the top of the TPIC tank. Because the vapor fills from the bottom, the vented gas will contain very little vapor, and will be almost entirely non-condensable gas.

At stage 3430, the temperature of the temperature sensor in the secondary chamber is checked. At stage 3435, the temperature of the temperature sensor is compared to the boiling point of the cooling fluid in the TPIC system. If the temperature is less than the boiling point by less than a threshold differential N, indicative that the vapor zone has reached the temperature sensor in the secondary chamber, the process moves to a stage 3440 where the lower vent is closed, and a stage 3445 where the higher vent is closed. In one exemplary embodiment, the threshold differential N may be 3 degrees, but any other appropriate threshold temperature may be chosen based on the design and operating conditions of the TPIC vessel, the boiling point of the working fluid, empirical testing, or other factors. At this point, normal operation of the TPIC apparatus can proceed, as a desired volume of primarily NCG has been vented from the system at startup. If the temperature is less than the boiling point by more than a threshold differential, the system may return to the stage 3430 where the temperature is monitored again, repeating until the vapor zone reaches the temperature sensor.

The placement of the temperature sensor can determine the amount of NCG vented by this process. If the volume of the total tank area between the level of the temperature sensor and the upper level of the working fluid is roughly equal to the volume of the condensing chamber, the volume of vented NCG represents the maximum gas displacement which can occur due to the condensing chamber filling up with vapor and displacing all of the NCG therein. Other appropriate thresholds may be chosen as desired for particular TPIC systems and use conditions, and the temperature sensor placed accordingly.

Figure 35A:
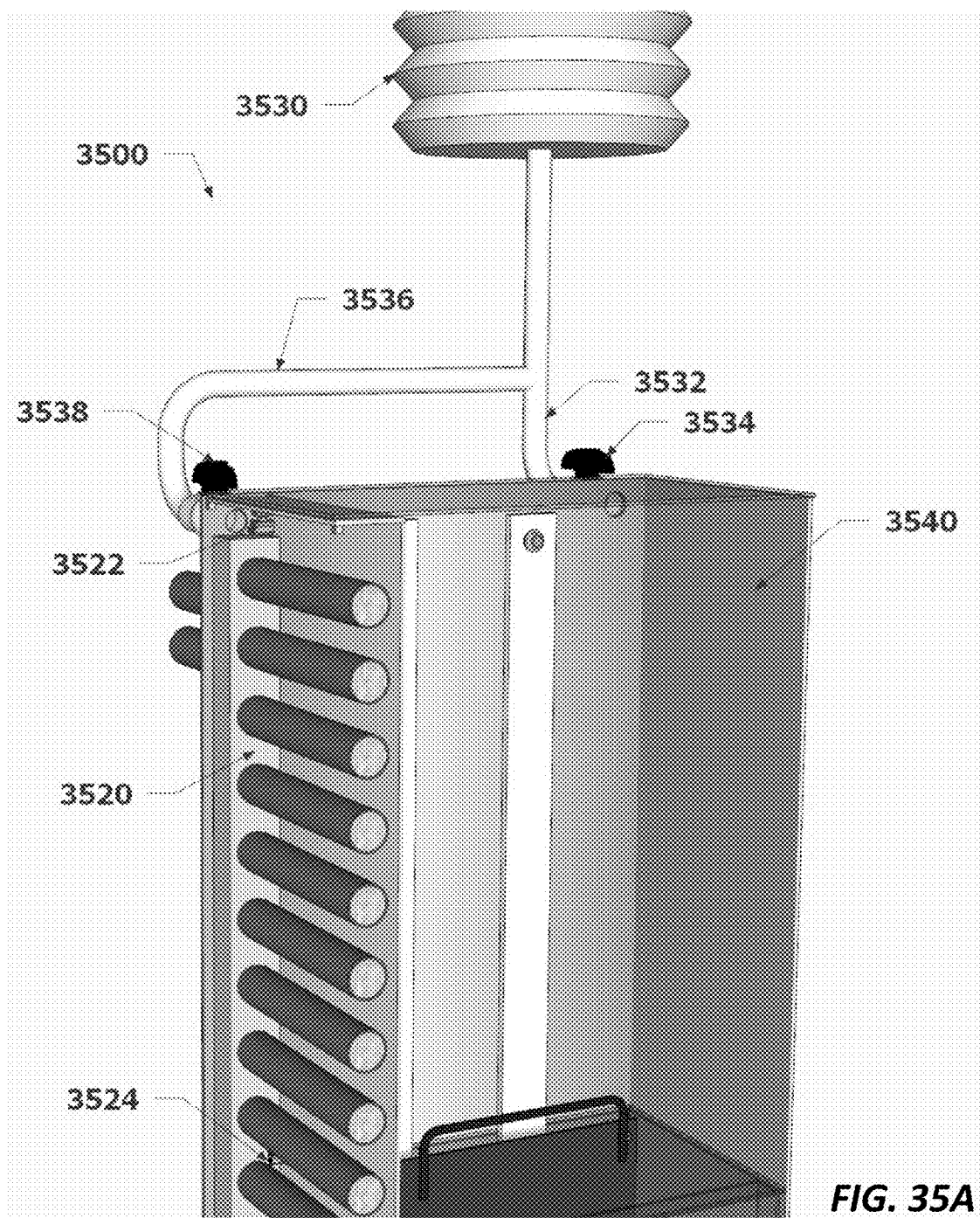
FIG. 35A is a perspective view of a TPIC system which includes a volume compensation device in fluid communication with the condensing chamber and the secondary chamber.

FIG. 35A is a perspective view of a TPIC system which includes a volume compensation device in fluid communication with the condensing chamber and the secondary chamber. FIG. 35B is a flow diagram illustrating a control scheme which can be utilized prior to opening the system of FIG. 35A.

FIG. 35A shows a TPIC system 3500 with a VCD 3530 in fluid communication with both a condensing chamber 3520 and a secondary chamber 3540. A first tube 3532 forming part of a fluid path extending between the secondary chamber 3540 and the VCD 3530 includes a secondary chamber ball valve 3534, and a second tube 3536 forming part of a fluid path extending between the primary chamber 3520 and the VCD 3530 includes a main valve 3538. A high valve 3522 and a low valve 3524 extend between the condensing chamber 3520 and the secondary chamber 3540. In some embodiments, a mechanism such as a solenoid or other actuator can be used to control flow of air between chambers.

As can be seen in FIG. 35B, the process 3550 begins at a stage 3555 where a preparation sequence for opening the tank is initiated. The process then moves to a stage 3560 where a secondary condenser in thermal communication with the secondary chamber is turned on, and a stage 3565 where the secondary condenser operates for a period of time to condense the vapor within the secondary condenser and any TPIC system regions in fluid communication with the secondary chamber.

The system them moves to a stage 3570 where the low valve is closed if needed, a stage 3575 where the high valve is closed if needed, a stage 3580 where the condenser valve is closed if needed, and a stage 3585 where the main valve is opened if needed. At this stage, the secondary chamber is in fluid with the VCD, and isolated from the condensing chamber which is likely to contain the most vapor-rich gas. The secondary condenser can continue to operated, or can be shut off. The process moves to a stage 3590 where an indication that the tank is ready to be opened can be provided to a user, such as by flashing a light near a message that the tank is ready to open. In some embodiments, the tank may be locked during operation, and may be unlocked at this point.

While operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous.

In the foregoing description, specific details are given to provide a thorough understanding of the examples. However, it will be understood by one of ordinary skill in the art that the examples may be practiced without these specific details. For example, certain components/devices may be shown in block diagrams or otherwise schematically illustrate in order not to obscure the examples in unnecessary detail. In other instances, such components, other structures and techniques may be shown in detail to further explain the examples.

Although the invention has been described with reference to the above examples, it will be understood that modifications and variations are encompassed within the spirit and scope of the invention. Various modifications to these embodiments will be readily apparent to those skilled in the art, and the generic principles defined herein may be applied to other embodiments without departing from the spirit or scope of the invention. Certain features of embodiments discussed herein may be combined with features of other embodiments, and other embodiments may omit some of the features discussed herein, or add additional features. Accordingly, the invention is limited only by the following claims.

What is claimed is:

1. A two-phase immersion cooling system, including
a cooling basin configured to retain working fluid therein;
a condensing chamber in fluid communication with the cooling basin;
a primary condenser in thermal communication with the condensing chamber, at least a portion of the primary condenser located within the condensing chamber;
a secondary chamber separated from the condensing chamber via at least one condenser divider; and
a vapor redirection structure, at least a portion of the vapor redirection structure located directly adjacent the secondary chamber, the vapor redirection structure configured to overlie at least one heat-generating component located within the cooling fluid and direct vaporized cooling fluid generated adjacent the at least one heat-generating component into the condensing chamber while inhibiting vaporized cooling fluid from flowing directly into the secondary chamber.

2. The system of claim 1, additionally comprising a secondary condenser in thermal communication with the secondary chamber.

3. The system of claim 1, additionally comprising at least one fluid path extending through the condenser divider at a height higher than the intended height of the working fluid, allowing gas to flow from the condensing chamber to the secondary chamber.

4. The system of claim 3, wherein the at least one fluid path includes a one-way valve allowing gas to flow from the condensing chamber to the secondary chamber, additionally comprising a second fluid path extending through the condenser divider, the second fluid path including a one-way valve allowing gas to flow from the second chamber to the first chamber.

5. The system of claim 3, wherein the at least one fluid path has an inlet on the condensing chamber side of the condenser divider and an outlet on the secondary chamber side of the condenser divider, the inlet located a greater distance from the intended height of the working fluid than the outlet.

6. The system of claim 1, additionally comprising a volume compensation structure in fluid communication with at least the secondary chamber, the volume compensation device configured to increase in volume in response to the generation of vaporized working fluid during operation of the system.

7. The system of claim 1, wherein the vapor redirection structure is configured to form a liquid fluid seal with the working fluid at locations in which the working fluid contacts the vapor redirection structure.

8. The system of claim 1, wherein the vapor redirection structure comprises a hinged or flexible component which is configured to move away from the heat-generating component in response to generation of vaporized working fluid underneath the vapor redirection structure and is configured to provide or enhance a seal between the vapor redirection structure and the condenser divider in the presence of vaporized working fluid flowing into the condensing chamber.

9. The system of claim 1, wherein the vapor redirection structure comprises a layer of flexible material folded over the heat-generating component and secured to the heat generating component or a structure supporting the heat-generating component.

10. The system of claim 1, wherein the vapor redirection structure comprises an immersion module configured support the underlying heat-generating component within the working fluid.

11. The system of claim 1, wherein the vapor redirection structure is configured to be at least partially submerged within the working fluid.

12. The system of claim 11, additionally comprising a float configured to overlie portions of the working fluid exposed to the secondary chamber to inhibit evaporation of working fluid into the secondary chamber.

13. The system of claim 1, wherein the primary condenser includes a filtration section near the top of the primary condenser, the filtration section comprising condenser components having narrower gas paths passing between them than the gas paths extending adjacent lower sections of the primary condenser.

14. A two-phase immersion cooling system, including:
a tank configured to hold a volume of dielectric cooling fluid;
a condensing chamber including at least one condenser component; and a plurality of immersion modules configured to be placed in fluid communication with the condensing chamber, each immersion module configured to support at least one heat-generating component submerged in the dielectric cooling fluid, each immersion module comprising an upper interior surface positioned to overlie a heat-generating component supported by the immersion module and configured to laterally redirect vaporized dielectric cooling fluid away from the heat-generating component and towards the condensing chamber.

15. The system of claim 14, wherein each of plurality of the immersion modules comprises:
   an immersion module shell, the shell comprising the upper interior surface and forming a vapor capture region configured to overlie a volume of the dielectric cooling fluid;
   a vapor outlet in fluid communication with the vapor capture region; and
   a fluid inlet configured to allow dielectric cooling fluid to enter the immersion module.

16. The system of claim 15, wherein the immersion module shell comprises:
   a first section fixedly secured relative to the condensing chamber; and
   a second section movable with respect to the first section and configured to cooperate with the first section to provide the vapor capture region, wherein the second section is configured to support the at least one heat-generating component.

17. The system of claim 14, additionally comprising at least one inundation roof overlying at least a portion of the at least one condenser component.

18. The system of claim 14, wherein at least a portion of at least one of the plurality of immersion modules is movable with respect to the condenser chamber to remove the heat-generating component from the working fluid.

19. The system of claim 14, additionally comprising:
   a biasing mechanism configured to translate at least one of the plurality of immersion modules away from the cooling basin; and
   a retention mechanism configured to retain the at least one of the plurality of immersion modules in a lowered position.

20. The system of claim 14, wherein each immersion module comprises at least one sidewall extending downward from the upper interior surface of the immersion module and configured to control lateral redirection of vaporized dielectric cooling fluid.

21. The system of claim 14, wherein the upper interior surface comprises an angled surface.

22. The system of claim 14, wherein the upper interior surface comprises a curved surface.

23. The system of claim 1, wherein the vapor redirection structure comprises an upper interior surface configured to overlie at least one heat-generating component located within the cooling fluid and laterally redirect vaporized cooling fluid generated adjacent the at least one heat-generating component away from the heat-generating component and towards the condensing chamber while inhibiting vaporized cooling fluid from flowing directly upward.

* * * * *